(12) United States Patent
Fujii et al.

(10) Patent No.: US 6,683,960 B1
(45) Date of Patent: Jan. 27, 2004

(54) ACTIVE NOISE CONTROL APPARATUS

(75) Inventors: Kensaku Fujii, Kawasaki (JP); Juro Ohga, Kamakura (JP)

(73) Assignee: Fujitsu Limited, Kawasaki (JP)

( * ) Notice: Subject to any disclaimer, the term of this patent is extended or adjusted under 35 U.S.C. 154(b) by 488 days.

(21) Appl. No.: 09/641,660

(22) Filed: Aug. 18, 2000

Related U.S. Application Data

(63) Continuation-in-part of application No. PCT/JP99/01984, filed on Apr. 14, 1999.

(30) Foreign Application Priority Data

| Apr. 15, 1998 | (JP) | 10-104696 |
| Jul. 21, 1998 | (JP) | 10-205502 |
| Sep. 18, 1998 | (JP) | 10-264712 |

(51) Int. Cl.[7] .................... A61F 11/06; G10K 11/16; H03B 29/00
(52) U.S. Cl. .................. 381/71.8; 381/71.11; 381/71.1
(58) Field of Search .............. 381/71.1, 71.2, 381/71.8, 71.9, 71.4, 71.12, 71.13, 71.14, FOR 123, 94.1, FOR 124

(56) References Cited

U.S. PATENT DOCUMENTS

| 5,668,747 A | * | 9/1997 | Ohashi | 381/71.11 |
| 5,745,580 A | * | 4/1998 | Southward et al. | 381/71.1 |
| 5,940,519 A | * | 8/1999 | Kuo | 381/71.11 |
| 5,991,418 A | * | 11/1999 | Kuo | 381/71.8 |
| 6,198,828 B1 | * | 3/2001 | Kuo | 381/71.11 |

FOREIGN PATENT DOCUMENTS

| JP | 06035482 | 2/1994 |
| JP | 06230786 | 8/1994 |
| JP | 07032947 | 2/1995 |
| JP | 07219559 | 8/1995 |
| JP | 08179782 | 7/1996 |
| JP | 11085165 | 3/1999 |

OTHER PUBLICATIONS

The Behaviour of an Adaptive Algorithm with Moving Primary Source. Performance of a Feedback system by Akira Omoto, Tohru Matsui and Kyoji Fujiwara, Sep. 1997.
Stochastic Active Noise Control Using Adaptive Predictor by Kazuaki Nimura and Hareo Hamada, Mar. 1994.
Active Noise Contorl by S.J. Elliott and P.A. Nelson, Oct. 1993.
Performance of Feedforward and Feedback Systems for Active Control by Stephen J. Elliott, Senior Member, IEEE, and Trevor J. Sutton, May 1996.
Development of the filtered–U algorithm for active noise control by L.J. Eriksson, Jan. 1991.

* cited by examiner

*Primary Examiner*—Xu Mei
(74) *Attorney, Agent, or Firm*—Katten Muchin Zavis Rosenman

(57) ABSTRACT

An active noise control apparatus for transmitting, from a loud speaker, a secondary noise synthesized so as to have the same amplitude as and the opposite phase to a primary noise and for canceling the noise by acoustically overlapping the secondary noise. An overall system filter for simulating a characteristic of an overall system leading to an error detecting microphone from a noise detecting microphone is provided for the first and the second overall system filter. A second and a first noise control filter are connected to the first and the second overall system filter in cascade to form a noise control filter. A coefficient of an estimating noise transfer system filter, obtained when the difference between the differential output of both obtained when a white noise is applied to the circuit of cascade connections and the response difference of the first and the second overall system filter from a differential overall system filter becomes a minimum, is made the coefficient of the noise control filter.

21 Claims, 34 Drawing Sheets

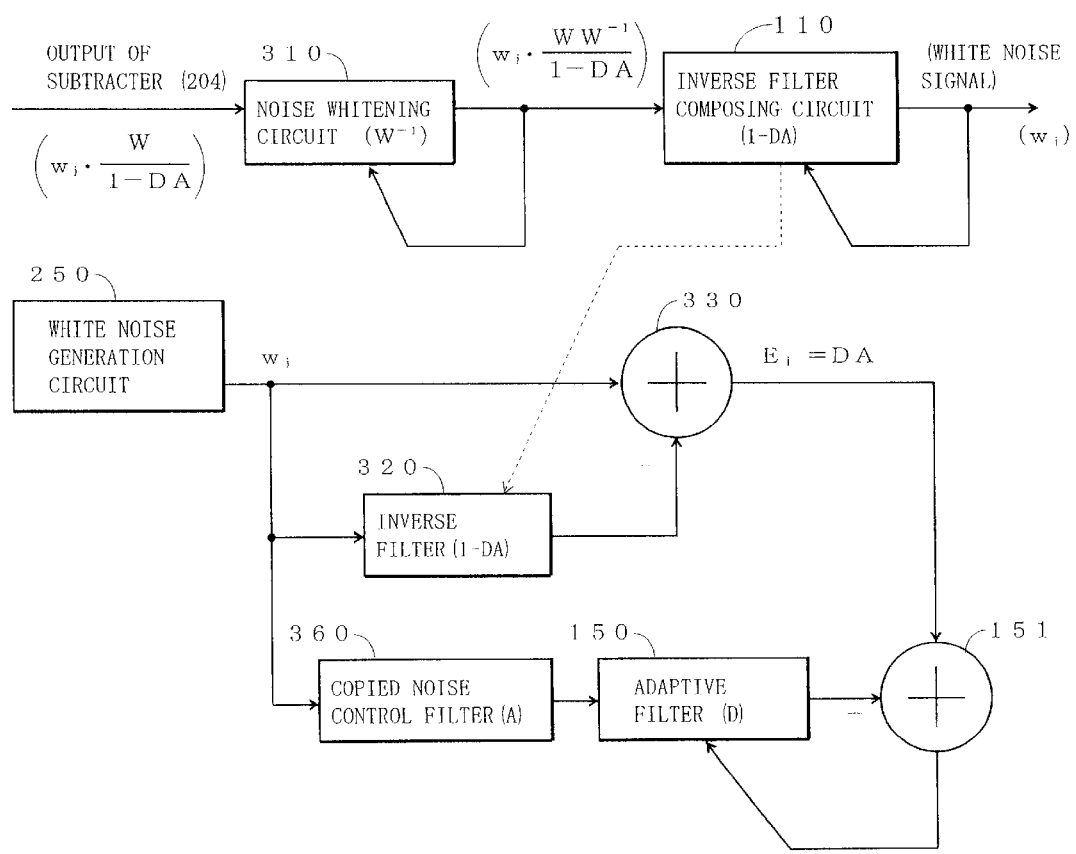
F I G. 5

ACTIVE NOISE CONTROL APPARATUS

This is a continuation of PCT application Ser. No. PCT/JP99/01984, filed Apr. 14, 1999.

BACKGROUND OF THE INVENTION

1. Field of the Invention

The present invention relates to an active noise control apparatus, and in particular to an active noise control apparatus for transmitting, from a loud speaker, a secondary noise (pseudo noise) synthesized so as to have the same amplitude as and the opposite phase to a primary noise (noise to be controlled) and to be suppressed small, and for canceling the controlled noise by acoustically overlapping therewith the secondary noise.

2. Description of the Related Art

FIG. 30 shows a prior art example of an active noise control apparatus of a feedforward type. In this example, after a noise flowing through a duct 200 toward an outlet on the right side is detected as a signal $x_j$ (j: sample time index) by a noise detecting microphone 201, the signal $x_j$ is assumed to change into a noise $g_j$ by the time when the signal reaches an error detecting microphone 202.

In this duration, a noise control filter 220 synthesizes a secondary noise $G_j$ with the detected noise $x_j$ and a coefficient vector $H_j$ from a coefficient updating circuit 240. Obviously when $G_j = g_j$, the noise is canceled, so that an outputted noise from the outlet of the duct 200 becomes small.

The coefficient updating circuit 240 updates the coefficient of the noise control filter 220 in order that a signal $E_j$ outputted as a sum of a secondary noise $-G_j$, to which a phase inversion is performed by multiplying "−1" at a multiplier 205 and which is transmitted from a loud speaker 203, and the noise $g_j$ from the error detecting microphone 202 may become a minimum.

The secondary noise $-G_j$ outputted from the loud speaker 203 feeds back to the noise detecting microphone 201 through the duct 200. At this time, a feedback control filter 210 is inserted in order to intercept the feedback path of the duct 200 leading to the noise detecting microphone 201 from the loud speaker 203 to prevent an occurrence of a howling.

Also, an error path filter 230 is a filter for simulating a characteristic of an error path leading to the coefficient updating circuit 240 from the output terminal of the multiplier 205 through the loud speaker 203 and the error detecting microphone 202, and is used for a coefficient update of the noise control filter 220.

At that time, it is necessary for the error path filter 230 to accurately simulate the error path.

From the structure of the prior art example shown in FIG. 30, it is seen that the noise $g_j$ is canceled when the coefficient of the noise control filter 220 is updated in order that the sum of the secondary noise $-G_j$, to which the phase inversion is performed at the multiplier 205 and which is transmitted from the loud speaker 203, and the noise $g_j$, i.e. the output $E_j$ from the error detecting microphone 202 may become a minimum. The most typical algorithm applied to the coefficient updating circuit 240 which updates the coefficient vector $H_j$ is a Filtered-x NLMS method applying a general LMS (Least Mean Square) method, which is expressed by the following equation:

$$H_{j+1} = H_j + \frac{\mu E_j X_j}{\|X_j\|^2} \qquad \text{Eq.(1)}$$

where, $\mu$ is a constant called "step gain", $E_j$ is the output of the error detecting microphone 202, and $X_j$ is a vector expressed by the following Eq.(2) composed of "I" number of elements $X_j, X_{j-1}, \ldots X_{j(I-1)}$ expressed by $X_j(1), X_j(2), \ldots, X_j(I)$ and obtained by the output $X_j$ of the error path filter 230, which simulates the characteristic of the error path leading to the coefficient updating circuit 240 from the output of the multiplier 205 through the error detecting microphone 202, being retraced up to the past I−1 sampling periods.

$$X_j = [X_j(1)X_j(1), \ldots, X_j(I)] \qquad \text{Eq.(2)}$$

Also, the noise control filter 220 and the error path filter 230 are composed of a non-recursive type. In the following description, the number of taps in the filters 220 and 230 are expressed by "I" and "M" for the convenience's sake.

Assuming the Filtered-x NLMS method is a coefficient updating algorithm, the following coefficient of the error path filter 230:

$$C = [\underline{C(1)}\underline{C(2)} \ldots \underline{C(M)}] \qquad \text{Eq.(3)}$$

is required to be an estimated value approximated, with a high accuracy, to the following impulse response of the error path:

$$C = [C(1)C(2) \ldots C(M)] \qquad \text{Eq.(4)}$$

Generally, the coefficient of the error path filter 230 in FIG. 30 is fixed and the calculation thereof is performed by the arrangement of providing, before starting the active noise control of FIG. 30, a white noise generated by a white noise generation circuit 250, as shown in FIG. 31, to the loud speaker 203 and the error path filter 230, providing the outputs of the error detecting microphone 202 and the error path filter 230 to a subtracter 251, and providing the difference output to the coefficient updating circuit 240.

Obviously, the problem of such an error path filter is that the white noise is outputted from a white noise generator 130 through the loud speaker to the outside of the duct upon the calculation of the coefficient. In spite of a temporary occurrence, it is not preferable that a noise of another kind is outputted from the active noise control apparatus in that way.

It is also a problem that the coefficient thus calculated of the error path filter 230 is hereafter to be fixed upon the active noise control as shown in FIG. 30. This is natural because the change of the characteristic within the duct 200 after the calculation can be fully expected.

In fact, it is known that when the coefficient of the noise control filter 220 is updated by using the calculation result to decrease the noise at the position of the error detecting microphone 202, a reflection position of the noise moves from the outlet end of the duct 200 to the position of the error detecting microphone 202 to change the acoustic characteristic within the duct 200 so that the error path filter 230 fails to accurately simulate the above-mentioned error path.

This simulating operation with a lowered accuracy may have a bad influence on the accuracy maintenance of the coefficient of the noise control filter 220, whereby a sufficient quantity of the noise reduction can not be obtained, and besides the noise control operation becomes unstable. The fact that the acoustic characteristic within the duct changes along with the decrease of the estimation error of the coefficient of the noise control filter 220 indicates that the coefficient correction of the error path filter 230 is required to be repeatedly performed with the active noise control being kept operated.

For estimating the coefficient of the error path filter 230 during the active noise control, a method using a circuit arrangement shown in FIG. 32 is known.

Namely, the white noise generated by the white noise generation circuit 250 is added to the secondary noise $-G_j$ from the multiplier 205 at an adder 252 to be outputted from the loud speaker 203, so that the coefficient of the error path filter 230 is updated in order that the output of the subtracter 251 may become a minimum by applying thereto the coefficient updating circuit 240 which is not operating or has become available by not performing (by fixing) the coefficient update of the noise control filter 220, different from the example of FIG. 30.

In this arrangement, since the coefficient of the error path filter 230 gives the impulse response of the error path whose characteristic has been changed by the noise control at the time when the output of the subtracter 251 has become a minimum, the coefficient at this time has only to be used at the circuit of FIG. 30.

However, in such a circuit arrangement, as mentioned above, the overlap of the white noise outputted from the loud speaker 203 during the active noise control indicates that the active noise control apparatus becomes a new noise source.

Furthermore, the Filtered-x NLMS method of the above-mentioned Eq.(1) used for the coefficient update of the error path filter 230 does not guarantee the stable operation of 100%.

Accordingly, this generally requires a practical compromise to lessen a step gain as much as possible and the possibility of being made unstable. However, since the setting of such a small step gain causes a problem that a noise canceling performance is deteriorated in fixed-point arithmetic, which is practically left unsolved upon adopting an inexpensive fixed-point signal processor.

In order to fundamentally solve this problem, an algorithm has only to be set up which makes the coefficient calculation of the error path filter 230 unnecessary.

For such an algorithm, has already been proposed a simultaneous perturbation type optimization technique (Kajikawa, Nomura, "Proposal of Active Noise Control System which Performs Update Only by Using Residual Signal", 1-4-12, 1997 Autumn Meeting of the Acoustical Society of Japan, pp.497–498).

The characteristic of this technique lies on the point that perturbation is added to the coefficient of the noise control filter 220 by using the white noise. This measure of adding the perturbation is equivalent to the overlap of the white noise with the secondary noise, which can not solve the problem of the arrangement in FIG. 30.

Also, the coefficient of the feedback control filter 210 is generally calculated before starting the active noise control by forming the circuit shown in FIG. 33. The calculation method is performed in order that the difference between the output of the feedback path leading to the noise detecting microphone 201 from the loud speaker 203 and the output of the feedback control filter 210 may become a minimum, resulting in that the feedback path is to be intercepted by the subtracter 204.

However, it is a problem that the coefficient thus calculated of the feedback control filter 210 is hereafter fixed naturally because the change of the characteristic within the duct 200 is fully expected.

Actually, it is known that when the coefficient of the noise control filter 220 is updated and the noise is canceled at the position of the error detecting microphone 202, the reflect position of the noise moves from the duct outlet to the error detecting microphone 202.

This change will vary the acoustic characteristic within the duct, so that the characteristic difference between the feedback control filter 210 and the actual feedback path is extended to deteriorate the interception performance of the feedback path.

This deterioration of the interception performance not only increases the danger of howling occurrence but also increases the estimated coefficient error of the noise control filter 220 and deteriorates the noise reduction performance. The fact that the acoustic characteristic within the duct changes according to the noise reduction quantity means that the coefficient correction of the feedback control filter 210 is required to be repeatedly performed during the active noise control.

For updating the coefficient of the feedback control filter 210 during the active noise control, a method shown in FIG. 34 is the most general. Namely, the white noise generated by the white noise generation circuit 250 is added to the secondary noise $-G_j$ at the adder 251 to be transmitted from the loud speaker 203, and different from the example of FIG. 30, the coefficient of the feedback control filter 210 is updated in order that the output of the subtracter 204 may become a minimum by applying thereto the coefficient updating circuit 240 which has become available by stopping (fixing) the coefficient update of the noise control filter 220.

In this arrangement, when the output of the subtracter 204 becomes the minimum, the characteristic of the feedback path which has been changed by the noise control is simulated by the feedback control filter 210, so that the interception of the feedback path is realized.

However, the defect of this method obviously lies on that a different kind of noise (white noise) from the white noise generation circuit 250 introduced for reducing the noise is transmitted from the loud speaker 203.

The active noise control apparatus of the feedforward type is shown as an example in the above, while FIG. 35 shows a general arrangement of an active noise control apparatus of a feedback type. This active noise control apparatus reduces a noise $w_j$ [j: sample time index] to be controlled by acoustically overlapping therewith the synthesized noise $g_j$ transmitted from the loud speaker 203 at the position of the microphone 201. The status of reducing the noise is monitored by the output $$e_j = w_j + g_j \qquad \text{Eq.(5)}$$

of the microphone 201 and the coefficient updating circuit 240 updates the coefficient of the noise control filter 220 in order that an output $e_j$ may become the minimum.

It is to be noted that the error path filter 230 is one for simulating the characteristic of the error path leading to the coefficient updating circuit 240 from the output edge of the noise control filter 220 through a multiplier 221, the loud speaker 203, and the microphone 201, which is required for the coefficient update of the noise control filter 220.

In addition, when the gain of a closed circuit, formed by the feedback path leading to the microphone 201 from the loud speaker 203 and the noise control filter 220, exceeds "1", howling occurs. Therefore, in order to prevent the howling, the feedback control filter 210 and an adder (subtracter) 211 are provided.

As seen from the above Eq.(5), when $g_j \approx -w_j$, the noise $w_j$ is canceled, so that the noise near the microphone 201 becomes small.

The problem in the active noise control of the feedback type arises from the synthesized noise $g_j$ being generated based on the noise $w_j$ to be controlled. Namely, a delay is inevitable until the time when the noise $w_j$ to be controlled is transmitted to the microphone 201 as the synthesized noise $g_j$ after being received at the microphone 201, synthesized at the noise control filter 220, and inverted at a multiplier 221. Accordingly, the noise which can be controlled with this active noise control apparatus of the feedback type is limited to a periodical noise regardless of the time delay.

What should be most remarked upon designing this active noise control apparatus is that the apparatus is required to stably operate so as to prevent an opposite effect such as increasing the noise by introducing this apparatus.

As the most typical adaptive algorithm applied to the coefficient updating circuit 240 which updates the coefficient of the noise control filter 220 in the above-mentioned active noise control apparatus of the feedback type, the above-mentioned Filtered-x method is used in a modified form, in which the error path filter 230 is prepositioned for simulating the characteristic of the path leading to the output of the microphone 201 through the loud speaker 203.

Namely, if the synthesized noise $g_j$ outputted from the loud speaker 203 shown in FIG. 35 and reaching the microphone 201 is completely canceled by the output of the feedback control filter 210, the input $x_j$ of the noise control filter 220 assumes the noise $w_j$ itself. Accordingly, this input $x_j$ can be treated as a reference signal for the adaptive algorithm for updating the coefficient of the noise control filter 220.

Also, the output $e_j$ of the microphone 201 can be regarded as a difference between an output $g_j$ of an adaptive filter, added to a desired response $w_j$ through the feedback path leading to the microphone 201 from the loud speaker 203, and the desired response $w_j$. With these two signals, the arrangement of this feedback type can be treated exactly in the same way as the above-mentioned active noise control apparatus of the feedforward type.

Namely, a coefficient $A_j$ of the noise control filter 220 in this case is updated by the following equation:

$$A_{j+1}=A_j+\mu e_j Y_j \qquad \text{Eq.(6)}$$

where $Y_j=[Y_j(1)Y_j(2) \ldots Y_j(I)]^T$ is a signal vector in which "I" number of aggregation of $y_j$, obtained by applying the error path filter 230 to the input $x_j$ of the noise control filter 220, are replaced by $Y_j(i)=y_{j-i+1}$.

In addition, "I" is the number of taps, and "$\mu$" is a constant called "step gain".

$$A_j=[A_j(1)A_j(2) \ldots A_j(I)]^T \qquad \text{Eq.(7)}$$

is the coefficient of the noise control filter 220 set at the time j.

In order to stably update the coefficient of the noise control filter 220 by the Filtered-x LMS method, it is required that the impulse response of the feedback path leading to the output of the microphone 201 through the loud speaker 203 is preliminarily calculated and the result is set for the coefficients of the feedback control filter 210 and the error path filter 230.

The calculation is generally performed by forming the circuit as shown in FIG. 36 with the white noise generation circuit 250 before starting the active noise control. When the output $x_j$ of the subtracter 211 becomes a minimum in this circuit arrangement, it means that the feedback control filter 210 has been able to simulate the feedback path. Then, if the coefficient of the coefficient updating circuit 240 at that time is copied to the error path filter 230, the coefficient update of the noise control filter 220 is made possible by the Filtered-x LMS method.

The active noise control apparatus of the feedback type applying thereto this coefficient update method is often used, which is mentioned, for example, in the following reference (1):

(1) Omoto, et al. "The Behavior of an Adaptive Algorithm with Moving Primary Source—Performance of a Feedback System—" 1997 Autumn Meeting of the Acoustical Society of Japan, 1-4-14, pp.501–502).

The flow of the signals in this active noise control apparatus of the feedback type is equivalently shown by the block diagram of FIG. 37, where W(z): transfer function of noise $w_j$, X(z): transfer function of output $x_j$ of subtracter 211, E(z): transfer function of output $e_j$ of microphone 201, A(z): transfer function of noise control filter 220, B(z): transfer function of feedback path leading to output of microphone 201 through loud speaker 203, D(z): difference between transfer function B(z) of feedback path and transfer function B̂(z) of feedback control filter 210.

In FIG. 37, the coefficient of the noise control filter 220 is updated in order that the output E(z) of the microphone (subtracter) 201 may become a minimum. From FIG. 37, it is seen that the active noise control apparatus of the feedback type can be regarded as a liner predictor for the noise $w_j$ which uses the noise control filter 220 as the adaptive filter. As a method proposed by paying attention to this point, an active noise control of an adaptive prediction type exists, which is shown in the following reference (2):

(2) Hamada, et al. "Active Noise Control Using Adaptive Prediction-Implementation by Adaptive Filter—" 1992 Autumn Meeting of the Acoustical Society of Japan, 2-4-1, pp.531–532.

The structure controls the filter coefficient of the noise control filter 220 by using an adaptive prediction filter 223 as shown in FIG. 38. Furthermore, the linear prediction analysis portion of this active noise control of the adaptive prediction type would be shown by the block diagram, as shown in FIG. 39, where a(z) is a transfer function of the adaptive prediction filter 223.

In order to effectively operate the arrangement of this reference (2), in the same way as the reference (1) described before, it is premised that the feedback path is simulated by the feedback control filter 210 with a high accuracy, and the approximation of D(z)≈0 is realized.

Namely, when $$\frac{1}{1-D(z)A(z)} \approx 1 \qquad \text{Eq. (8)}$$

is realized, the output X(z) of the subtracter 211 assumes the noise W(z) itself.

Furthermore, since the approximation is also B(z)=B̂(z), it is seen that the arrangements of FIGS. 39 and 37 form a linear prediction analysis circuit for the noise W(z) having the same structure, if these two approximations of D(z)=0 and B(z)=B̂(z) are applied to the circuit arrangement of FIG. 37 to exchange the connection order of the transfer function A(z) of the noise control filter 220 and the transfer function B(z) of the feedback path.

Namely, as the result of the linear prediction analysis by the circuit arrangement of FIG. 39, when the output of a subtracter 222 becomes a minimum, the coefficient of the adaptive prediction filter 223 provides the coefficient of the noise control filter 220 which minimizes the output E(z) of the microphone 201. Accordingly, when the coefficient of the adaptive prediction filter 223 is copied for the coefficient of the noise control filter 220, the noise $w_j$ is suppressed small.

However, the problem in this case is that the control principles of the active noise control apparatuses of the feedback type in FIGS. 35 and 38 both premise $B(z)=\hat{B}(z)$.

Generally, in the estimate of the impulse response of the feedback path the error is inevitable, so that it is fully expected that the response changes with time. However, it is possible to take a measure that the coefficient of the feedback control filter 210 is updated all the time to maintain $B(z)=\hat{B}(z)$ by overlapping the white noise with the synthesized noise to make it a reference signal. However, feeding the white noise to the secondary source is equal to making the active noise control apparatus a new noise source.

In the active noise control apparatus of FIG. 35, as another defect, "coefficient updating algorithm of Filtered-x type represented by Filtered-x LMS method is unstable in principle" can be mentioned.

The stability condition of the Filtered-x LMS method is studied in the following reference (3):

(3) Yabuki, et al. "Stability Condition in Filtered-x LMS Method in case that Modeled Error Exists in C Filter" The institute of electronics, information and communication engineers, (A), vol J80-A no.11, pp.1868–1876 (1997-11).

However, as a result, measures except "providing smallest step gain" are not mentioned. Also, according to the analysis, even if the step gain is made small, the stability can not be completely guaranteed.

SUMMARY OF THE INVENTION

It is accordingly an object of the present invention to provide an active noise control apparatus for updating a coefficient of a noise control filter which synthesizes a secondary noise having a same amplitude as and an opposite phase to a noise to be suppressed, in which an algorithm not requiring a coefficient calculation of an error path filter without outputting a white noise from a loud speaker is set up, thereby fundamentally solving the problem of Filtered-x LMS method.

Furthermore, it is an object of the present invention to provide an active noise control apparatus which has a function of correcting a coefficient of a feedback control filter all the time corresponding to a changing impulse response of a feedback path without outputting the white noise from the loud speaker during the noise control.

Moreover, it is an object of the present invention to provide an active noise control apparatus of a feedback type having a feedback control filter which simulates a characteristic of a feedback path leading to a noise detecting microphone connected to an input of a noise control filter for synthesizing a secondary noise, through a loud speaker which transmits the secondary noise having the same amplitude as and the opposite phase to a primary noise for suppression, and which realizes an updating circuit of an essentially stable coefficient for the noise control filter without outputting the white noise from the loud speaker.

FIG. 1 shows a principle of an active noise control apparatus according to the present invention [1], and in particular is a diagram for illustrating a calculation principle of a coefficient of a noise control filter not requiring a coefficient estimation of an error path filter used for the active noise control apparatus.

In the present invention, the noise control filter comprises a first and a second noise control filter 144 and 142 respectively having a first and a second arbitrary coefficient $A_1$ and $A_2$, and the apparatus further comprises a first and a second overall system filter 141 and 143 which form an overall system filter for simulating a characteristic of an overall system leading to an error detecting microphone from a noise detecting microphone that detects a noise component required for synthesizing the secondary noise, and which has a first and a second coefficient $S_1$ and $S_2$ respectively obtained for the second and the first coefficient $A_1$ and $A_2$, a differential overall system filter 146 for outputting a response difference of the first and the second overall system filter 141 and 143, and an estimating noise transfer system filter 147, having a variable coefficient, connected to the differential overall system filter 146 in cascade, a white noise generated by a white noise generation circuit 250 being applied to the differential overall system filter 146 and to respective cascade combinations of the first overall system filter 141 and the second noise control filter 142, and the second overall system filter 143 and the first noise control filter 144; the coefficient of the estimating noise transfer system filter 147 being updated in order that a difference between the output of the differential overall system filter 146 and a differential output between the first and the second noise control filter 144 and 142 becomes a minimum, and the coefficient of the estimating noise transfer system filter 147 obtained at a time when the difference becomes the minimum being provided as the coefficients of the noise control filters.

In order to briefly explain the principle, the active noise control apparatus of FIG. 30 is shown by a functional block diagram as shown in FIG. 2. However, since the subtraction of the noise by the secondary noise is performed within a space of the duct 200 in FIG. 2, a subtracter 206 shown in FIG. 2 is not formed as an actual circuit. Also, being not related to the principle, the feedback control filter 210 is omitted in FIG. 2.

Also, the basic arrangement of the active noise control apparatus when the arrangement of FIG. 2 is applied to the present invention is shown in FIG. 3, wherein it is characterized that an overall system filter 260 for simulating the overall characteristic of the control system leading to the error detecting microphone 202 from the noise detecting microphone 201 is added.

Since the coefficient of the noise control filter 220 is arbitrarily set, the first and the second noise control filter 144 and 142 forming the noise control filter 220 shown in FIG. 3 are set to have a first and a second coefficient $A_1$ and $A_2$ so that the transfer functions are made to have the coefficients $A_1$ and $A_2$ by modifying the coefficient to the extent of the noise reduction quantity being not deteriorated greatly.

In addition, the first and the second coefficient $S_1$ and $S_2$ of the overall system filter 260, which makes an output of a subtracter 261 a minimum for the first and the second coefficient $A_1$ and $A_2$ set in the noise control filter 220 in the arrangement of FIG. 3, are set in the first and second overall system filter 141 and 143 shown in FIG. 1.

The differential overall system filter 146 is one for generating a difference output $S_1-S_2$ between the first and the second overall system filter 141 and 143. The estimating noise transfer system filter 147 is an adaptive filter for updating the coefficient in order that the output of a subtracter 148 may become a minimum by the coefficient updating circuit 240 applied from the active noise control apparatus of FIG. 3 by using a signal obtained by applying the output of the white noise generation circuit 250 to the first and the second overall system filter 141 and 143 and the differential overall system filter 146, thereby extracting the impulse response of the noise transfer system as a coefficient, included in the first and the second overall system filter 141 and 143, and the first and the second noise control filter 142 and 144.

The calculation of the coefficient of the overall system filter 260 shown in FIG. 3 is performed by temporarily stopping the coefficient update of the noise control filter 220 and applying thereto the coefficient updating circuit 240 which has become unnecessary by the stoppage. Expressing the transfer functions of the circuit shown in FIG. 3 respectively as follows:

D: transfer function of noise transfer system 200,
A: transfer function of noise control filter 220,
S: transfer function of overall system filter 260,
C: transfer function of error path 190, the relationship of the following equation is obtained when the output of the subtracter 261 becomes the minimum:

$$S \approx (D-A)C \qquad \text{Eq.(9)}$$

It is of course that since the coefficients of the noise control filter 220 can be arbitrarily set, the coefficients are set in order that the transfer functions may assume $A_1$ and $A_2$ by modifying the coefficients to the extent of the noise reduction quantity being deteriorated greatly, and the coefficients of the overall system filter 260 are updated in order that the output of the subtracter 261 may become the minimum for both coefficients.

When the output of the subtracter 261 has become the minimum by the coefficient update, the transfer functions $S_1$ and $S_2$ of the overall system filter 260 satisfy the following equations:

$$S_1 \approx (D-A_1)C \qquad \text{Eq.(10)}$$

$$S_2 \approx (D-A_2)C \qquad \text{Eq.(11)}$$

Obviously, with the difference between the above-mentioned both transfer functions $S_1$ and $S_2$, the transfer function D of the noise transfer system 200 is eliminated, so that the transfer function of the error path to be determined, i.e. the coefficient of the error path filter 230 is calculated by the following equation:

$$C \approx (S_1-S_2)/(A_2-A_1) \qquad \text{Eq.(12)}$$

From the first and the second Eqs.(10) and (11) of the simultaneous equations, it is seen that the transfer function D of the noise transfer system 200 is included as another unknown number. If "D" is solved with Eqs.(10) and (11), the following equation can be obtained:

$$D=(S_1A_2-S_2A_1)/(S_1-S_2) \qquad \text{Eq.(13)}$$

Then, the transfer function of the left side of Eq.(13) has only to be converted into the impulse response. The sampled values of the impulse response assume the coefficient of the noise control filter 220 to be determined.

Namely, by taking advantage of a coefficient of a non-recursive filter corresponding to the impulse response, the characteristics of the systems are modified by the impulse response from the transfer function. Firstly, the impulse response in the noise transfer system 200 is expressed as in the following equation:

$$D=[D(1)D(2)\ldots D(l)] \qquad \text{Eq.(14)}$$

The coefficients corresponding to the transfer functions $S_1$ and $S_2$ of the overall system filter 260 are respectively expressed as follows:

$$S_1=[S_1(1)S_1(2)\ldots S_1(L)] \qquad \text{Eq.(15)}$$

$$S_2=[S_2(1)S_1(2)\ldots S_2(L)] \qquad \text{Eq.(16)}$$

Also, two coefficients of the noise control filter 220 are expressed as follows:

$$A_1=[A_1(1)A_1(2)\ldots A_1(l)] \qquad \text{Eq.(17)}$$

$$A_2=[A_2(1)A_2(2)\ldots A_2(l)] \qquad \text{Eq.(18)}$$

If $S_1$ is provided to the first overall system filter 141 of the circuit shown in FIG. 1, $S_2$ to the second overall system filter 143, and similarly the coefficients $A_1$ and $A_2$ are respectively provided to the first and the second noise control filter 144 and 142 by using the above-mentioned equations, the output of a subtracter 145 assumes a response whose transfer function is $S_1A_2-S_2A_1$.

Accordingly, if the estimating noise transfer system filter 147 having a variable coefficient is connected to the differential overall system filter 146 in cascade whose filter coefficient is $S_1-S_2$ with the system whose transfer function $S_1A_2-S_2A_1$ being made an unknown system, and the coefficient of the estimating noise transfer system 147 is updated at the coefficient updating circuit 240 in order that the output of the subtracter 148 may become the minimum, the coefficient converges into the impulse response of the noise transfer system 200.

It is to be noted that only upon the activation preliminarily stored coefficients may be used for the first and the second coefficient respectively of the above-mentioned first and the second noise control filter, and after the activation a coefficient obtained upon the present coefficient update may be substituted for one of the first and the second coefficient, and furthermore, coefficients obtained upon the last and the present coefficient update may be provided for the first and the second coefficient.

Also, when the output of the overall system filter becomes equal to or less than a threshold value, it is preferable that the coefficient update is stopped.

FIG. 4 is a principle diagram of an active noise control apparatus according to the present invention [2]. An inverse filter composing circuit 110 forms a filter having a characteristic including a transfer function opposite to a closed circuit starting from the noise control filter 220 and returning to the noise control filter 220 again through both (parallel circuit) of the feedback path and the feedback control filter 210, the transfer function expressing a generation process of the primary noise.

A system identification circuit 120 provides two pairs of different fixed coefficients either to the feedback control filter 210 or the noise control filter 220 to update a coefficient of an adaptive filter 150 in order that a difference becomes a minimum between an output of a first filter 130 forming a numerator of a solution obtained by eliminating a transfer function component expressing the generation process of the primary noise, from simultaneous equations based on two transfer functions of an inverse filter formed within the inverse filter composing circuit 110 for the two pairs of coefficients and an output of the adaptive filter 150 connected to a second filter 140 in cascade forming a denominator of the solution.

A coefficient of the feedback control filter 210 is updated by using the coefficient of the adaptive filter 150 obtained by operating the system identification circuit 120.

The principle of the present invention is an improvement of an active noise control apparatus of the Japanese Patent Application No.9-239776 (Japanese Patent Publication Laid-open No.11-85165) by the inventors of this invention and others.

The principle will be briefly described referring to FIG. 5.

Firstly, in the system where the active noise control can be applied, the primary noise is not supposed to be a white noise. If the application to a practical apparatus is considered, this supposition is natural.

At this time, the noise $x_j$ which is detected at the noise detecting microphone 201 and which is not the white noise can be regarded as the output of the filter W(z) (represented by "W" in Figure, and hereinafter will be represented similarly) which inputs a white noise $W_j$.

The feature of this apparatus lies in that before starting the active noise control, a filter $W^{-1}(z)$ having an inverse characteristic to a noise generation filter W(z) is preliminarily formed by a whitening circuit 310 shown in the upper part of FIG. 5.

This whitening circuit 310 can be formed by using, for example, a linear prediction method common in a voice analysis field. It can be said that the whitening circuit 310 has formed the inverse filter $W^{-1}(z)$ when the noise $x_j$ is whitened.

On the other hand, the output from the subtracter 204 after starting the active noise control becomes $w_j \cdot W(z)/\{1-D(z)A(z)\}$, where D(z) is a difference between a transfer function $\hat{B}(z)$ of the feedback control filter 210 and a transfer function B(z) of the feedback path (feedback path within the duct 200 from the loud speaker 203 to the microphone 201), and A(z) is a transfer function of the noise control filter 220.

Accordingly, the signal outputted as a result that the inverse filter $W^{-1}(z)$ by the whitening circuit 310 is operated on the output of the subtracter 204 assumes an output in which a white noise $w_j$ is applied to the system whose transfer function is $W(z)W^{-1}(z)/\{1-D(z)A(z)\}$, so that it is expressed by $w_j \cdot W(z)W^{-1}(z)/\{1-D(z)A(z)\}$.

Obviously, since the numerator $W(z)W^{-1}(z)$ represents a simple delay, the coefficient of the inverse filter formed by the inverse filter composing circuit 110 assumes $\{1-D(z)A(z)\}$, if the above-mentioned output of the whitening circuit 310 is similarly whitened by using the composing circuit 110.

Furthermore, if an inverse filter 320 which provides the transfer function as $\{1-D(z)A(z)\}$ is combined with a subtracter 330, the transfer function is given by the following equation:

$$1-\{1-D(z)A(z)\}=D(z)A(z) \qquad \text{Eq.(19)}$$

Accordingly, if this transfer function is made an unknown system function and the system identification circuit is formed by connecting the cascade connection of a copied noise control filter 360 formed by copying the coefficient of the noise control filter 220 and the adaptive filter 150 to the unknown system in parallel, the adaptive filter 150 at the time when the output of a subtracter 151 becomes the minimum is to provide a transfer function approximated to the above-mentioned transfer function D(z), since the transfer function of the copied noise control filter 360 is A(z) as mentioned above.

Namely, if the coefficient of the adaptive filter 150 is added to that of the feedback control filter 210 to be updated, the gain of a closed circuit formed by the feedback path is to be suppressed small.

However, in the apparatus mentioned in the Japanese Patent Application No.9-239776 (Japanese Patent Publication Laid-open No.11-85165) as mentioned above, that "it is necessary that the inverse filter $W^{-1}(z)$ of the filter W(z) which generates the noise $x_j$ is formed before starting the active noise control" makes an issue.

Obviously, if the characteristic of the noise $x_j$ can change during the active noise control, the inverse filter composing circuit 110 does not compose the transfer function $\{1-D(z)A(z)\}$, and can not be applied to the system where the characteristic of the noise changes during the active noise control.

Therefore, in the present invention [2], the noise $x_j$ detected at the noise detecting microphone 201 is assumed to be the output of the filter W(z) for the white noise $w_j$, in the same way as the present invention [1], while the process of estimating the inverse filter $W^{-1}(z)$ before starting the active noise control is not performed. Accordingly, the whitening circuit 310 in FIG. 5 is removed from the schematic diagram of the present invention in FIG. 4.

In the present invention, the same supposition as the linear prediction analysis of the voice, i.e. the process of generating the noise $x_j$ is supposed to be described by an all-pole model $1/\{1-P(z)\}$. At this time, the output x(z) of the subtracter 204 obtained during the active noise control is as follows:

$$X(z) = \frac{1}{\{1-P(z)\}\{1-D(z)A(z)\}} = \frac{1}{1-P(z)-D(z)A(z)+P(z)D(z)A(z)} \qquad \text{Eq.(20)}$$

If this output is provided to the input of the inverse filter composing circuit 110 in FIG. 4 and the inverse filter $X^{-1}(z)$ is formed within the inverse filter composing circuit 110 by applying thereto e.g. the linear prediction analysis method, the coefficient of the inverse filter whose transfer function is $$X^{-1}(z)=1-P(z)-D(z)A(z)+P(z)D(z)A(z) \qquad \text{Eq.(21)}$$

can be obtained.

In this inverse filter $X^{-1}(z)$, two unknown transfer functions P(z) and D(z) are included. In order to eliminate one of the unknown number P(z) and extract the other unknown number D(z) which is the object of the present invention, two independent equations (simultaneous equations) are required.

In the present invention, as a method for obtaining the two independent equations, a method is adopted for forming two transfer functions $X_1^{-1}(z)$ and $X_2^{-1}(z)$, which can be realized by providing two pairs of independent coefficients to the noise control filter 220 or the feedback control filter 210 (see FIG. 30) at the inverse filter composing circuit 110.

(2-1) Case of Providing Two Pairs of Fixed Coefficients to Noise Control Filter 220:

This case takes advantage of the coefficients of the noise control filter 220 being arbitrarily set if the decrease of the noise reduction quantity is allowed. Namely, if the coefficients of noise control filter 220 is modified with a time interval to the extent that the noise reduction quantity does not excessively lower below an allowable range so that two pairs of coefficients forming two different transfer functions $A_1(z)$ and $A_2(z)$ of the noise control filter 220 are provided, the inverse filter composing circuit 110 composes the inverse filters whose transfer functions are respectively given by the following equations for each pair of the coefficients:

$$X_1^{-1}(z)=1-P(z)-D(z)A_1(z)+P(z)D(z)A_1(z) \qquad \text{Eq.(22)}$$

$$X_2^{-1}(z)=1-P(z)-D(z)A_2(z)+P(z)D(z)A_2(z) \qquad \text{Eq.(23)}$$

In this case, the transfer functions $X_1^{-1}(z)$ and $X_2^{-1}(z)$ are obtained, if the transfer functions $A_1(z)$ and $A_2(z)$ are respectively determined.

If the both equations are transformed as $$P(z) = \frac{1-X_1^{-1}(z)-D(z)A_1(z)}{1-D(z)A_1(z)} \qquad \text{Eq.(24)}$$

$$P(z) = \frac{1-X_2^{-1}(z)-D(z)A_2(z)}{1-D(z)A_2(z)} \qquad \text{Eq.(25)}$$

and the unknown number $P(z)$ is eliminated, and the equation is arranged for the other unknown number $D(z)$, the following equation can be obtained:

$$D(z) = \frac{X_2^{-1}(z)-X_1^{-1}(z)}{A_1(z)X_2^{-1}(z)-A_2(z)X_1^{-1}(z)} \qquad \text{Eq.(26)}$$

The right side of Eq.(26) is all composed of known transfer functions, and the left side $D(z)$ is, as mentioned above, the difference between the transfer function $\hat{B}(z)$ of the feedback control filter 210 and the transfer function $B(z)$ of the feedback path. Therefore, if the filter coefficient composing the transfer function of Eq.(26) is added to the coefficient of the feedback control filter 210, the transfer function $B(z)$ of the feedback path can be obtained, whereby the object of the present invention can be achieved.

(2-2) Case of Providing Two Pairs of Fixed Coefficients to Feedback Control Filter 210:

The coefficients of the feedback control filter 210 can also be set arbitrarily, if the increase of the feedback quantity is allowed. Namely, the coefficients of the feedback control filter 210 is modified to the extent that the howling does not occur as follows:

$$D_1(z)=B(z)-\hat{B}_1(z) \qquad \text{Eq.(27)}$$

$$D_2(z)=B(z)-\hat{B}_2(z) \qquad \text{Eq.(28)}$$

By these equations, the inverse filter composing circuit 110 composes the inverse filters whose transfer functions are as follows:

$$X_1^{-1}(z)=1-P(z)-\{B(z)-\hat{B}_1(z)\}A(z)+P(z)\{B(z)-\hat{B}_1(z)\}A(z) \qquad \text{Eq.(29)}$$

$$X_2^{-1}(z)=1-P(z)-\{B(z)-\hat{B}_2(z)\}A(z)+P(z)\{B(z)-\hat{B}_2(z)\}A(z) \qquad \text{Eq.(30)}$$

If both equations are arranged to eliminate the unknown number $P(z)$ as follows:

$$P(z) = \frac{1-X_1^{-1}(z)-\{B(z)-\hat{B}_1(z)\}A(z)}{1-\{B(z)-\hat{B}_1(z)\}A(z)} \qquad \text{Eq.(31)}$$

$$P(z) = \frac{1-X_2^{-1}(z)-\{B(z)-\hat{B}_2(z)\}A(z)}{1-\{B(z)-\hat{B}_2(z)\}A(z)} \qquad \text{Eq.(32)}$$

and both are assumed equal, the following equation can be obtained:

$$[1-X_2^{-1}(z)-\{B(z)-\hat{B}_2(z)\}A(z)][1-\{B(z)-\hat{B}_1(z)\}A(z)]=$$
$$[1-X_1^{-1}(z)-\{B(z)-\hat{B}_1(z)\}A(z)][1-\{B(z)-\hat{B}_2(z)\}A(z)] \qquad \text{Eq.(33)}$$

If this equation is arranged for the other unknown number $B(z)$, the following equation can be obtained:

$$B(z) = \frac{X_2^{-1}(z)-X_1^{-1}(z)+A(z)\{\hat{B}_1(z)X_2^{-1}(z)-\hat{B}_2(z)X_1^{-1}(z)\}}{A(z)\{X_2^{-1}(z)-X_1^{-1}(z)\}} \qquad \text{Eq.(34)}$$

This $B(z)$ is a transfer function of the feedback path as mentioned above, and all of the transfer functions on the right side are known. Accordingly, if the filter coefficient forming the transfer function $B(z)$ is reset to the feedback control filter 210, the response of the feedback path in the duct 200 is canceled, so that the gain of the closed circuit is decreased.

(2-3) Calculation of Coefficient by System Identification Circuit 120:

The circuit for calculating the filter coefficient forming Eq.(26) or Eq.(34) is hereby required. In the present invention, the calculation is performed by using the technique of the system identification.

Firstly, if the adaptive filter 150 whose transfer function is supposed to be $d(z)$ is introduced to update the coefficient of the adaptive filter 150 in order that the difference between the output of the first filter 130 having the numerator of Eq.(26) as the transfer function, as shown in FIG. 4, and the output of the cascade connection of the second filter 140 and the adaptive filter 150 having the denominator of Eq.(26) as the transfer function may become the minimum, the cascade connection of the filters 140 and 150 are approximated to the same numerator (filter 130) upon the convergence of the coefficient of the adaptive filter 150, so that the numerator is equal to $[A_1(z)X_2^{-1}(z)-A_2(z)X_1^{-1}(z)]D(z)$ for Eq.(26).

Namely, after the convergence, the coefficient of the adaptive filter 150 is to provide the transfer function $d(z)$ approximated to $D(z)$.

Accordingly, if the adaptive filter 150 and the feedback control filter 210 are similarly formed, by adding the coefficient of the adaptive filter 150 to that of the feedback control filter 210 the coefficient can be replaced by the coefficient which decreases the gain of the closed circuit.

This procedure is similarly applied to the method (by Eq.(34)) of performing the update by providing two pairs of fixed coefficients to the feedback control filter 210. The coefficients forming the transfer functions of the numerator and the denominator of Eq.(34) have only to be set in the first and the second filter 130 and 140 in FIG. 4.

It is to be noted that the above-mentioned system identification circuit can be transformed as follows:

To form the simultaneous equations by using a transfer function provided by the inverse filter composing circuit, from which a constant 1 is removed.

To form the simultaneous equations by setting the two pairs of fixed coefficients of the noise control filter or the feedback control filter to different taps upon the activation of the apparatus.

To set the two pairs of fixed coefficients of the noise control filter or the feedback control filter with a time interval.

To use coefficients obtained upon the last activation for the two pairs of fixed coefficients of the noise control filter or the feedback control filter upon the activation of the apparatus.

Not to update the coefficient of the feedback control filter when the gain of the adaptive filter becomes equal to or less than a fixed value upon a coefficient update performed by providing the two pairs of fixed coefficients to the noise control filter.

FIG. 6 shows a principle arrangement of an active noise control apparatus of a feedback type according to the present invention [3]. An inverse filter composing circuit 110 is one which forms a filter having a characteristic including a transfer function opposite to a closed circuit starting from the noise control filter 220 and returning to the noise control filter 220 again through both (parallel circuit) of the feedback path and the feedback control filter 210, the transfer function expressing a generation process of the primary noise.

A system identification circuit 120 is one for providing two pairs of different fixed coefficients either to the feedback control filter 210 or the noise control filter 220 and for identifying the transfer function of the feedback path by updating a coefficient of an adaptive filter 123 in order that a difference becomes a minimum between an output of a first filter 121 forming a numerator of a solution obtained by eliminating the transfer function component expressing the generation process of the primary noise, from simultaneous equations based on two transfer functions of an inverse filter formed within the inverse filter composing circuit 110 for the two pairs of coefficients and an output of the adaptive filter 123 connected to a second filter 122 in cascade forming a denominator of the solution.

Also, the system identification circuit 120 is repeatedly used for calculating the coefficient of the noise control filter 220 optimally canceling the primary noise, makes a numerator of a ratio of the transfer function expressing the generation process of the primary noise obtained from the simultaneous equations and the transfer function of the feedback path, the first filter 121, makes a denominator the second filter 122, so that the coefficient of the noise control filter 220 which optimally cancels the primary noise is calculated for that of the adaptive filter 123 which minimizes the output of the subtracter 124.

The operation principle of the active noise control apparatus of the feedback type shown in FIG. 6 will now be described.

The noise canceled by the active noise control apparatus of the feedback type is limited to a correlation component of the noise $w_j$. The generation process of the correlation component of the noise $w_j$ can be expressed as the all-pole model, and the noise $W(z)$ can be expressed as the following equation with the white Gaussian noise being inputted:

$$W(z) = \frac{1}{1 - P(z)} \qquad \text{Eq. (35)}$$

When the synthesized noise $g_j$ successfully cancels the correlation component of this noise $w_j$, and the output $e_j$ of the microphone 201 is whitened, the output $E(z)$ of the microphone in FIG. 37 becomes "1" in the following equation:

$$E(z) = W(z)\left\{1 - \frac{A(z)B(z)}{1 - D(z)A(z)}\right\} \qquad \text{Eq.(36)}$$

$$= \frac{1}{1 - P(z)}\left\{1 - \frac{A(z)B(z)}{1 - D(z)A(z)}\right\}$$

If Eq.(36) is arranged by applying E(z)=1, the following equation can be obtained:

$$P(z) = \frac{A(z)B(z)}{1 - D(z)A(z)} \qquad \text{Eq.(37)}$$

If Eq.(37) is arranged for the transfer function A(z) of the noise control filter 220, the following equation is obtained:

$$A(z) = \frac{P(z)}{B(z) + P(z)D(z)} \qquad \text{Eq. (38)}$$

Therefore, it is seen that the noise becomes the minimum when the coefficient forming the transfer function A(z) is provided to the noise control filter 220.

It is to be noted that $$D(z) = B(z) - \hat{B}(z) \qquad \text{Eq.(39)}$$

Namely, in order to obtain the transfer function A(z), the transfer functions B(z) and P(z) have only to be obtained.

The signals which can be monitored by the active noise control apparatus of the feedback type are only the output $e_j$ of the microphone 201 and the output $x_j$ of the subtracter 211. According to the arrangement of FIG. 37, the output $x_j$ of the subtracter 211 can be obtained as $$X(z) = \frac{W(z)}{1 - D(z)\hat{A}(z)} \qquad \text{Eq.(40)}$$

$$= \frac{1}{1 - P(z) - D(z)\hat{A}(z) + P(z)D(z)\hat{A}(z)}$$

by substituting the above Eq.(35) when the coefficient whose transfer function is Â(z) is set in the noise control filter 220.

In the present invention, the inverse filter $X^{-1}(z)$ can be obtained for the output X(z) by using the inverse filter composing circuit 110. For instance, when the inverse filter composing circuit 110 is applied to the output X(z) shown in FIG. 7, the coefficient whose transfer function is $$S(z) = P(z) + D(z)\hat{A}(z) - P(z)D(z)\hat{A}(z) \qquad \text{Eq.(41)}$$

is set in a non-recursive filter 271 when the output of a subtracter 272 becomes the minimum.

In this transfer function S(z), the unknown numbers P(z) and D(z) (i.e. B(z)) forming Eq.(38) are included. In order to calculate two unknown numbers P(z) and D(z), the equation obtained as Eq.(41) is not enough, so that another equation is required.

As a method for obtaining the two equations, as shown in the present invention [2], the fact that an arbitrary fixed coefficient can be set in the noise control filter 220 or the feedback control filter 210 can be utilized.

Namely, when two pairs of independent fixed coefficients are provided to the noise control filter 220 or the feedback control filter 210, the inverse filter composing circuit 110 provides two transfer functions $S_1(z)$ and $S_2(z)$ to the two pairs of coefficients, with which two equations (simultaneous equations) can be obtained as follows:

(3-1) Case of Providing Two Pairs of Coefficients to Noise Control Filter 220:

It is assumed that a slight decline of the noise reduction quantity can be allowed. Namely, if the coefficient A(z) of the noise control filter 220 is modified to the extent of the noise reduction quantity being not deteriorated greatly, and two pairs of coefficients forming two different transfer functions $A_1(z)$ and $A_2(z)$ are provided, the inverse filter composing circuit 110 composes the non-recursive filter 271 whose transfer functions as follows for the two coefficients:

$$S_1(z)=P(z)+D(z)A_1(z)-P(z)D(z)A_1(z) \quad \text{Eq.(42)}$$

$$S_2(z)=P(z)+D(z)A_2(z)-P(z)D(z)A_2(z) \quad \text{Eq.(43)}$$

If both equations are transformed as $$P(z) = \frac{S_1(z) - D(z)A_1(z)}{1 - D(z)A_1(z)} \quad \text{Eq.(44)}$$

$$P(z) = \frac{S_2(z) - D(z)A_2(z)}{1 - D(z)A_2(z)} \quad \text{Eq.(45)}$$

and one unknown number $P(z)$ is eliminated, one of the two unknown numbers can be obtained as follows:

$$D(z) = \frac{S_1(z) - S_2(z)}{A_1(z)\{1 - S_2(z)\} - A_2(z)\{1 - S_1(z)\}} \quad \text{Eq.(46)}$$

It is to be noted that the transfer functions $S_1(z)$ and $S_2(z)$ can be obtained if the transfer functions $A_1(z)$ and $A_2(z)$ are determined by using the non-recursive filter 271 of FIG. 7.

Accordingly, the right side of Eq.(46) is all composed of known transfer functions, so that it is seen that the difference $D(z)$ between the transfer function $B(z)$ of the feedback control filter 210 and the transfer function $B(z)$ of the feedback path can be calculated.

As shown in FIG. 6, if the numerator of Eq.(46) is obtained by the first filter 121, the denominator of Eq.(46) is obtained by the second filter 122, and the coefficient of the adaptive filter 123 is updated in order that no difference from the subtracter 124 is found, the transfer function $D(z)$ can be obtained.

Similarly, from Eqs.(42) and (43), the left unknown number $P(z)$ can be solved. Namely, the unknown transfer function $D(z)$ is arranged as $$D(z) = \frac{S_1(z) - P(z)}{A_1(z)\{1 - P(z)\}} \quad \text{Eq.(47)}$$

$$D(z) = \frac{S_2(z) - P(z)}{A_2(z)\{1 - P(z)\}} \quad \text{Eq.(48)}$$

and then both is assumed equal, so that the following equation can be obtained:

$$P(z) = \frac{S_2(z)A_1(z) - S_1(z)A_2(z)}{A_1(z) - A_2(z)} \quad \text{Eq.(49)}$$

Namely, the determined transfer function $A(z)$ of the noise control filter 220 which optimally cancels the noise $x_j$ to be controlled can be obtained by substituting $D(z)$ and $P(z)$, which are obtained by calculating the above-mentioned Eqs.(46) and (49), as well as the present transfer function $\hat{B}(z)$ of the feedback control filter 210 for the following equation:

$$A(z) = \frac{P(z)}{\hat{B}(z) + \{1 + P(z)\}D(z)} \quad \text{Eq.(50)}$$

in which Eq.(39) is substituted for Eq.(38) to be arranged.

However, the transfer function of the feedback path (loud speaker 203→microphone 201) has improved its accuracy more than the present transfer function at this point is obtained as follows from Eq.(46):

$$\tilde{B}(z)=\hat{B}(z)+D(z)=B(z) \quad \text{Eq.(51)}$$

Otherwise, a correction of making $\tilde{B}(z)$ a new transfer function of the feedback path would be more natural.

Therefore, the transfer function of the feedback path is changed into $\tilde{B}(z)$ of Eq.(51). At this time, since the transfer function $A(z)$ of the noise control filter 220 which optimally cancels the noise $x_j$ to be controlled is approximated to $D(z)=0$ for the new transfer function $\tilde{B}(z)$ of the feedback path, the transfer function $A(z)$ can be calculated from the following equation by Eqs.(50) and (51):

$$A(z) = \frac{P(z)}{\tilde{B}(z)} \quad \text{Eq.(52)}$$

By obtaining the numerator $P(z)$ in Eq.(52) at the first filter 121 in FIG. 6 and the denominator $\tilde{B}(z)$ at the second filter 122, the coefficient $a(z)$ of the adaptive filter 123 is updated in order that the output of the subtracter 124 may become "0", so that the transfer function $A(z)$ can be obtained.

(3-2) Case of Providing Two Pairs of Coefficients to Feedback Control Filter 210:

In the same way as the case of the noise control filter 220, the coefficients of the noise control filter 210 can be arbitrarily set if the increase of the feedback quantity is temporarily allowed. Namely, the coefficients whose transfer function assumes $\hat{A}(z)$ are provided to the noise control filter 220, and the coefficients is modified to the extent that the howling does not occur to the feedback control filter 210, so that the coefficients are set in order that the difference $D(z)$ may become as follows:

$$D_1(z)=B(z)-\hat{B}_1(z) \quad \text{Eq.(53)}$$

$$D_2(z)=B(z)-\hat{B}_2(z) \quad \text{Eq.(54)}$$

By these equations, the inverse filter composing circuit 110 composes the non-recursive filter 271 whose transfer functions are respectively as follows:

$$S_1(z)P(z)+\{B(z)-\hat{B}_1(z)\}\hat{A}(z)-P(z)\{B(z)-\hat{B}_1(z)\}\hat{A}(z) \quad \text{Eq.(55)}$$

$$S_2(z)P(z)+\{B(z)-\hat{B}_2(z)\}\hat{A}(z)-P(z)\{B(z)-\hat{B}_2(z)\}\hat{A}(z) \quad \text{Eq.(56)}$$

In order to eliminate the unknown number $P(z)$, both equations are arranged as follows:

$$P(z) = \frac{S_1(z) - \{B(z) - \hat{B}_1(z)\}\hat{A}(z)}{1 - \{B(z) - \hat{B}_1(z)\}\hat{A}(z)} \quad \text{Eq.(57)}$$

$$P(z) = \frac{S_2(z) - \{B(z) - \hat{B}_2(z)\}\hat{A}(z)}{1 - \{B(z) - \hat{B}_2(z)\}\hat{A}(z)} \quad \text{Eq.(58)}$$

If both are assumed equal, and are arranged for the other unknown number $B(z)$, the following equation can be obtained:

$$B(z) = \frac{S_1(z) - S_2(z) + \hat{A}(z)\{\hat{B}_1(z) - \hat{B}_2(z)\} + \hat{A}(z)\{S_1(z)\hat{B}_2(z) - S_2(z)\hat{B}_1(z)\}}{\hat{A}(z)\{S_1(z) - S_2(z)\}} \quad \text{Eq.(59)}$$

As for Eq.(59), in the same way as the case where the schematic arrangement of FIG. 6 is applied to Eq.(46) in the above (3-1), the first filter 121 can only be applied to the numerator and the second filter 122 to the denominator.

Furthermore, in order to obtain the other unknown number P(z), Eqs.(55) and (56) are arranged as follows:

$$B(z) = \frac{S_1(z) - P(z) + \hat{B}_1(z)\hat{A}(z)\{1 - P(z)\}}{\hat{A}(z)\{1 - P(z)\}} \quad \text{Eq.(60)}$$

$$B(z) = \frac{S_2(z) - P(z) + \hat{B}_2(z)\hat{A}(z)\{1 - P(z)\}}{\hat{A}(z)\{1 - P(z)\}} \quad \text{Eq.(61)}$$

By assuming that both are equal, the following equation can be obtained:

$$P(z) = \frac{S_1(z) - S_2(z) + \{\hat{B}_1(z) - \hat{B}_2(z)\}\hat{A}(z)}{\{\hat{B}_2(z) - \hat{B}_1(z)\}\hat{A}(z)} \quad \text{Eq.(62)}$$

can be obtained.

When the coefficient of the feedback control filter 210 is not updated with Eq.(59) and the transfer function is maintained to e.g. $\hat{B}_1(z)$, the coefficient of the noise control filter 220 which cancels the noise $x_j$ to be controlled can be obtained by substituting B(z) and P(z) obtained with Eqs. (59) and (62) for the following equation:

$$\hat{A}(z) = \frac{P(z)}{\{1 + P(z)\}B(z) - \hat{B}_1(z)} \quad \text{Eq.(63)}$$

in which Eq.(53) is applied to Eq.(38) to be arranged. Also, when the transfer function $\hat{B}_2(z)$ of the feedback control filter 210 is maintained, the coefficient of the noise control filter 220 which cancels the noise $x_j$ to be controlled is calculated by using the following equation:

$$\hat{A}(z) = \frac{P(z)}{\{1 + P(z)\}B(z) - \hat{B}_2(z)} \quad \text{Eq.(64)}$$

In addition, when the coefficient of the feedback control filter 210 is updated by using Eq.(59), it is approximated to D(z)=0 in the same way as the above (3-1). Therefore, by using the new transfer function $\tilde{B}(z)$ of the feedback control filter 210 calculated from Eq.(59), the following equation can be calculated:

$$\hat{A}(z) = \frac{P(z)}{\tilde{B}(z)} \quad \text{Eq.(65)}$$

Also in this case, like the above (3-1), the coefficients of the noise control filter can be obtained by applying the numerator of Eq.(65) to the first filter 121 and the denominator to the second filter 122.

It is to be noted that the above-mentioned system identification circuit 120 can be transformed as follows:

To form the simultaneous equations by using a transfer function provided by the inverse filter composing circuit, from which a constant 1 is removed.

To form the simultaneous equations by setting the two pairs of fixed coefficients of the noise control filter or the feedback control filter to different taps upon the activation of the apparatus.

To make the two pairs of coefficients, which are to be set, of the noise control filter or the feedback control filter two pairs of coefficient of the noise control filter or the feedback control filter both set with a time interval.

To make the two pairs of coefficients, which are to be set, of the noise control filter or the feedback control filter upon the activation of the apparatus coefficients obtained and stored upon the last activation.

Not to update the coefficient of the feedback control filter when the difference between a new and an old coefficient of the feedback control filter becomes equal to or less than a fixed value upon a coefficient update performed by providing the two pairs of coefficients to the feedback control filter.

To apply a transfer function corresponding to a coefficient used for the present coefficient update for the two pairs of coefficients, which are to be set, of the noise control filter or the feedback control filter and the transfer function of the inverse filter upon a subsequent coefficient update of the feedback control filter.

BRIEF DESCRIPTION OF THE DRAWINGS

FIG. 5 is a block diagram of an active noise control apparatus which has been proposed in the Japanese Patent Application No.9-239776 (Japanese Patent Publication Laid-open No.11-85165) by the inventors of this invention and others;

Throughout the figures, like reference numerals indicate like or corresponding components.

DESCRIPTION OF THE EMBODIMENTS

Figure 8:
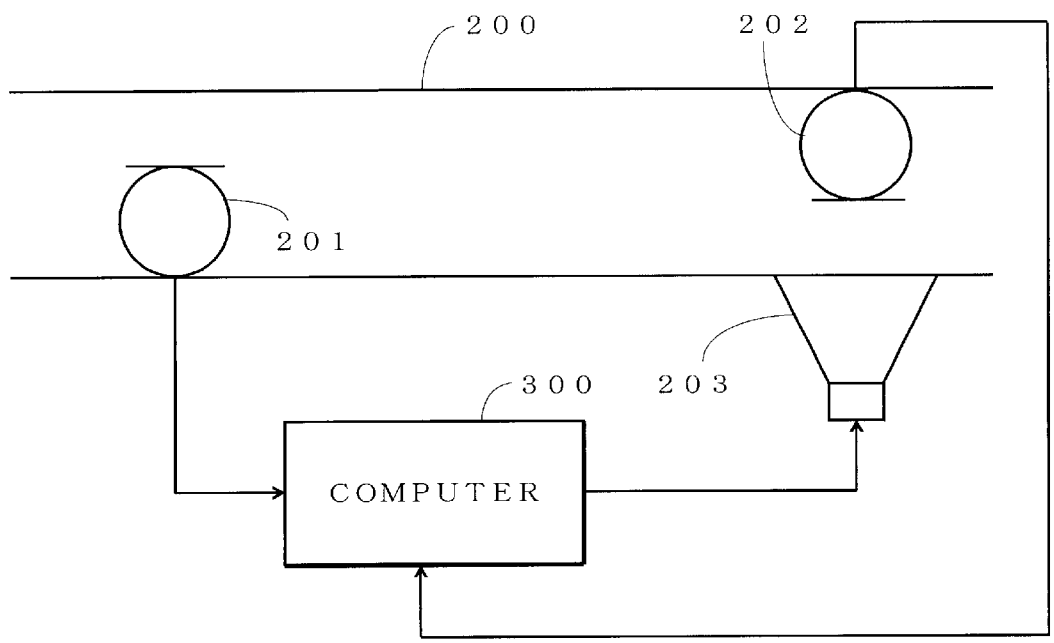
FIG. 8 is a block diagram showing an embodiment of an active noise control apparatus according to the present invention [1]

FIG. 8 shows an embodiment of an active noise control apparatus according to the present invention [1]. This embodiment is composed of a duct 200 as a noise transmission system, a noise detecting microphone 201 for detecting a noise flowing through the duct 200, an error detecting microphone 202 provided at an outlet end of the duct 200, a loud speaker 203, provided oppositely to the microphone 202, for outputting a secondary noise to the duct 200, and a computer 300 for generating the secondary noise provided to the loud speaker 203 based on a noise signal detected at the microphone 201 and an error signal detected at the microphone 202.

Figure 1:
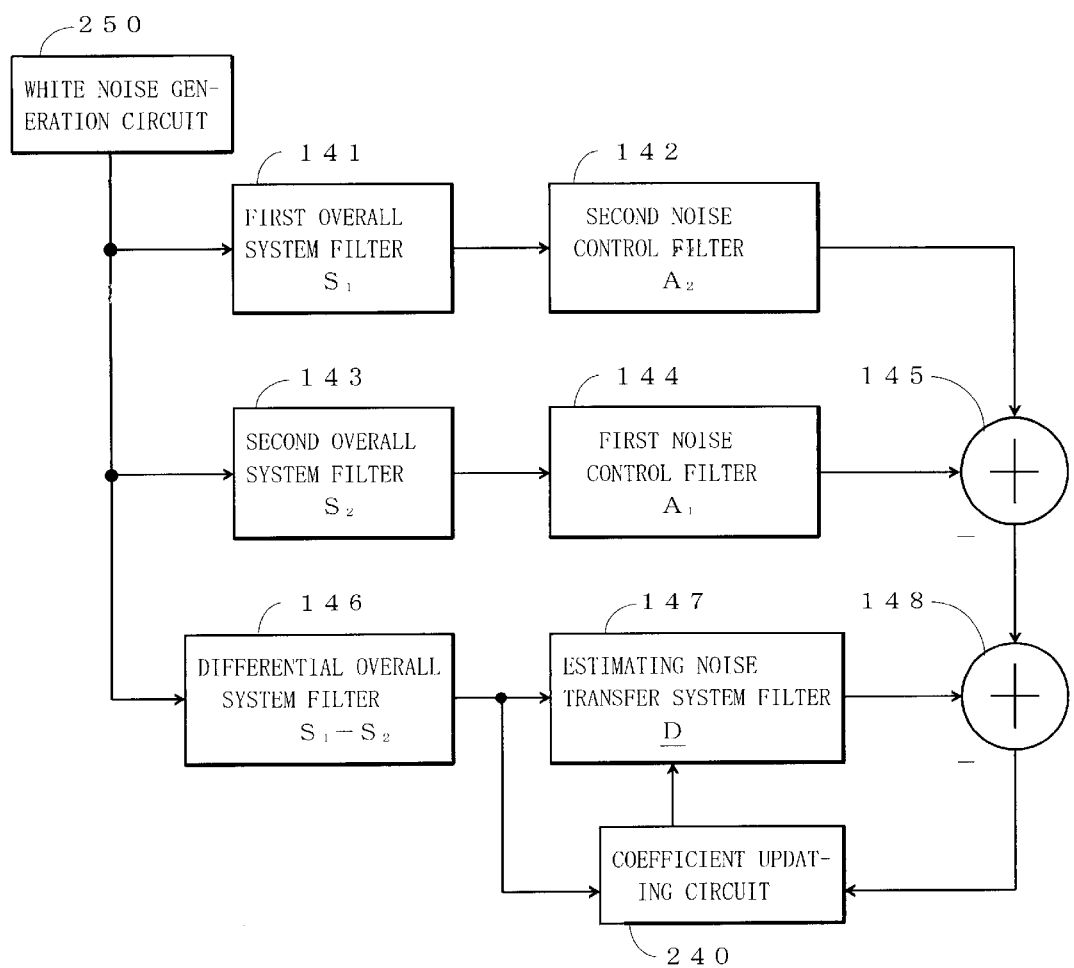
FIG. 1 is a block diagram showing a schematic arrangement of an active noise control apparatus of a feedforward type according to the present invention [1]
Figure 2:
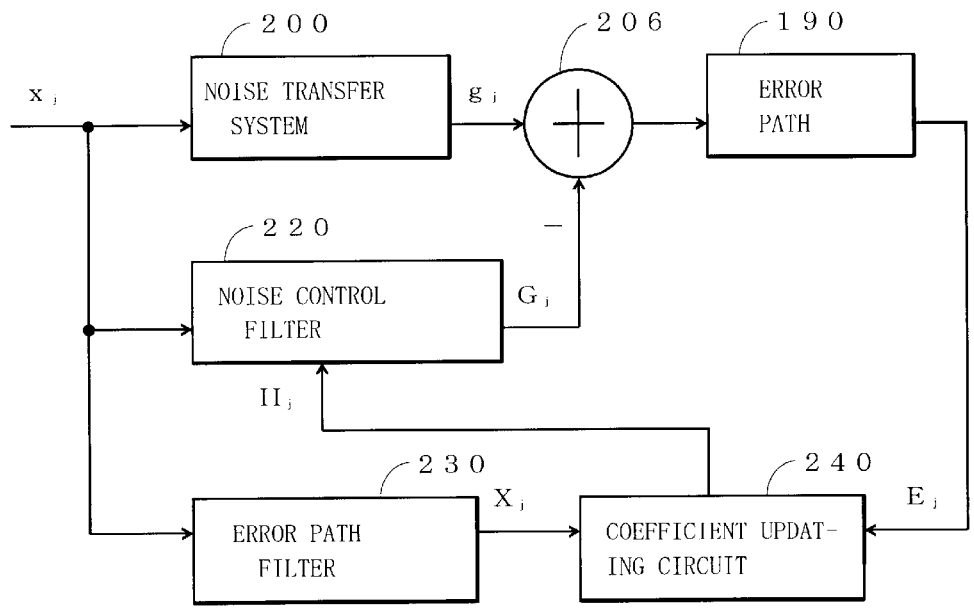
FIG. 2 is a block diagram showing an equivalent structure of a general active noise control apparatus.
Figure 9:
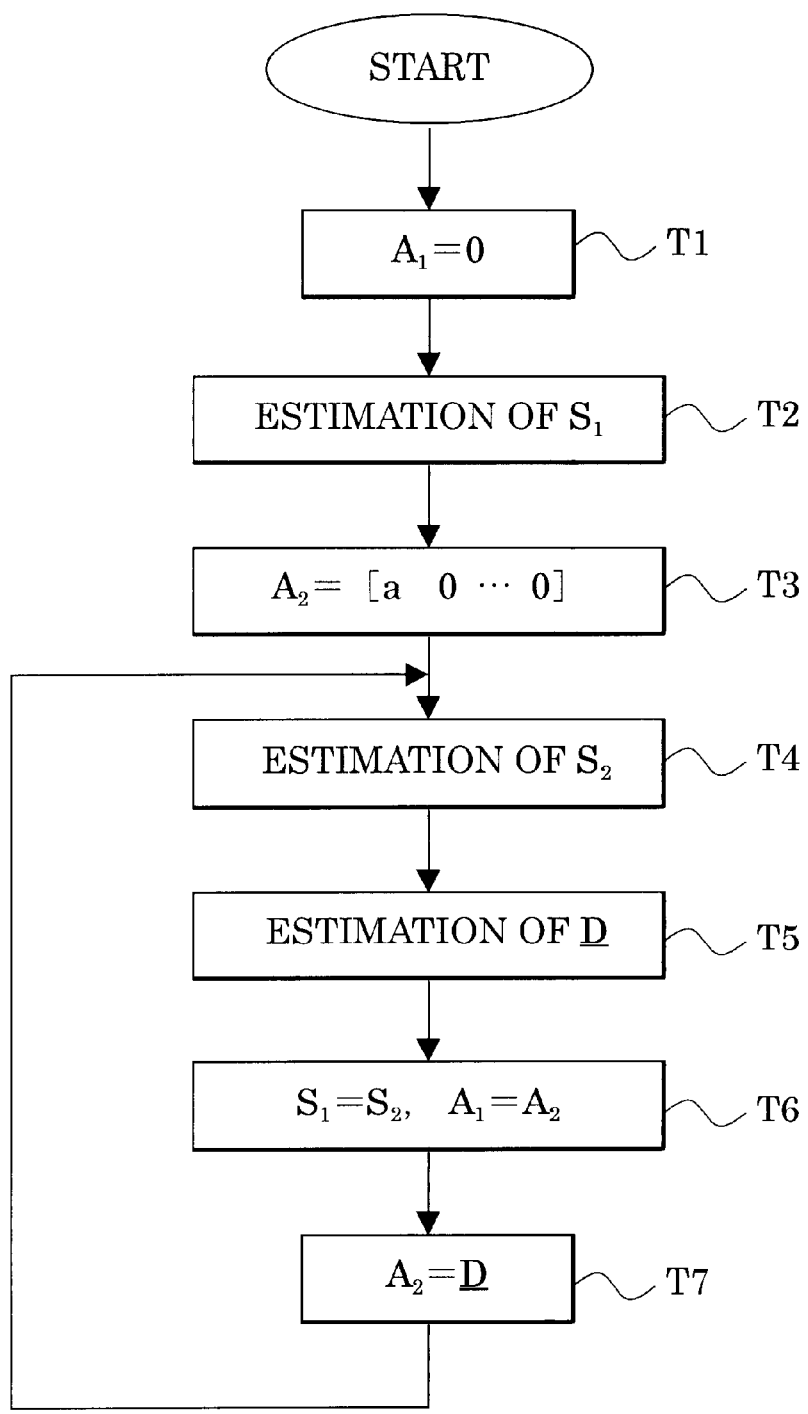
FIG. 9 is a flow chart showing an operation procedure of an embodiment of an active noise control apparatus according to the present invention [1]

FIG. 9 is a flow chart of a simulation process in the above-mentioned computer 300 for confirming the effectiveness of the active noise control apparatus according to the present invention whose principle is shown in FIG. 1. The operation of the embodiment of the present invention shown in FIG. 8 will be described by referring to this flow chart and the arrangements of FIGS. 1–3.

Figure 10:
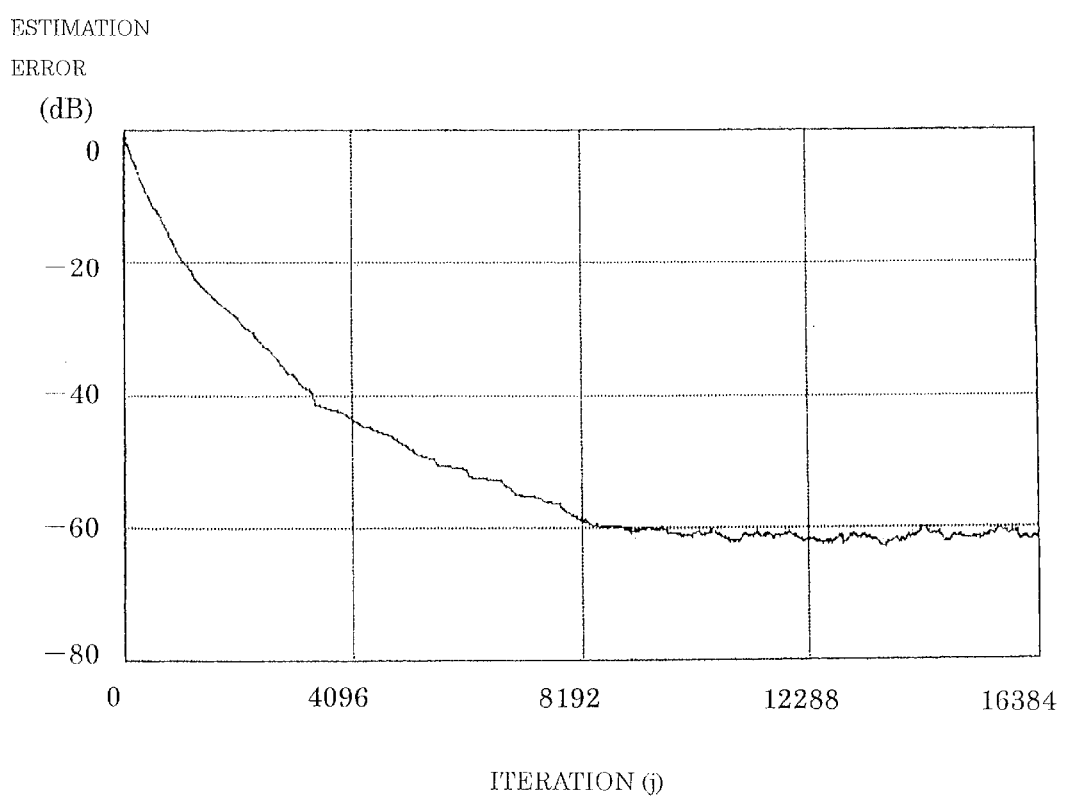
FIG. 10 is a graph showing a convergence characteristic of a noise control filter coefficient in an active noise control apparatus according to the present invention [1]

FIG. 10 is a graph showing a simulation result for confirming the effectiveness of the active noise control apparatus according to the present invention on a relationship between a coefficient updating frequency and an estimation error.

For the first and the second coefficient $A_1$ and $A_2$ to be provided to the noise control filter, the following equations:

$$w_1=[w_1(1)w_1(2) \ldots w_1(I)] \qquad \text{Eq.}(66)$$

$$w_2=[w_2(1)w_2(2) \ldots w_2(I)] \qquad \text{Eq.}(67)$$

consisting of 2I sampled values of the white noise whose average amplitude assumes e.g. $\frac{1}{10}$ of an impulse response D, are added to the impulse response D of the duct 200 to obtain $A_1$ and $A_2$ as follows:

$$A_1 32\ [D(1)+w_1(1)D(2)+w_1(2) \ldots D(I)+w_1(I)] \qquad \text{Eq.}(68)$$

$$A_2 32\ [D(1)+w_2(1)D(2)+w_2(2) \ldots D(I)+w_2(I)] \qquad \text{Eq.}(69)$$

It is adapted that the power ratio of the noise $G_j$ and a turbulence from the outside of the duct 200 is 40 dB, an NLMS algorithm is used for the coefficient updating algorithm of the overall system filter 260 where the step gain is made 0.01, and the coefficient updating frequency of the overall system filter 260 is stopped by 2500 times. Also, the length of the impulse response D of the error path 190 and the duct 200 is made 128.

From the simulation result of FIG. 10, it is confirmed that the impulse response D of the duct 200 is calculated as the coefficient of the estimating noise transfer system filter 147 according to this embodiment.

On the other hand, upon the initial activation of this active noise control apparatus, the coefficient of the noise control filter 220 has not been estimated yet. Accordingly, it can be arbitrarily set. The easiest setting method is that $A_1=0$ is provided for the coefficient of the first noise control filter 144 within the noise control filter 220 (at step T1 of FIG. 9). With the coefficient $A_1$, the coefficient $S_1$ of the first overall system filter 141 can be estimated from the arrangement of FIG. 3 (at step T2).

Also, for the coefficient of the second noise control filter 142, a constant "a" is provided only to a single proper tap. For instance, it is supposed (at step T3) that:

$$A_2=[a0 \ldots 0] \qquad \text{Eq.}(70)$$

Figure 3:
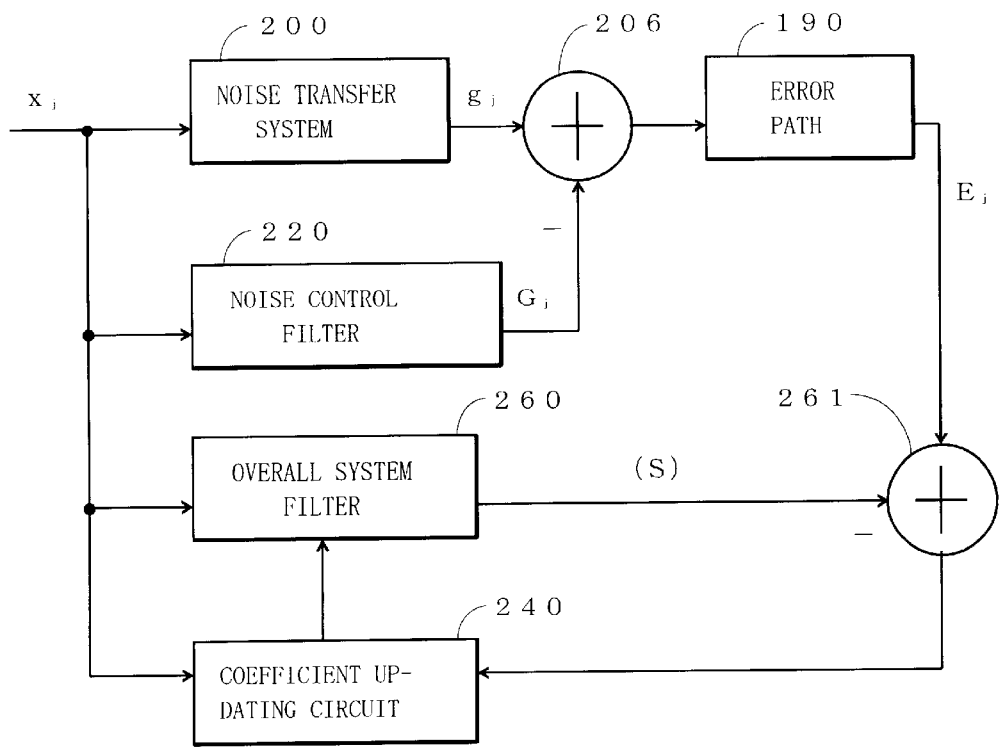
FIG. 3 is a block diagram showing a prior art example in which a white noise generation circuit calculating an error path filter coefficient is not used during an active noise control in a general active noise control apparatus.
Figure 4:
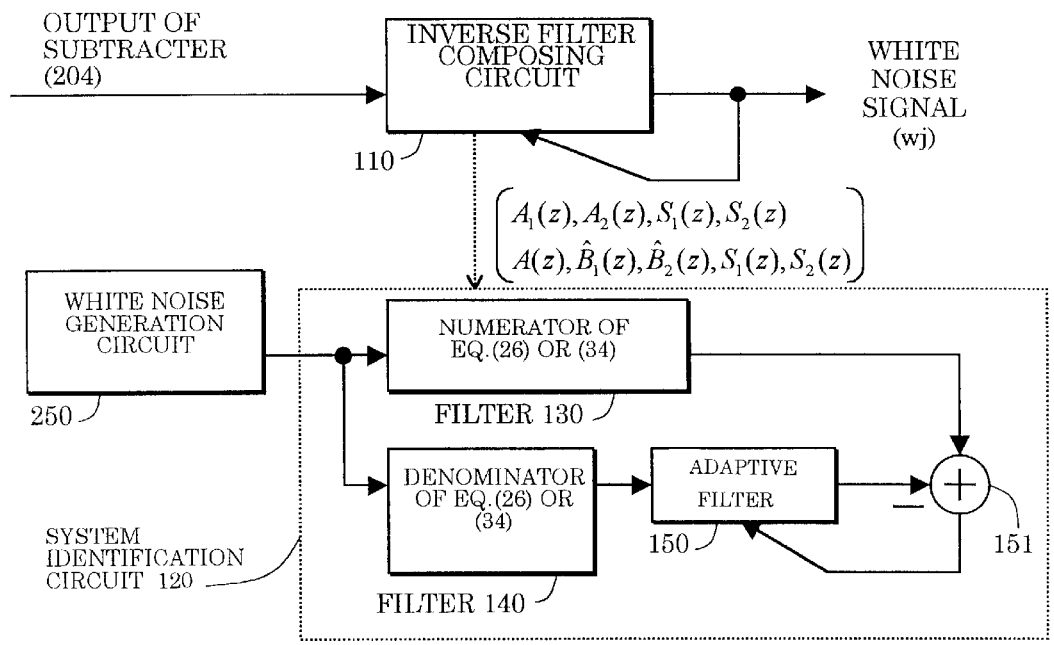
FIG. 4 is a block diagram showing a schematic arrangement of an active noise control apparatus of a feedforward type according to the present invention [2]

With this coefficient $A_2$, the coefficient $S_2$ of the second overall system filter 142 can be estimated from the arrangement of FIG. 3 (at step T4).

As a result, since the above-mentioned Eq.(13) simply assumes $$D=S_1 a/(S_1-S_2) \qquad \text{Eq.}(71)$$

Therefore, the coefficient of the estimating noise transfer system filter 147 is to provide the impulse response D of the duct 200 (at step T5), if the calculation is similarly performed by applying $A_1=0$ and the present (latest) coefficient $A_2$ of Eq.(70) to the principle of the present invention shown in FIG. 1.

Figure 11:
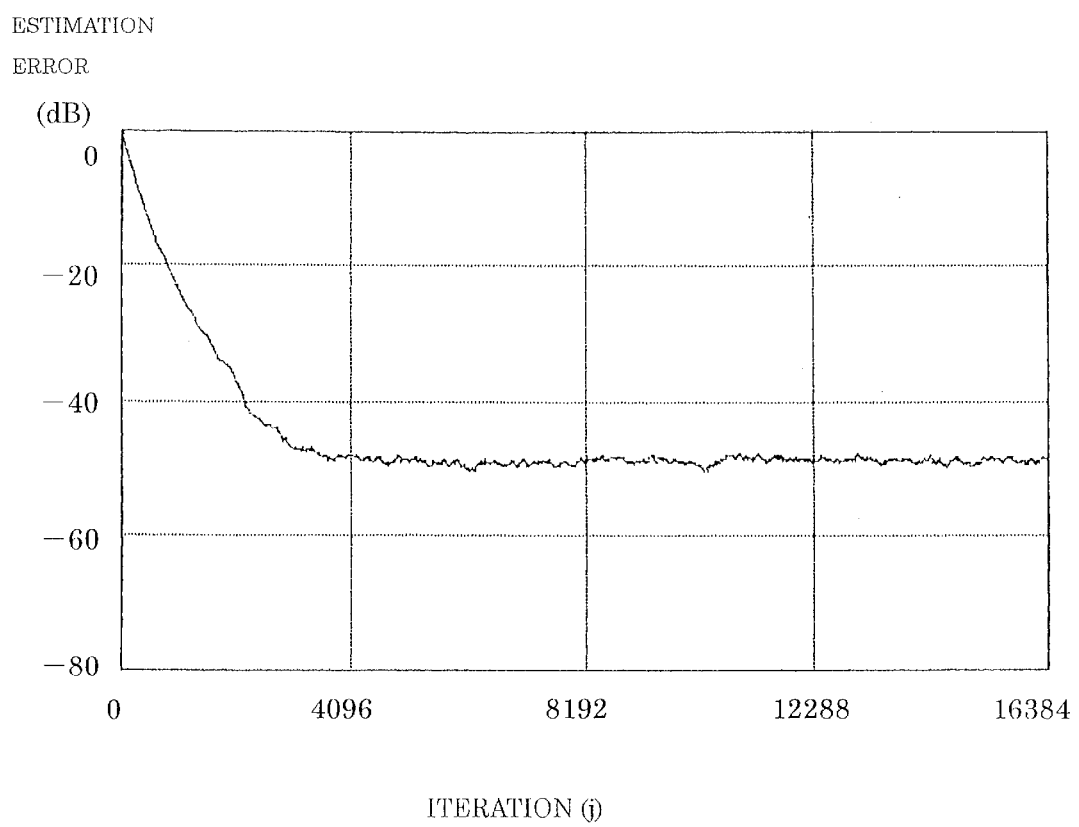
FIG. 11 is a graph of a coefficient estimate of a noise control filter coefficient upon an activation in an active noise control apparatus according to the present invention [1]

FIG. 11 is a graph showing the result of the simulation for confirming that the impulse response of the duct 200 is calculated for the coefficient of the estimating noise transfer system filter 147 by the coefficient setting as mentioned above, on the relationship between the coefficient updating frequency and the estimation error in the same way as FIG. 10. However, in this case, compared with the condition provided to FIG. 10, they are different in that the step gain of the NLMS algorithm of performing the coefficient update of the overall system filter 260 is changed into 0.1.

Also, for the first element of the coefficient $A_2$ of Eq.(70), "a=1" is set. That an arbitrary coefficient can be set for the coefficient of the noise control filter 220 in this way leads to that the noise of the active noise control apparatus can be suppressed small from the beginning of the activation if the apparatus is arranged such that the coefficients $A_1$ and $A_2$ of the first and the second noise control filter 144 and 142 forming the noise control filter 220 whose noise is preliminarily estimated and reduced are preliminarily stored in a memory (not shown) within the computer 300, they are read upon the activation to be applied to the embodiment, and the impulse response of the duct 200 is calculated.

The update method after calculating the coefficients $A_1$ and $A_2$ of the noise control filter 220 as mentioned above and activating the noise control will be described.

The coefficient estimation error of the noise control filter 220 calculated according to the principle of the present invention corresponds to the estimation error after the convergence of the coefficients $S_1$ and $S_2$ of the first and the second overall system filter 141 and 143 forming the overall system filter 260. It is known that this estimation error is approximated to a white noise $w_1$ as given by the following equation:

$$A_1=[D(1)+w_1(1)D(2)+w_1(2) \ldots D(I)+w_1(1)] \qquad \text{Eq.}(72)$$

"I" number of sampled values, obtained from the white noise generation circuit 250, $$w=[w(1)w(2) \ldots w(I)] \qquad \text{Eq.}(73)$$

are added to the present coefficient $A_1$ of the noise control filter 220 to obtain the following equation:

$$A_2=[A_1(1)+w(1)A_1(2)+w(2) \ldots A_1(I)+w(I)] \qquad \text{Eq.}(74)$$

If the above Eq.(72) is substituted for Eq.(74), the following equation can be obtained:

$$A_2=[D(1)+w_1(1)+w(1)D(2)+w_1(2)+w(2) \ldots D(I)+w_1(I)+w(I)]\text{Eq.}(75)$$

Obviously, this coefficient $A_2$ corresponds to the case where the following equation is assumed:

$$w_2=[w_1(1)+w(1)w_1(2)+w(2)w_1(I)+w(I)] \qquad \text{Eq.}(76)$$

Also at this time, the coefficient of the noise control filter 220 can be calculated by the circuit of FIG. 1.

In this case, the coefficient estimation error of the noise control filter 220 calculated according to the principle of the present invention corresponds to the estimation error after the convergence of the coefficient of the overall system filter 260. Since it is approximated to the white noise as mentioned above, the operation of adding "I" number of sampled values obtained from the white noise generation circuit 250 to the present coefficient $A_1$ is equal to the decrease of the noise canceling quantity.

This is the different point from the prior art active noise control apparatus in which the white noise is overlapped and a different kinds of noise is transmitted from the duct 200. The different kind of noise is easy to be detected even if it is small.

Nevertheless, the operation of decreasing the noise canceling quantity is not preferable, and it is naturally preferable that the reduction quantity is little. In addition, it is imagined that actually the characteristic of each acoustic system continuously changes.

Accordingly, the coefficient of the noise control filter 220 is required to be repeatedly updated. At this time, there are two coefficients obtained as the result of the last and the present coefficient update. The estimation errors are included in the two coefficients. The estimation errors are regarded as the coefficients $A_1$ and $A_2$ having the following errors for the impulse response of the present accurate duct 200:

$$A_1 = [D(1)+w_1(1)D(2)+w_1(2) \ldots D(I)+w_1(I)] \quad \text{Eq.(77)}$$

$$A_2 = [D(1)+w_2(1)D(2)+w_2(2) \ldots D(I)+w_2(I)] \quad \text{Eq.(78)}$$

With these equations, the coefficient of the estimating noise transfer system filter 147 is to be obtained according to the principle of the present invention.

Figure 12:
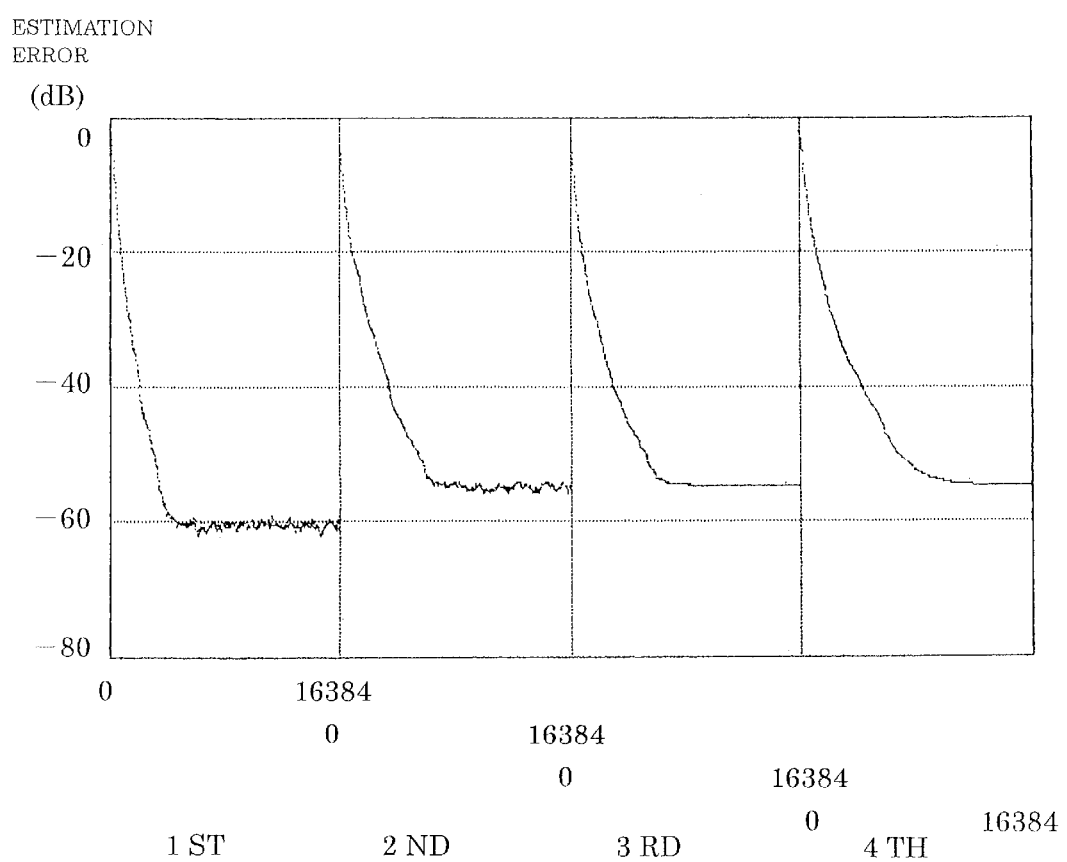
FIG. 12 is a graph for explaining a repeated operation of a coefficient calculation of a noise control filter coefficient in an active noise control apparatus according to the present invention [1]

In FIG. 12, the coefficient of the noise control filter calculated by assuming $A_1=0$ and $a=1$ for the first element of the coefficient $A_2$ provided to Eq.(70) upon the activation is used again, the last $A_2$ is used for $A_1$, (i.e. $A_1=A_2$, and $A_2$ is replaced with the coefficient calculated presently (this time). The coefficient of the estimating noise transfer system filter 147 when such an operation is repeated has a convergence characteristic. This is similarly performed to the coefficients $S_1$ and $S_2$ of the overall system filter (at step T6).

Then, the obtained impulse response D is made the latest coefficient $A_2$ (at step T7), at which above-mentioned steps T4–T7, at which the coefficient $S_2$ is obtained and the impulse response D is further estimated, are repeated.

From FIG. 12, it is seen that the impulse response of the duct 200 is accurately estimated according to the principle of the present invention [1] except that a convergence value of the coefficient estimation error of the noise control filter 220 becomes large at the second time and the following.

Also, according to Eq.(9), the output of the overall system filter 260 whose coefficient is converged is not canceled by the secondary noise synthesized by the noise control filter 220 but is approximated to the noise left. Namely, the ratio of the output of the noise control filter 220 and the output of the overall system filter 260 corresponds to the canceled quantity of the noise achieved by this apparatus.

On the other hand, when the fixed-point arithmetic by which the actual active noise control apparatus can be inexpensively manufactured is adopted, there is a limit in the canceled quantity of the noise which can be realized under the restriction of a dynamic range.

Therefore, it is an actual measure that the canceled quantity to be achieved is predetermined, the operation of updating the coefficient of the noise control filter 220 is stopped when the above-mentioned ratio achieves the canceled quantity, and the coefficient is updated only when the canceled quantity becomes equal to or less than a threshold value.

Of course, since the output of the overall system filter 260 indicates the magnitude of the noise which has been left uncanceled, it becomes possible to control the stop/start of the coefficient update even by referring not to the above-mentioned ratio but only to the output of the overall system filter 260.

Thus, the active noise control apparatus according to the present invention [1] is arranged such that an overall system filter which simulates a characteristic of an overall system leading to an error detecting microphone from a noise detecting microphone is provided as a first and a second overall system filter, and a second and a first noise control filter forming a noise control filter are connected to the first and the second overall system filter in cascade, and the coefficient of the estimating noise transfer system filter is made coefficients of the noise control filters when a difference between the differential output between both when the white noise is applied to the circuit of the cascade combination, and a difference between the response of the first and the second overall system filter from the differential overall system filter becomes a minimum. Therefore, the coefficient of the noise control filter can be updated without transmitting the white noise from the loud speaker during the active noise control and without calculating the coefficient of the error path filter.

The present invention [2] will be specifically described by referring to an example where a feedback control filter and a noise control filter are composed of a non-recursive filter which is often used for an active noise control apparatus. In addition, the inverse filter composing circuit 110 is composed such that the coefficient of the non-recursive filter 111 for inputting the colored signal as shown in FIG. 13 is updated at the coefficient updating circuit 112 to obtain a white signal from the subtracter 113.

Figure 13:
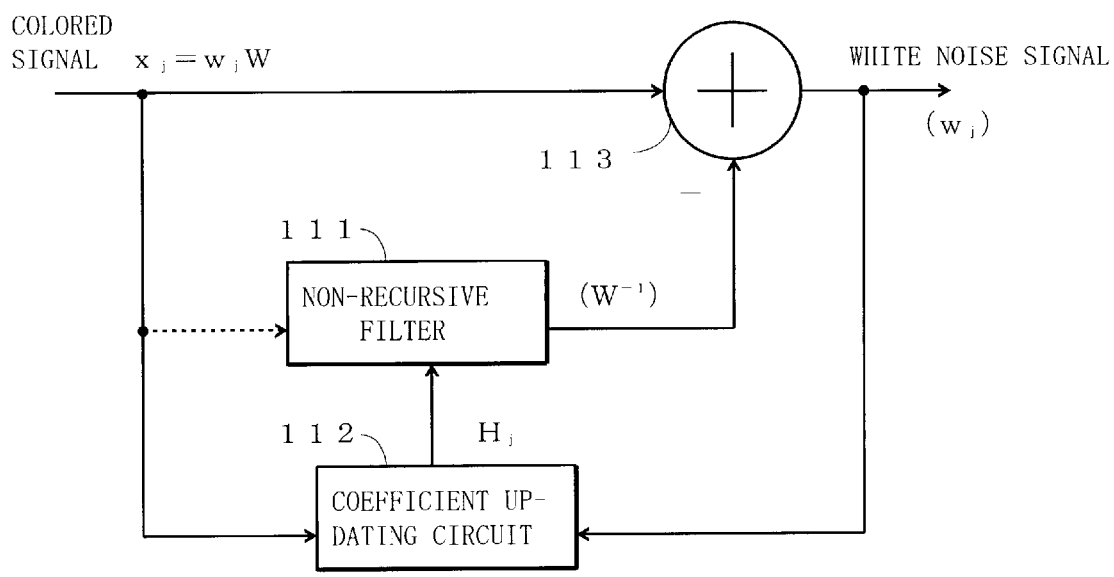
FIG. 13 is a block diagram showing an embodiment of a whitening circuit for a colored signal by a linear prediction method used for an active noise control apparatus according to the present invention [2]

In this case, the transfer function of the non-recursive filter 111 in FIG. 13 assumes $$S(z) = 1 - X^{-1}(z) \quad \text{Eq.(79)}$$

upon the convergence of the coefficient, and $$S(z) = P(z) + D(z)A(z) - P(z)D(z)A(z) \quad \text{Eq.(80)}$$

can be obtained.

Accordingly, the embodiment will be described by using the following equation in which Eqs.(26) and (34) are applied to Eq.(80):

$$D(z) = \frac{S_1(z) - S_2(z)}{A_1(z)\{1 - S_2(z)\} - A_2(z)\{1 - S_1(z)\}} \quad \text{Eq.(81)}$$

$$B(z) = \frac{S_1(z) - S_2(z) + A(z)\{\hat{B}_1(z) - \hat{B}_2(z)\} + A(z)\{S_1(z)\hat{B}_2(z) - S_2(z)\hat{B}_1(z)\}}{A(z)\{S_1(z) - S_2(z)\}}$$

This is equal to making the simultaneous equations by adding the transformation of Eq.(79) to the transfer function of the inverse filter formed within the inverse filter composing circuit 110.

Figure 14:
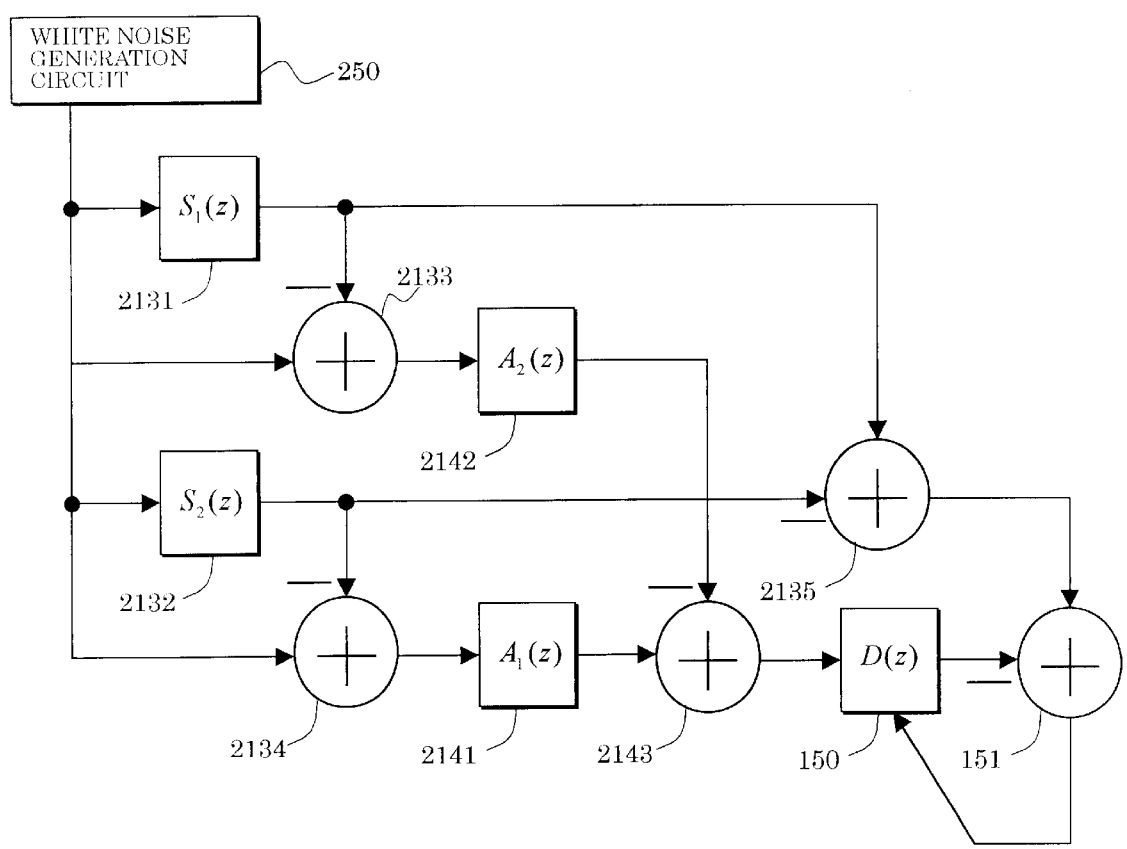
FIG. 14 is a block diagram showing an example of an estimated structure when two coefficients are provided to a noise control filter used for an active noise control apparatus according to the present invention [2]

(2-1) Embodiment in Case of Providing Two Pairs of Fixed Coefficients to Noise Control Filter 220:

If two pairs of coefficients are set in the noise control filter 220 and the transfer functions $A_1(z)$, $A_2(z)$, $S_1(z)$, $S_2(z)$ defined by Eq.(80) obtained at the inverse filter composing circuit 110 are formed by using supplemental filters 2141, 2142, 2131, 2132, and subtracters 2133–2135, 2143, and 151, as well as an adaptive filter 150 as shown in FIG. 14, the subtracter 151 provides the difference between $S_1(z)-S_2(z)$ and $[A_1(z)\{1-S_2(z)\}-A_2(z)\{1-S_1(z)\}]d(z)$ corresponding to Eq.(81).

Accordingly, if the transfer function d(z) of the adaptive filter 150 is composed of the non-recursive filter, and the coefficient $$d=[d(1)d(2)\ldots d(I)]^T \qquad \text{Eq.(83)}$$

is updated by using a method such as an NLMS algorithm in order that the output of the subtracter 151 may become the minimum, the coefficient "d" of the transfer function d(z) of the adaptive filter 150 converges into the impulse response corresponding to the transfer function D(z) when it reaches the minimum.

Assuming the coefficients of the feedback control filter 210 formed by the impulse response of the feedback path and the non-recursive filter are respectively $$B=[B(1)B(2)\ldots B(I)]^T \qquad \text{Eq.(84)}$$

$$\hat{B}=[\hat{B}(1)\hat{B}(2)\ldots \hat{B}(I)]^T \qquad \text{Eq.(85)}$$

the coefficient "d" converges into the following equation:

$$D=[D(1)D(2)\ldots D(I)]^T=[B(1)-\hat{B}(1)B(2)-\hat{B}(2)\ldots B(I)-\hat{B}(I)]^T \qquad \text{Eq.(86)}$$

According to Eq.(86), it is obviously seen that adding the difference D to the coefficient $\hat{B}(z)$ of the feedback control filter 210 provides such an effect that the coefficient $\hat{B}(z)$ is approximated to the impulse response "B" of the feedback path in this embodiment.

Figure 15:
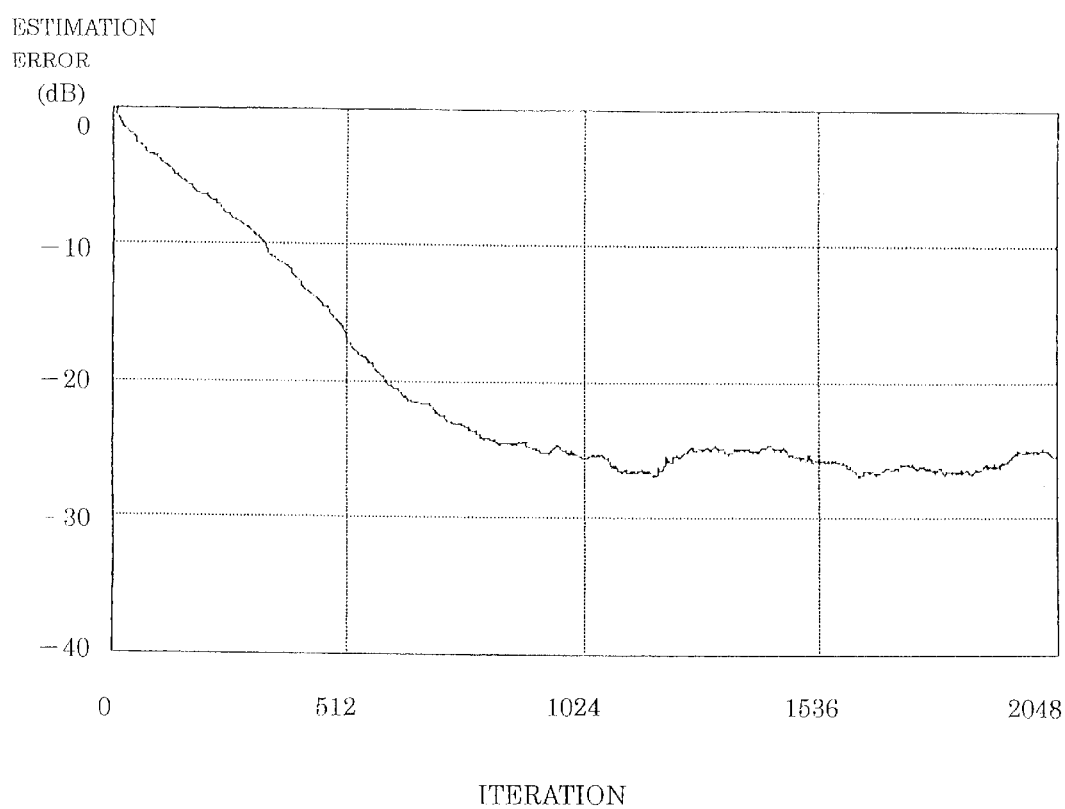
FIG. 15 is a simulation graph showing an estimated characteristic of a feedback control filter coefficient upon powering in an active noise control apparatus according to the present invention [2]

FIG. 15 is the result of the simulation performed for confirming that the present invention effectively operates just after the power activation. The problem just after the power activation is that the coefficients of the feedback control filter 210 and the noise control filter 220 have not been calculated yet.

Since the present invention does not operate when the above-mentioned closed circuit is not formed with the both filters, it is necessary to set the coefficients in the both filters.

However, if the coefficients are set, then the closed circuit is formed, so that at that moment a danger of a howling occurrence is generated. For this reason, the selection of both coefficients is required carefully so as not to generate the howling.

In this example, $$\hat{B}=0 \qquad \text{Eq.(87)}$$

is set in the feedback control filter 210. This coefficient does not increase the gain of the closed circuit more than now.

The coefficient of the noise control filter 220 has been calculated, neither.

However, for the coefficient of the filter 220, "A=0" can not be set. This is because the transmission of the secondary noise from the loud speaker 203 is required for calculating the coefficient of the feedback control filter 210. At the same time, since it is required that the fixed coefficients $A_1$ and $A_2$ of the set noise control filter 220 compose two independent inverse filters for the inverse filter composing circuit 110, the following equation:

$$A_1{}^T A_2=0 \qquad \text{Eq.(88)}$$

is required to be satisfied.

In this embodiment, for the coefficient to satisfy Eq.(88), $$A_1=[a0\ldots 0] \qquad \text{Eq.(89)}$$

$$A_1=[00\ldots a] \qquad \text{Eq.(90)}$$

are selected, so that 0.2 is provided for a constant "a" in the example of FIG. 15.

Also, it is assumed in this example that the tap numbers of the noise control filter 220 and the feedback control filter 210 are both 128, the primary noise is the white noise, the tap number of the non-recursive filter 111 in FIG. 13 for obtaining the transfer functions $S_1(z)$ and $S_2(z)$ is 256, the NLMS algorithm is used in which the step gain is 0.000125 in the algorithm for updating the coefficient, and the coefficient updating frequency is 2,048×128×64=16,777,216.

The abscissa of FIG. 15 denotes the coefficient updating frequency of the adaptive filter 150. The result of the simulation in FIG. 15 shows that as the coefficient update goes on, the estimation error decreases and is made stable in the vicinity of −25 dB, so that the effectiveness of the method according to the present invention by which the coefficient of the noise control filter 220 is provided as Eqs.(89) and (90) is demonstrated.

As mentioned above, the object of the present invention [2] is to update the coefficient of the feedback control filter 210 during the noise control according to the characteristic change of the feedback path. In order to achieve this object, two independent equations are required.

It is available that the coefficient of the noise control filter 220 is not be actually obtained because of zero error.

Namely, the error left after the convergence of the coefficient of the noise control filter 220 is regarded as Gaussian white noise, so that the error (difference) between the fixed coefficients $A_1$ and $A_2$ obtained by stopping the coefficient update with a time interval after the convergence provides mutually independent noises.

The coefficient update of the feedback control filter 210 during the noise control can be performed by using the coefficients $A_1$ and $A_2$ having such an independent error.

Figure 16:
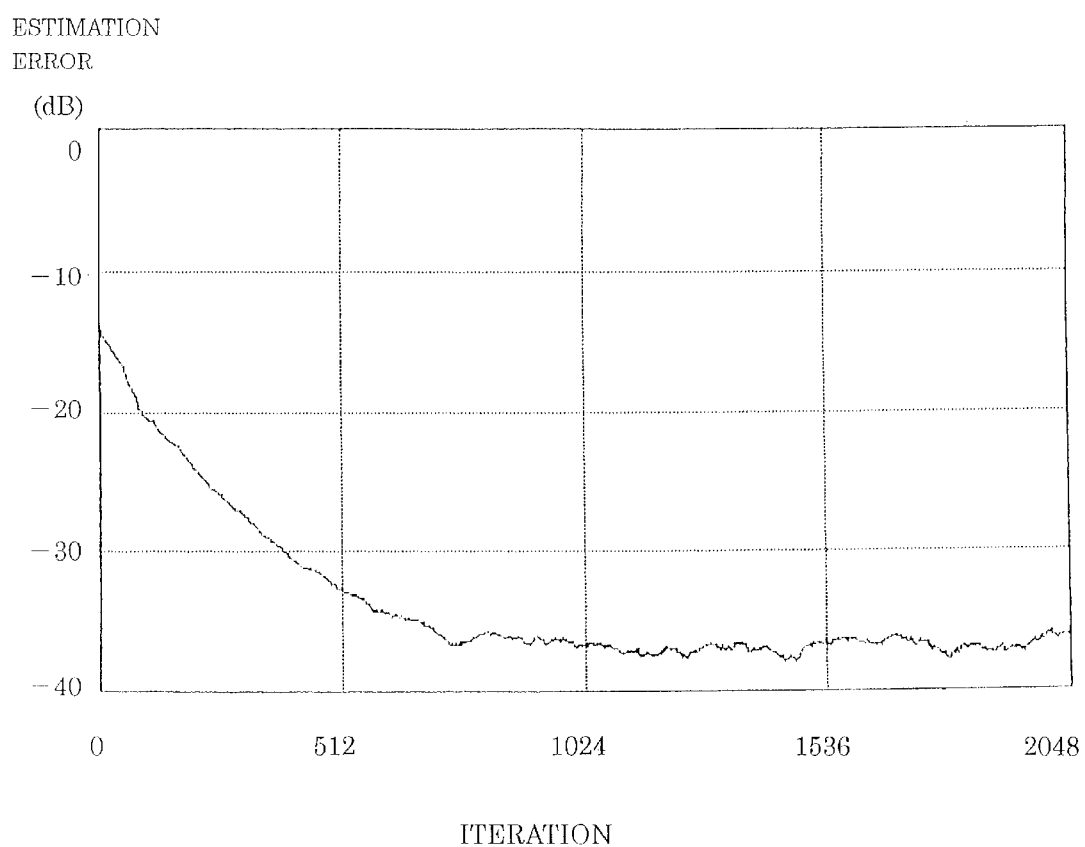
FIG. 16 is a simulation graph showing an example of a convergence characteristic obtained when an initial estimation error is −14 dB and a reducing noise quantity is 20 dB in an active noise control apparatus according to the present invention [2]

FIG. 16 shows the result of the simulation assuming that the coefficient of the feedback control filter 210 is obtained with the initial estimation error being −14 dB for the impulse response of the feedback path by the last coefficient update, and the noise canceling quantity of 20 dB (corresponding to the estimation error −20 dB of coefficient of noise control filter 220) is obtained Namely, two pairs of signal vectors are prepared by the white primary noise whose power ratio to the impulse response of the feedback path is −20 dB, and added to the impulse response of the feedback path to calculate the fixed coefficients $A_1$ and $A_2$.

Also, it is assumed that the coefficient updating frequency of the non-recursive filter 111 in FIG. 13 for obtaining the transfer functions $S_1(z)$ and $S_2(z)$ is 2,048×128×80=20,971, 520, the step gain is 0.000125, and the other conditions are the same as FIG. 15.

From this result, the effectiveness of taking advantage of the independence of the error left in the coefficient of the noise control filter 220 can be confirmed.

This simultaneously indicates that the coefficient of the feedback control filter 210 can be calculated as mentioned above by such an arrangement that the coefficients of the noise control filter 220 and the feedback control filter 210 obtained during the last power activation are preliminarily stored in the memory (not shown), and upon the present power activation the stored coefficients are set in both filters.

Taking advantage of these stored coefficients, the effect of the active noise control can be obtained from the beginning of power activation in such a system where the acoustic system characteristic is relatively stable.

If the feedback control filter 210 thus simulates the feedback path well by the effect of the present invention, a feedback component ratio included in the output of the subtracter 204 used for the composition of the inverse filter decreases, so that the calculation accuracy of the transfer function S(z) deteriorates. The deterioration further deteriorates the calculation accuracy of the coefficient of the feedback control filter 210.

The deterioration can be prevented by lessening the step gain gradually according to the decrease, as performed in the example of FIG. 16 where the feedback component ratio included in the output of the subtracter 204 is small as compared with that of FIG. 15.

However, it is not actually necessary that the calculation accuracy of the coefficient of the feedback control filter 210 is raised infinitely. It is enough that the update of the coefficient is stopped when accuracy more than a fixed one is secured and the update is restarted when the accuracy deteriorates.

The accuracy obtained by the present coefficient update can be anticipated from the gain of the adaptive filter 150 upon the convergence of the coefficient of the adaptive filter 150, as seen from the fact that the transfer function of the adaptive filter 150 provides the difference D(z) between the transfer functions of the feedback path and the feedback control filter 210.

Namely, by monitoring a gain G of the adaptive filter 150 and updating the coefficient of the feedback control filter 210 only when the gain G is equal to or more than a predetermined gain $G_0$, such a disadvantage can be removed that the improvement of the calculation accuracy of the coefficient of the feedback control filter 210 causes the deterioration again.

Figure 17:
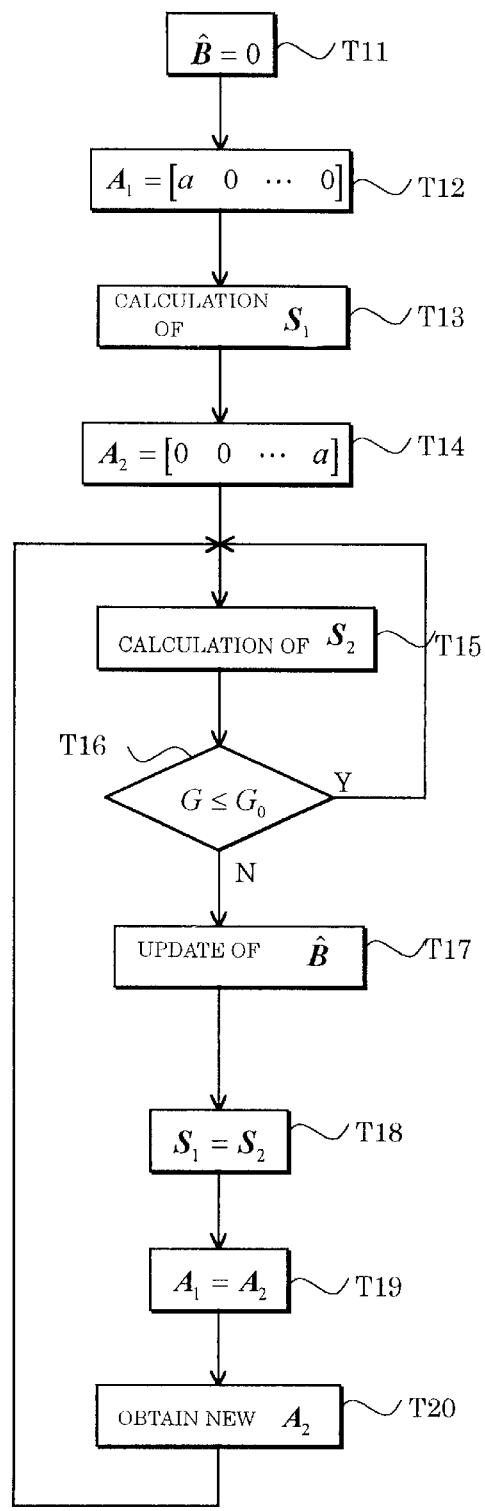
FIG. 17 is a flow chart showing a procedure example of performing a coefficient update of a feedback control filter by setting two pairs of independent coefficients in a noise control filter in an active noise control apparatus according to the present invention [2]

FIG. 17 is a flow chart showing the operation from the power activation when two pairs of fixed coefficients are set in the noise control filter 220 to update the coefficient of the feedback control filter 210.

In this flow chart, for the process upon the power activation, the above-mentioned Eq.(87) is firstly set (at step T11), and the coefficient $A_1$ of the noise control filter 220 is set as Eq.(89) (at step T12). Thus, the coefficient $S_1$ can be calculated. (at step T13).

By setting the coefficient $A_1$ in the noise control filter 220, a part of the coefficients of the non-recursive filter 111 in FIG. 13 is to be set, so that the coefficient updating circuit 112 converges the coefficient update of the filter 220 in order that the outputted white noise signal ($w_j$) may become the minimum. At this time, the coefficient of the filter 111 assumes $S_1$.

Furthermore, by setting the coefficient $A_2$ with Eq.(90) (at step T14), the coefficient $S_2$ is similarly calculated (at step T5).

Then, as mentioned above, the gain G of the adaptive filter 150 is monitored (at step T16) to perform the coefficient update of the feedback control filter 210 only when the gain is equal to or more than the predetermined value $G_0$ (at step T17). Then, the coefficients $S_2$ and $A_2$ obtained are respectively replaced with the coefficients $S_1$ and $A_1$ (at steps T18 and T19), and the new coefficient $A_2$ is set for the second coefficient update (at step T20). The routine then proceeds to step T5 and the following steps.

Namely, in this flow chart, among the two pairs of fixed coefficients $A_1$ and $A_2$ of the noise control filter 220 and the coefficients $S_1$ and $S_2$, of the inverse filter used for the first coefficient update of the feedback control filter 210 after the power activation, the latest coefficients are utilized for the subsequent coefficient update as they are. That the coefficient can be utilized in such a way is obvious from the fact that the error left in the coefficient of the noise control filter 220 is regarded as an independent noise.

Figure 18:
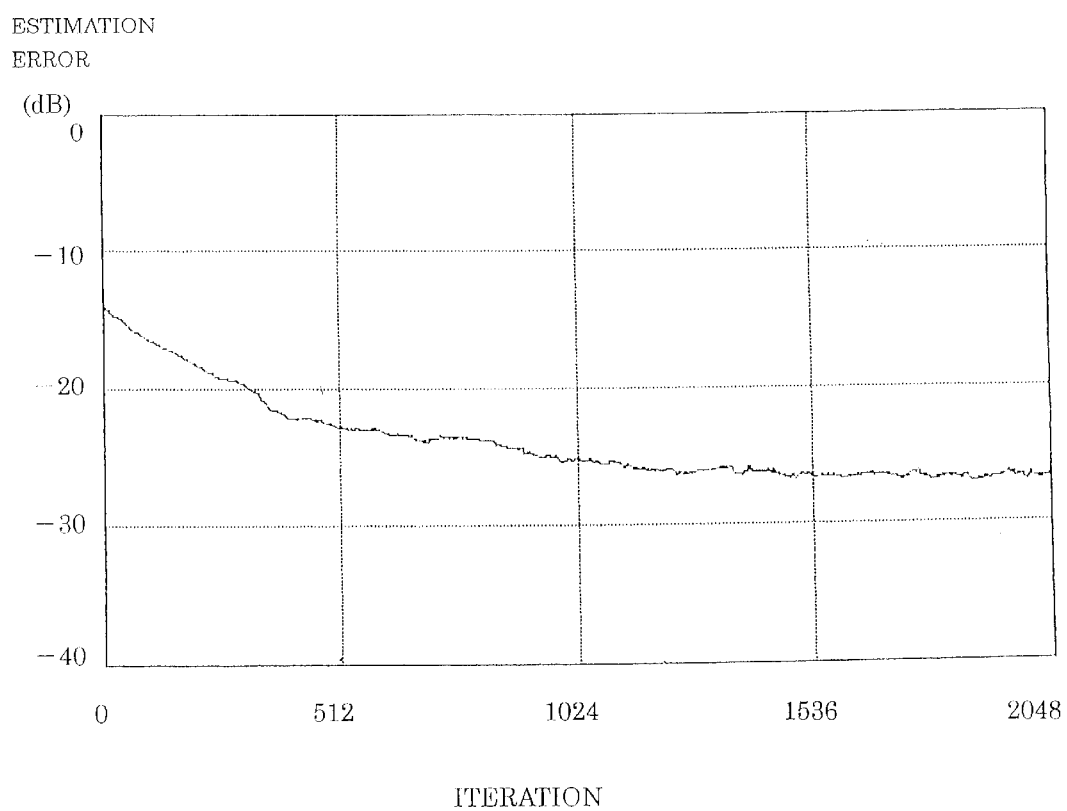
FIG. 18 is a simulation graph showing an estimated characteristic when a primary noise is a colored noise and the number of taps of a non-recursive filter (111)=the number of taps of a feedback control filter+the number of taps of a noise control filter+a generation process degree of a primary noise in an active noise control apparatus according to the present invention [2]

FIG. 18 is the result of the simulation performed by supposing that the primary noise comprises a colored noise. For the colored noise, the output obtained by applying the white noise to the second recursive filter $1/(1-1.4 \cos 0.25\pi z^{-1}+0.49z^{-2}$ is provided.

Moreover, the NLMS algorithm is used in which it is assumed that the number of taps of the non-recursive filter 111 of FIG. 13 which provides the transfer functions $S_1(z)$ and $S_2(z)$ is 258, the step gain is 0.0001, so that the coefficient updating frequency is 2,048×128×200=52,428, 800. The other conditions are the same as the example of FIG. 16. From this result, it is confirmed that the present invention operates effectively when the primary noise comprise a colored noise.

Generally, the degree of the generation process of the primary noise can not be known beforehand. In such a case, there is a possibility that the number of taps of the non-recursive filter 111 in FIG. 13 which provides the transfer functions $S_1(z)$ and $S_2(z)$ comprises larger than is necessary.

Figure 19:
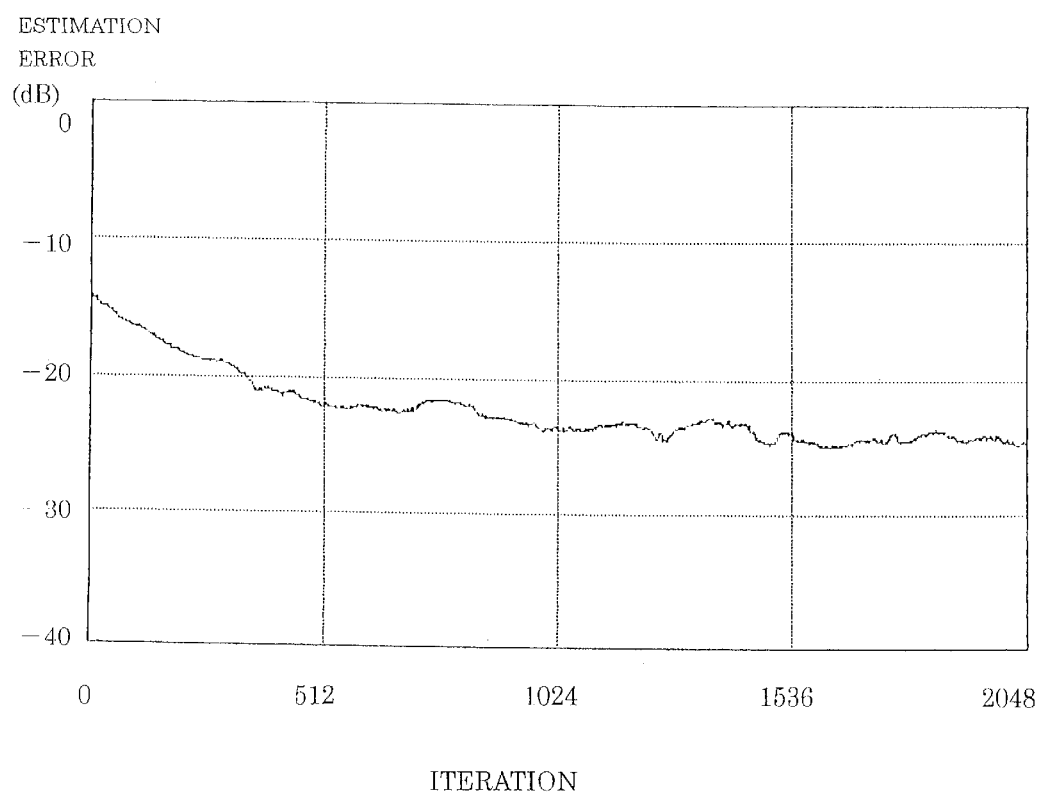
FIG. 19 is a simulation graph showing an estimated characteristic when a primary noise is a colored noise and the number of taps of a non-recursive filter (111) is elongated in an active noise control apparatus according to the present invention [2]

FIG. 19 is a simulation result performed for confirming that the present invention effectively operates in such a case.

It is assumed that the number of taps of the non-recursive filter 111 in FIG. 13 which provides the transfer functions $S_1(z)$ and $S_2(z)$ is 384 large enough, the step gain is 0.0001, the coefficient updating frequency is 2,048×128×200=52, 428,800, and the other conditions are provided in the same way as the conditions of FIG. 18.

Figure 20:
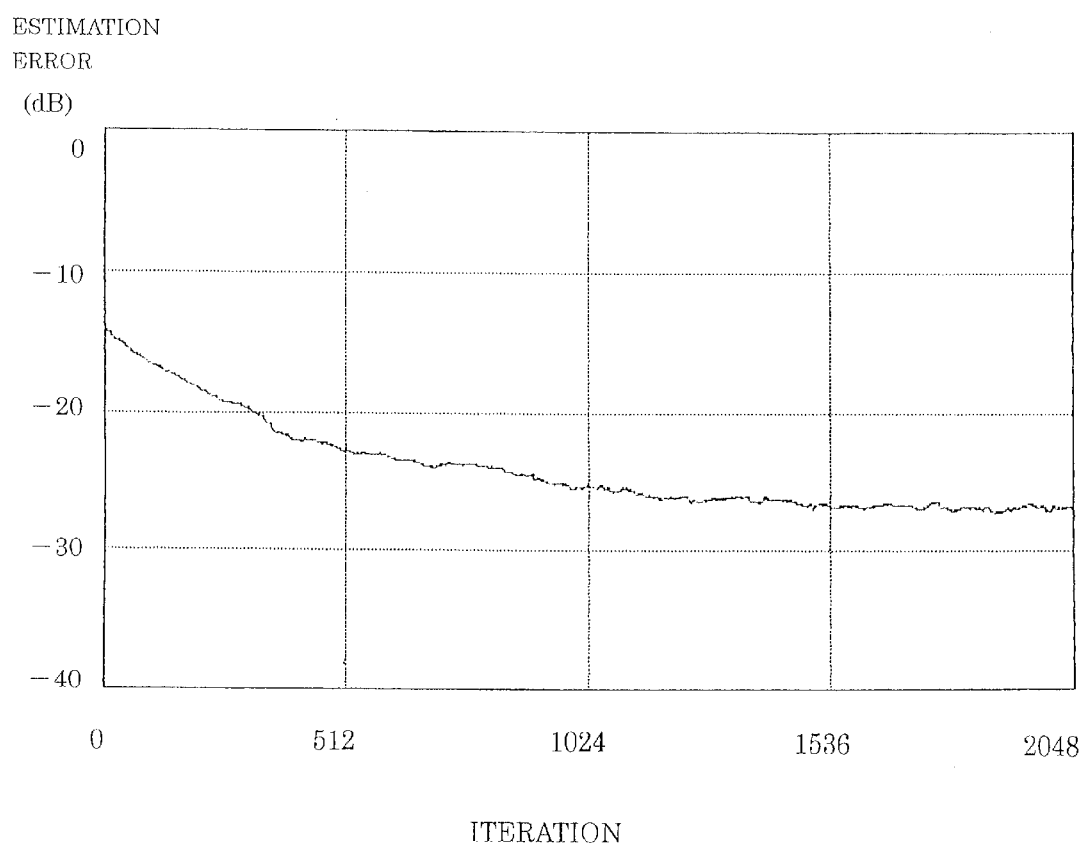
FIG. 20 is a simulation graph showing an estimated characteristic when a primary noise is a colored noise and the number of taps of a non-recursive filter (111)=the number of taps of a feedback control filter+the number of taps of a noise control filter in an active noise control apparatus according to the present invention [2]

On the other hand, FIG. 20 shows a result in the case that the degree of the generation process P(z) of the primary noise is estimated to be "0". It is similarly assumed that the number of taps of the non-recursive filter 111 in FIG. 13 which provides the transfer functions $S_1(z)$ and $S_2(z)$ is 256, the step gain is 0.0001, the coefficient updating frequency is 2,048×128×200=52,428,800, and the other conditions are set in the same way as the conditions of FIG. 18.

The results shown in FIGS. 19 and 20 indicate that even if the degree of the generation process of the primary noise is not accurately estimated, the present invention effectively operates.

Figure 21:
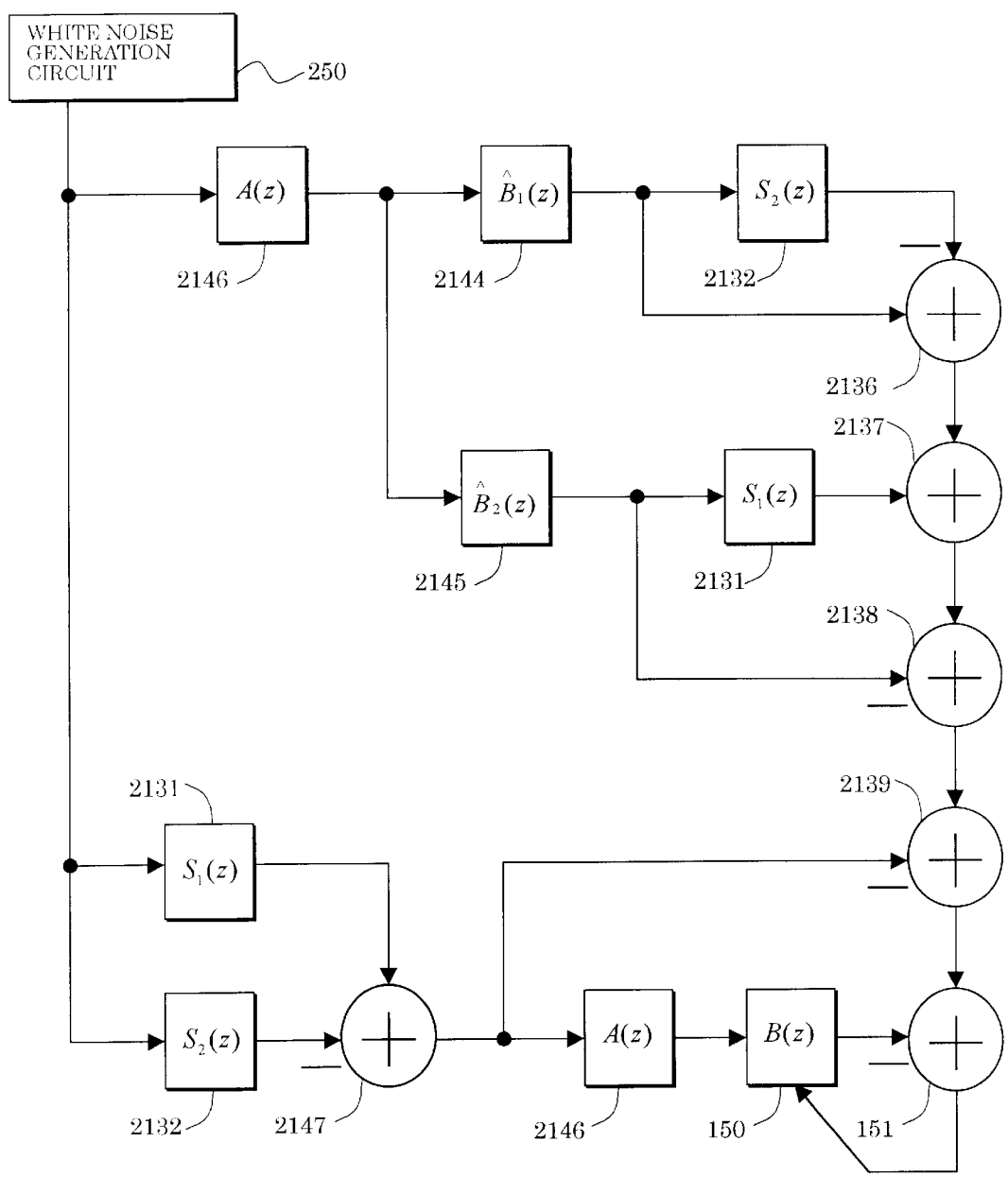
FIG. 21 is a block diagram showing an example of an estimate structure when two coefficients are provided to a feedback control filter in an active noise control apparatus according to the present invention [2]

(2-2) Embodiment in Case of Providing Two Pairs of Fixed Coefficients to Feedback Control Filter 210:

From the transfer function of the inverse filter obtained when two pairs of independent fixed coefficients are provided to the feedback control filter 210, the impulse response of the feedback path can be estimated by developing Eq.(82) into the system identification circuit, by subsidiary filters 2131, 2132, 2144–2147, subtracters 2136–2139, 151, and the adaptive filter 150 as shown in FIG. 21.

In this case, different from the case where two pairs of independent fixed coefficients are provided to the noise control filter 220, the coefficient of the adaptive filter 150 provides the impulse response B of the feedback path upon the convergence. Accordingly, the coefficient update of the feedback control filter 210 is performed by exchanging the coefficients of the adaptive filter 150 and the feedback control filter 210.

Figure 22:
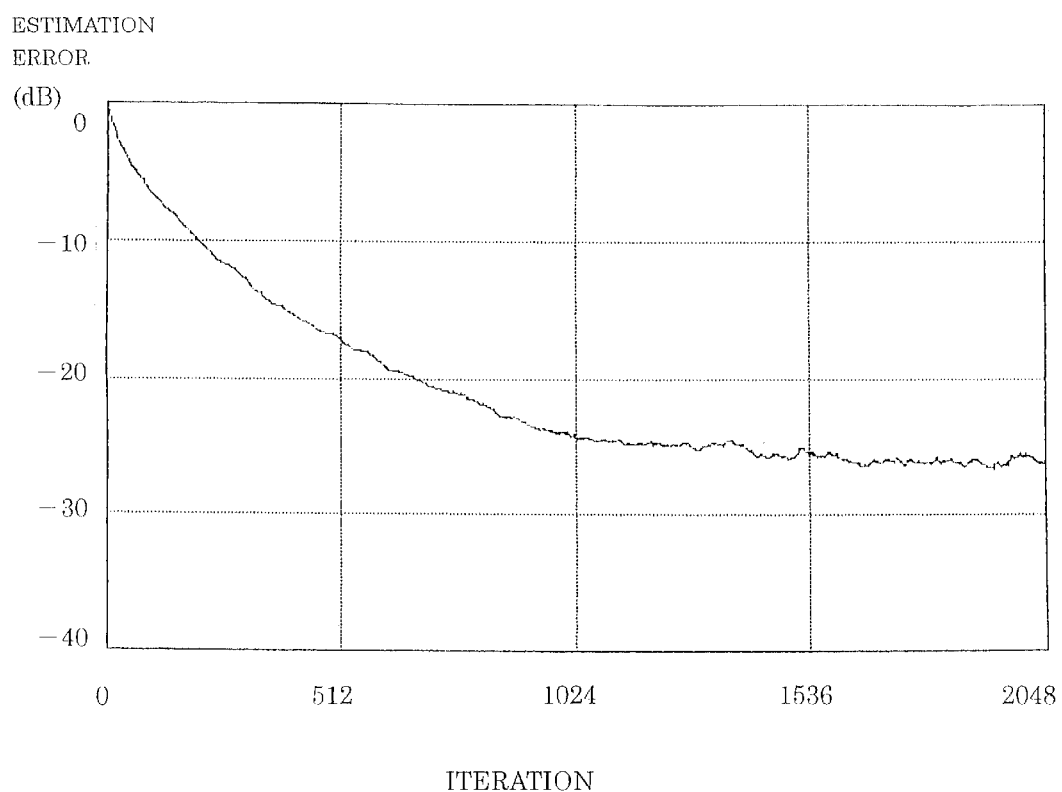
FIG. 22 is a simulation graph showing an estimated characteristic when two pairs of coefficients having an estimation error −14 dB are provided to a feedback control filter in an active noise control apparatus according to the present invention [2]

FIG. 22 shows the result of the simulation which has confirmed the effectiveness of the present invention by providing a single pair of fixed coefficients to the noise control filter 220 and by providing two pairs of independent fixed coefficients to the feedback control filter 210. Two pairs of independent fixed coefficients whose error with the feedback path is −14 dB are provided to the feedback control filter 210.

It is also assumed that the number of taps of the non-recursive filter 111 in FIG. 13 which provides the transfer functions $S_1(z)$ and $S_2(z)$ is 256, the step gain is 0.0001, the coefficient updating frequency is 2,048×128×100=26,214,400, and the other conditions are set in the same way as the conditions of FIG. 18.

From this result, it is confirmed that the impulse response of the feedback path in the present invention is estimated as the coefficient of the adaptive filter.

Figure 23:
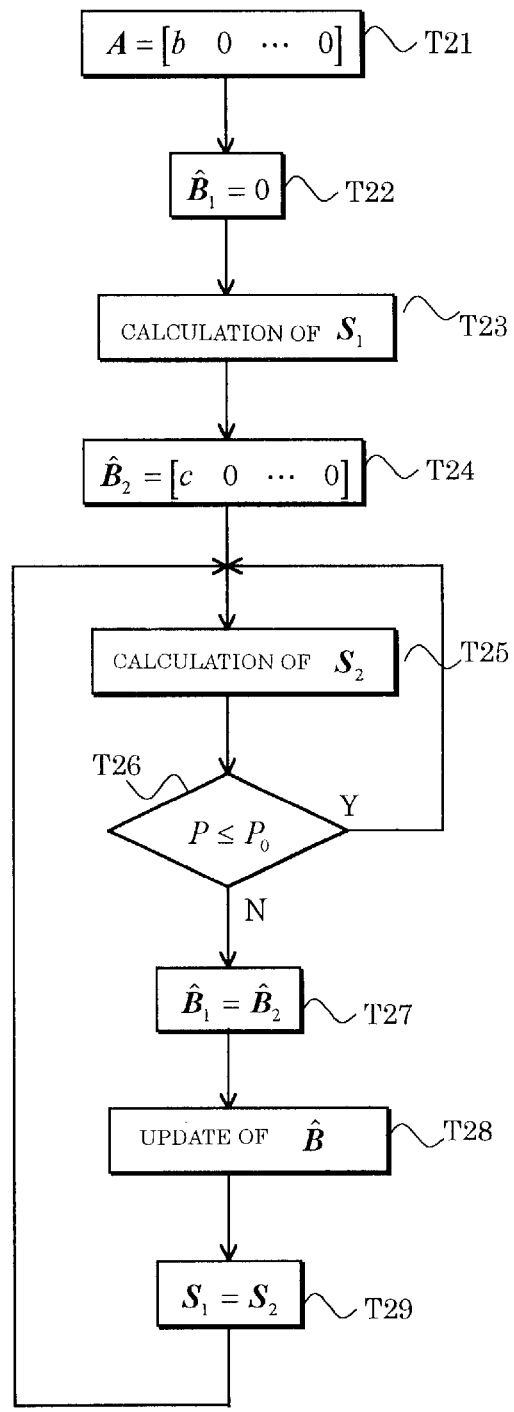
FIG. 23 is a flow chart showing a procedure example for estimating an impulse response of a feedback path by setting two pairs of independent coefficients in a feedback control filter in an active noise control apparatus according to the present invention [2]

FIG. 23 shows a flow chart for setting two pairs of fixed coefficients to the feedback control filter 220, and for calculating the impulse response of the feedback path from two inverse filters formed for each of the coefficients as the coefficients of the adaptive filter.

Firstly, upon the power activation, the coefficients of the feedback control filter 210 and the noise control filter 220 have not been set yet.

Therefore, the coefficient $$\hat{A}=[a0 \ldots 0] \qquad \text{Eq.(91)}$$

is set in the noise control filter 220 (at step T21).

The constant should be determined to the extent that the noise increase by the secondary noise transmitted from the loud speaker 203 may not become extremely large. Also, for two pairs of independent fixed coefficients set in the feedback control filter 210 for satisfying $$\hat{B}_1^T \hat{B}_2 = 0 \qquad \text{Eq.(92)}$$

the following equations are set (at steps T22 and T24):

$$\hat{B}_1 = 0 \qquad \text{Eq.(93)}$$

$$\hat{B}_2 = [b0 \ldots 0] \qquad \text{Eq.(94)}$$

It is necessary that such a small value as does not generate the howling is selected to be set to the constant "c". It is to be noted that the calculation of the coefficients $S_1$ and $S_2$ is the same as the case of FIG. 17 (at steps T23 and T25).

In this flow chart, after the power activation, the two pairs of coefficients of the feedback control filter 210 are obtained, so that when the impulse response of the feedback path is estimated, a single pair of coefficients set upon the last update and the obtained coefficient of the inverse filter are utilized upon the subsequent coefficient update as they are (at steps T27–T29). This is the same method as the above-mentioned method for providing two pairs of coefficients of the noise control filter 220.

Moreover, the output of the non-recursive filter 111 in FIG. 13 is composed of the correlation component forming the controlled noise and the recursive component included in the output of the subtracter 204, in which the time when the output P becomes equal to or less than a fixed value is the time when the recursive component becomes equal to or less than a fixed value (at step T26). It means that the gain of the closed circuit becomes equal to or less than a fixed value $P_0$, so that the necessity of updating the coefficient of the feedback control filter 210 is lessened. Therefore, the flow chart of FIG. 23 is formed so that steps T26→T25 are repeated, and the update is interrupted.

As described above, according to an active noise control apparatus according to the present invention [2] is arranged such that an inverse filter composing circuit forms a filter having a characteristic including a transfer function opposite to a closed circuit starting from the noise control filter and returning to the noise control filter again through both of the feedback path and the feedback control filter, the transfer function expressing a generation process of the primary noise, and a system identification circuit provides two pairs of different fixed coefficients either to the feedback control filter or the noise control filter to update a coefficient of an adaptive filter in order that a difference becomes a minimum between a numerator of a solution obtained by eliminating a transfer function component expressing the generation process of the primary noise, from simultaneous equations based on two transfer functions of an inverse filter formed within the inverse filter composing circuit for the two pairs of coefficients and an output of the adaptive filter connected to a denominator of the solution, and a coefficient of the feedback control filter is updated by using the coefficient of the adaptive filter obtained by operating the system identification circuit. Therefore, the coefficient of the feedback control filter can be updated without outputting the white noise from the loud speaker during the active noise control.

The embodiment of an active noise control apparatus of a feedback type according to the present invention [3] will now be described.

Firstly, the above-mentioned transfer function $\hat{A}(z)$ should be actually obtained for the coefficient of the filter. The example of calculating the coefficient of the noise control filter 220 with the structure of the all filters being made a non-recursive type will be specifically described. It is now available that the coefficient of the non-recursive filter coincides with the impulse response, and the product of the transfer function corresponds to a convolution operation in the time domain.

Figure 24:
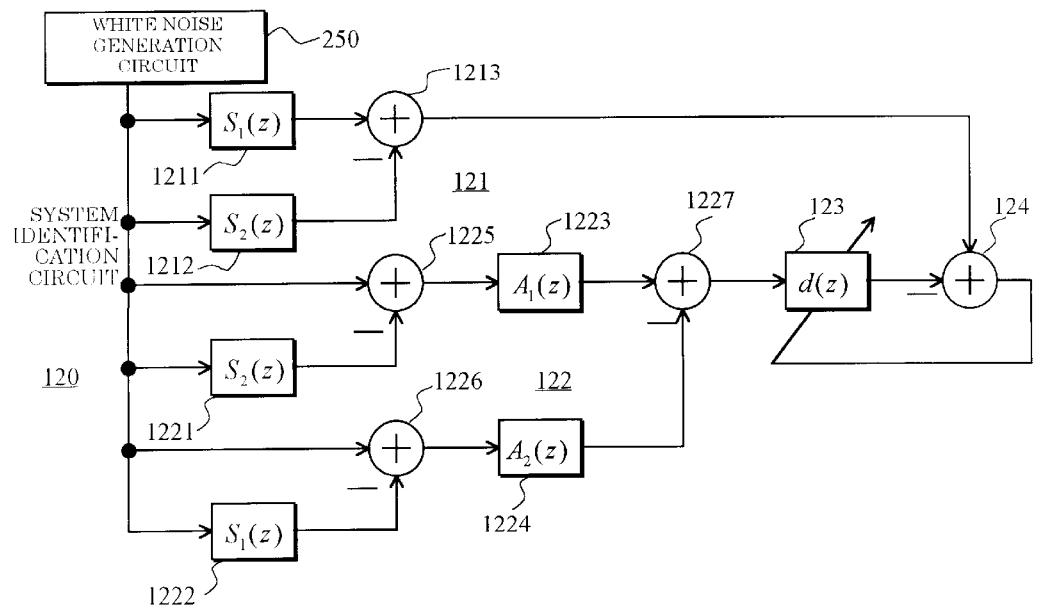
FIG. 24 is a block diagram showing an embodiment of a circuit which identifies a difference between transfer functions of a feedback path and a feedback control filter by providing two pairs of coefficients to a noise control filter used for an active noise control apparatus of a feedback type according to the present invention [3]

(3-1) Embodiment in Case of Providing Two Pairs of Coefficients to Noise Control Filter:

Firstly, the denominator on the right side of Eq.(46) is canceled and $$[A_1(z)\{1-S_2(z)\}-A_2(z)\{1-S_1(z)\}]D(z)=S_1(z)-S_2(z) \qquad \text{Eq.(95)}$$

is obtained. The system identification circuit 120 shown in FIG. 24 is composed by combining the filters whose transfer functions are the known $A_1(z)$, $A_2(z)$, $S_1(z)$, and $S_2(z)$ and the adaptive filter d(z).

Figure 6:
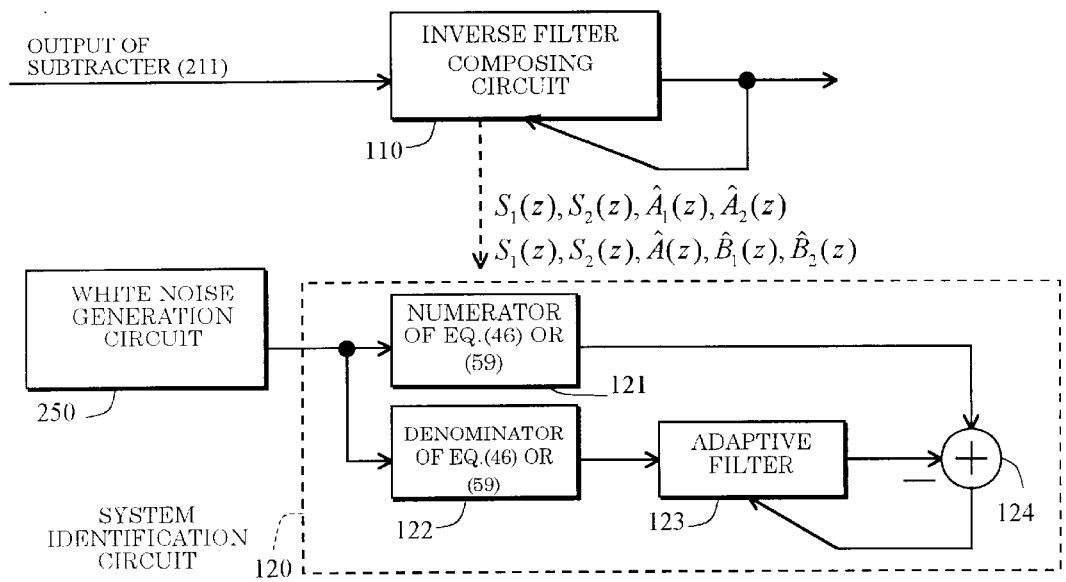
FIG. 6 is a block diagram showing a schematic arrangement of an active noise control apparatus of a feedback type according to the present invention [3]

Namely, the first filter 121 shown in FIG. 6 is composed of filters 1211, 1212 and a subtracter 1213, and the second filter 122 is composed of filters 1221–1224 and subtracters 1225–1227.

If the coefficient d(z) of the adaptive filter 123 is updated in order that the output of the subtracter 1227 $[A_1(z)\{1-S_2(z)\}A_1(z)-A_2(z)\{1-S_1(z)\}]$ and the output of the subtracter 1213 $\{S_1(z)-S_2(z)\}$ may become mutually equal, i.e. the output of the subtracter 124 may become "0" in the system identification circuit 120, the transfer function d(z) of the adaptive filter 123 coincides with the transfer function D(z) when the coefficient d(z) has converged.

Since the adaptive filter 123 is composed of the non-recursive filter in this embodiment, the coefficient $$d=[d(1)d(2) \ldots d(I)]^T \qquad \text{Eq.(96)}$$

provides the difference between the following impulse response of the feedback path $$B=[B(1)B(2) \ldots B(I)]^T \qquad \text{Eq.(97)}$$

and the following coefficient of the feedback control filter 210

$$\hat{B}=[\hat{B}(1)\hat{B}(2)\ldots\hat{B}(I)]^T \quad \text{Eq.(98)}$$

Namely, by adding the coefficient "d" of the adaptive filter 123 to the present coefficient $\hat{B}$ of the feedback control filter 210, $$\tilde{B} = \hat{B} + d \quad \text{Eq.(99)}$$
$$= \begin{bmatrix} \hat{B}(1) & \hat{B}(2) & \cdots & \hat{B}(1) \end{bmatrix}^T +$$
$$\begin{bmatrix} B(1) - \hat{B}(1) & B(2) - \hat{B}(2) & \cdots & B(1) - \hat{B}(1) \end{bmatrix}^T$$
$$= B$$

is obtained, so that the coefficient of the feedback control filter 210 is to obtain the coefficient approximated to the impulse response B of the feedback path.

When the coefficient of the feedback control filter 210 is thus updated, D(z) is approximated to null from Eq.(39), so that the coefficient of the noise control filter 220 which optimally reduces the noise $x_j$ to be controlled can be calculated with Eq.(52).

Eq.(52) is applied to Eq.(49) to be transformed as follows:

$$\hat{B}(z)\{A_1(z)-A_2(z)\}\hat{A}(z)=S_2(z)A_1(z)-S_1(z)A_2(z) \quad \text{Eq.(100)}$$

Figure 25:
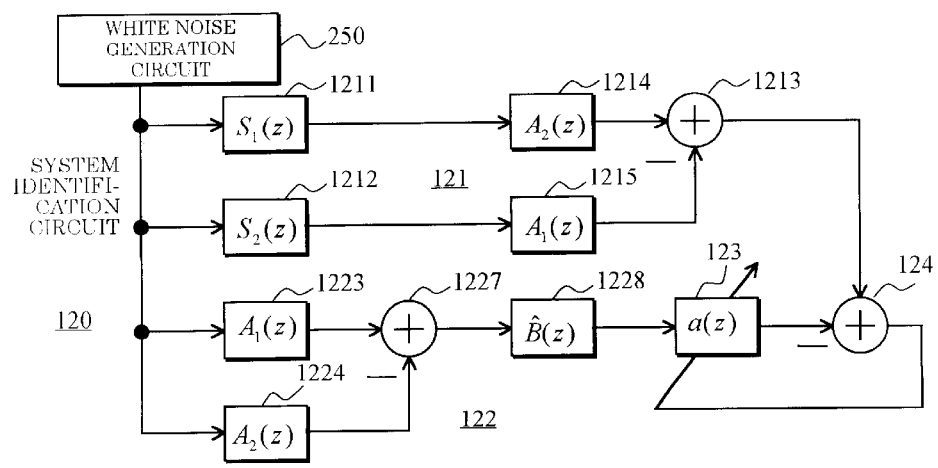
FIG. 25 is a block diagram showing an embodiment of a circuit which identifies a coefficient of a noise control filter which optimally cancels a primary noise by providing two pairs of coefficients to a noise control filter used for an active noise control apparatus of a feedback type according to the present invention [3]

The adaptive filter a(z) is introduced instead of the transfer function $\hat{A}(z)$ to form the system identification circuit 120 shown in FIG. 25.

Namely, in this system identification circuit 120, the filters 1211, 1212, 1214, 1215 and the subtracter 1213 compose the first filter 121, and the filters 1223, 1224, 1228 and the subtracter 1227 compose the second filter 122.

When the coefficient of the adaptive filter a(z) has converged in this composition, the following coefficient $$a=[a(1)a(2)\ldots a(I)]^T \quad \text{Eq.(101)}$$

provides the following coefficient of the noise control filter 220

$$\hat{A}=[\hat{A}(1)\hat{A}(2)\ldots\hat{A}(I)]^T \quad \text{Eq.(102)}$$

which optimally reduces the object noise $x_j$ to be controlled.

Figure 26:
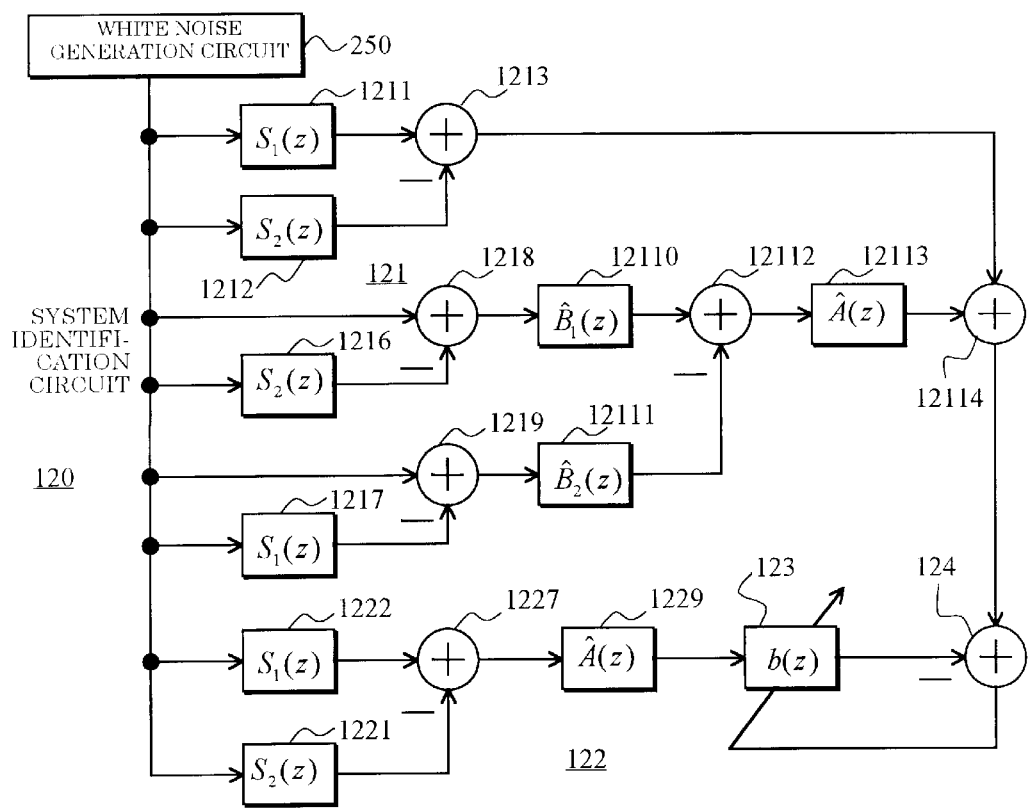
FIG. 26 is a block diagram showing an embodiment of a circuit which identifies a characteristic of a feedback path by providing two pairs of coefficients to a feedback control filter used for an active noise control apparatus of a feedback type according to the present invention [3]

(3-2) Embodiment in Case of Providing Two Pairs of Coefficients to Feedback Control Filter:

In this case, the transfer function of the feedback path can be directly obtained. The denominator on the right side of Eq.(59) is canceled and $$B(z)\hat{A}(z)\{S_1(z)-S_2(z)\}=S_1(z)-S_2(z)+\hat{A}(z)[\hat{B}_1(z)\{1-S_2(z)\}-\hat{B}_2(z)\{1-S_1(z)\}] \quad \text{Eq.(103)}$$

is obtained. Then, an adaptive filter b(z) is introduced to form the system identification circuit of FIG. 26.

Namely, filters 1211, 1212, 1216, 1217, 12110, 12111, 12113, and subtracters 1213, 1218, 1219, 12112, and 12114 compose the first filter 121, and filters 1221, 1222, 1229 and the subtracter 1227 compose the second filter 122.

When the coefficient of the adaptive filter (b(z)) 123 has converged in this composition, the estimated value of the impulse response of the feedback path $$\tilde{B}=[\tilde{B}(1)\tilde{B}(2)\ldots\tilde{B}(I)] \quad \text{Eq.(104)}$$

can be obtained.

Figure 27:
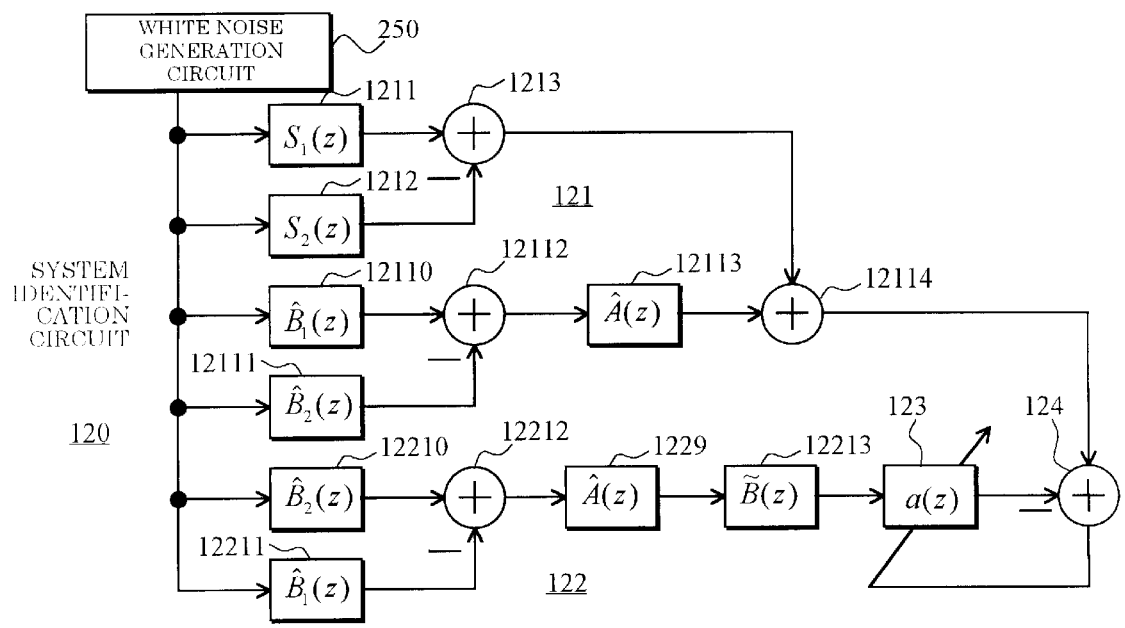
FIG. 27 is a block diagram showing an embodiment of a circuit which identifies a coefficient of a noise control filter which optimally cancels a primary noise by providing two pairs of coefficients to a feedback control filter used for an active noise control apparatus of a feedback type according to the present invention [3]

Accordingly, if the system identification circuit 120 of $$\{\hat{B}_2(z)-\hat{B}_1(z)\}\hat{A}(z)\tilde{B}(z)a(z)=S_1(z)-S_2(z)+\{\hat{B}_1(z)-\hat{B}_2(z)\}\hat{A}(z) \quad \text{Eq.(105)}$$

where Eq.(62) is applied to Eq.(65) to be arranged with Eq.(104), as shown in FIG. 27, is composed of the first filter 121 (composed of filters 1211, 1212, 12110, 12111, 12113 and the subtracters 1213, 12112, 12114) and the second filter 122 (composed of filters 12210, 12211, 1229, 12213 and a subtracter 12212), the coefficient of the noise control filter 220 which optimally cancels the noise $x_j$ to be controlled assumes the coefficient $$\tilde{A}=[\tilde{A}(1)\tilde{A}(2)\ldots\tilde{A}(I)]^T \quad \text{Eq.(106)}$$

which is left after the coefficient of the adaptive filter a(z) has converged.

(3-3) Control Flow From Power Activation:

The control procedure when the present invention is applied to the actual apparatuses will be described.

Firstly, just after the power activation, the coefficients of the feedback control filter 210 and the noise control filter 220 are not calculated yet. The coefficients of the both filters 210 and 220 are calculated only after the synthesized noise is transmitted from the loud speaker 203 and the closed circuit is formed.

However, if the coefficients are set, the closed circuit is formed, so that the danger of the howling occurrence immediately occurs. For this reason, it is necessary to carefully select the coefficients of the both filters 210 and 220 so as not to cause the howling.

Since the desired coefficients of the feedback control filter 210 have not been calculated yet upon the power activation, $$\hat{B}=0 \quad \text{Eq.(107)}$$

is one of the most appropriate coefficients. This coefficient does not increase the gain of the closed circuit more than the present state.

On the other hand, the coefficient of the noise control filter 220 has not been calculated yet. However, "A=0" can not be set for the coefficient of this filter. It is necessary that the secondary noise (white noise) is outputted from the loud speaker 203 for calculating the coefficient of the feedback control filter 210.

Figure 28:
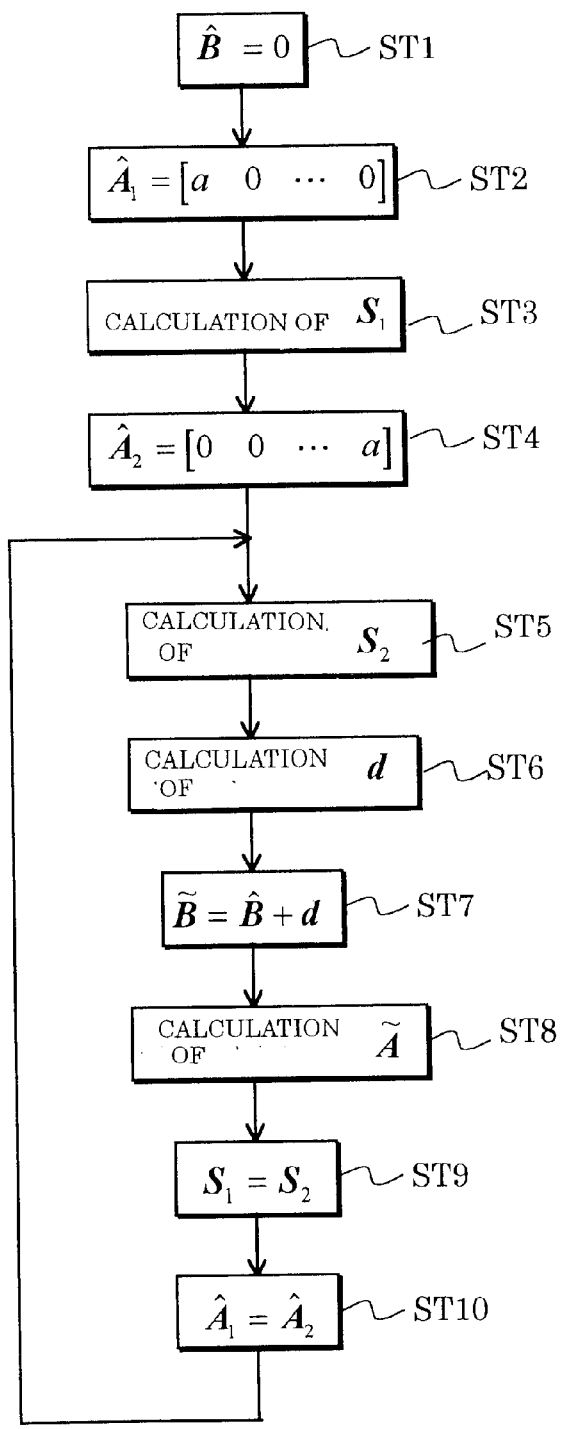
FIG. 28 is a flow chart showing a procedure of performing a coefficient update of a feedback control filter and a noise control filter by setting two pairs of independent coefficients to a noise control filter in an active noise control apparatus of a feedback type according to the present invention [3]

(3-11) Flow in Case of Providing Two Pairs of Coefficients to Noise Control Filter:

FIG. 28 shows a control flow. For a process upon the power activation, since it is necessary that an initial setting given by the above Eq.(107) is performed (at step ST1) and the coefficients $A_1$ and $A_2$ of the noise control filter 220 subsequently set form two independent equations, the relationship of $$A_1^T A_2 = 0 \quad \text{Eq.(108)}$$

is required to be satisfied.

For the coefficients to satisfy Eq.(108), $$A_1=[a0\ldots 0] \quad \text{Eq.(109)}$$
$$A_2=[00\ldots a] \quad \text{Eq.(110)}$$

are selected (at steps ST2 and ST4) to provide, as a constant, such a small value as does not cause the howling.

Figure 7:
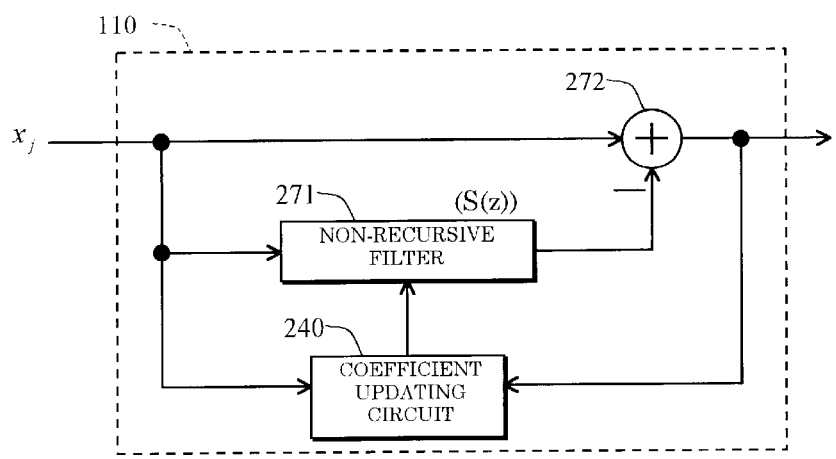
FIG. 7 is a block diagram showing an arrangement of an inverse filter circuit by a linear prediction analysis method used for an active noise control apparatus of a feedback type according to the present invention [3]

The coefficients $S_1$ and $S_2$ of the non-recursive filter 271 (see FIG. 7) corresponding to the two coefficients $A_1$ and $A_2$ are sequentially calculated (at steps ST3 and ST5).

As the simultaneous equations have been obtained, from these $A_1, A_2, S_1$, and $S_2$, the difference D between the impulse response of the feedback path and the coefficient of the feedback control filter 210 is obtained by calculating "d"

(at step ST6) for the coefficient of the adaptive filter 123 in the system identification circuit 120 of FIG. 24. The coefficient is added to the present coefficient $\hat{B}$ of the feedback control filter 210 to provide $$\tilde{B}=\hat{B}+d \qquad \text{Eq.(111)}$$

for updating the coefficient of the feedback path (at step ST7). With this $\tilde{B}$, the coefficient $\hat{A}$ of the noise control filter 220 which is optimal to cancel the primary noise can be similarly calculated by using the system identification circuit 120 of FIG. 25 (at step ST8).

The important point is that $\hat{A}$ calculated at this time actually has an error in relation to an optimum coefficient $A_{opt}$. The error is highly independent, and there is left an independent component between the coefficient $A_2$ previously set and the coefficient $\hat{A}$ newly obtained. If this independent component is utilized, it is possible to update the coefficient of the noise control filter 220 all the time by repeatedly applying the above coefficient update.

Namely, among the two coefficients previously set, if $A_2$ is assumed to be $A_1$, $S_2$ corresponding thereto is replaced with $S_1$ (at steps ST9 and ST10), newly obtained coefficient A is assumed to be $A_2$ to calculate $S_2$, again, and the same calculation is repeated, the coefficients of the noise control filter 220 and the feedback control filter 210 are updated all the time.

This also indicates that the coefficient of the feedback control filter 210 can be calculated by the arrangement that the coefficients of the noise control filter 220 and the feedback control filter 210 obtained during the last activation are preliminarily stored in the memory, and the stored coefficients are set in the both filters 210 and 220 upon the present power activation. If these stored coefficients are utilized, the effect of the active noise control can be obtained from the power activation in the system where the acoustic characteristic is relatively stable.

Thus, if the feedback control filter 210 simulates the feedback path well by the effect of the present invention, the ratio of the feedback component included in the output of the subtracter 211 used for the composition of the inverse filter decreases, and the calculation accuracy of the coefficient S of the non-recursive filter 271 deteriorates.

However, the deterioration only lowers the calculation accuracy 0 dB of the difference D. Even if the difference D can be obtained with the estimated accuracy 0 dB, it only means that the accuracy of the coefficient of the feedback control filter 210 is not improved. Namely, the present invention can be applied repeatedly.

Figure 29:
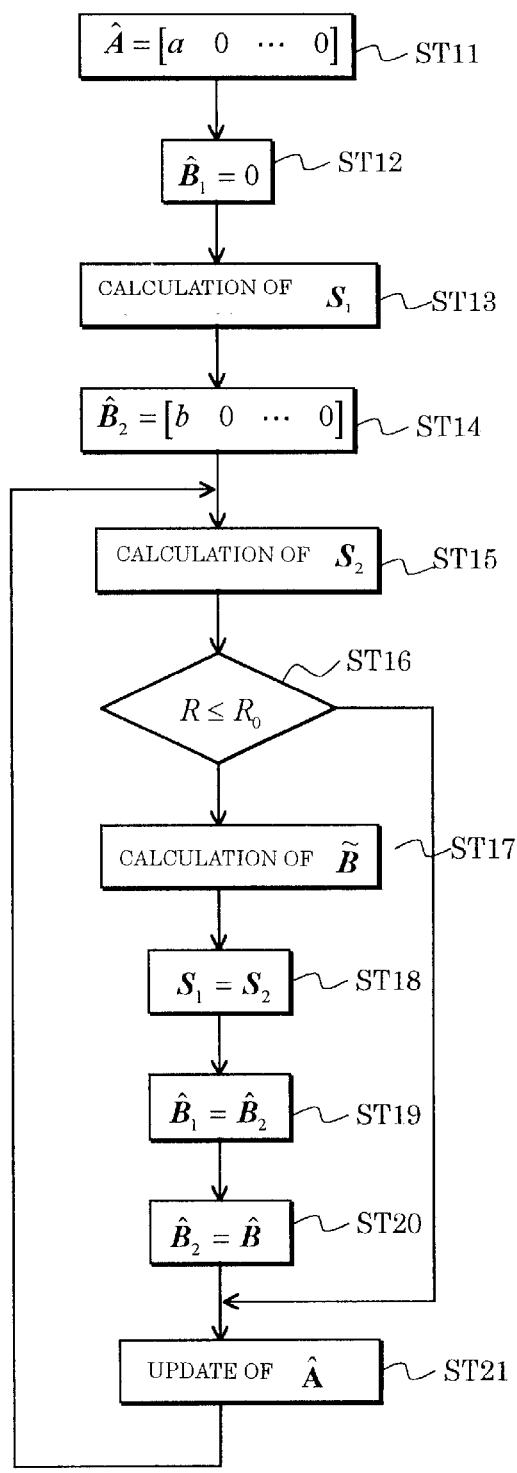
FIG. 29 is a flow chart showing a procedure of performing a coefficient update of a feedback control filter and a noise control filter by setting two pairs of independent coefficients in a feedback control filter in an active noise control apparatus of a feedback type according to the present invention [3]
Figure 30:
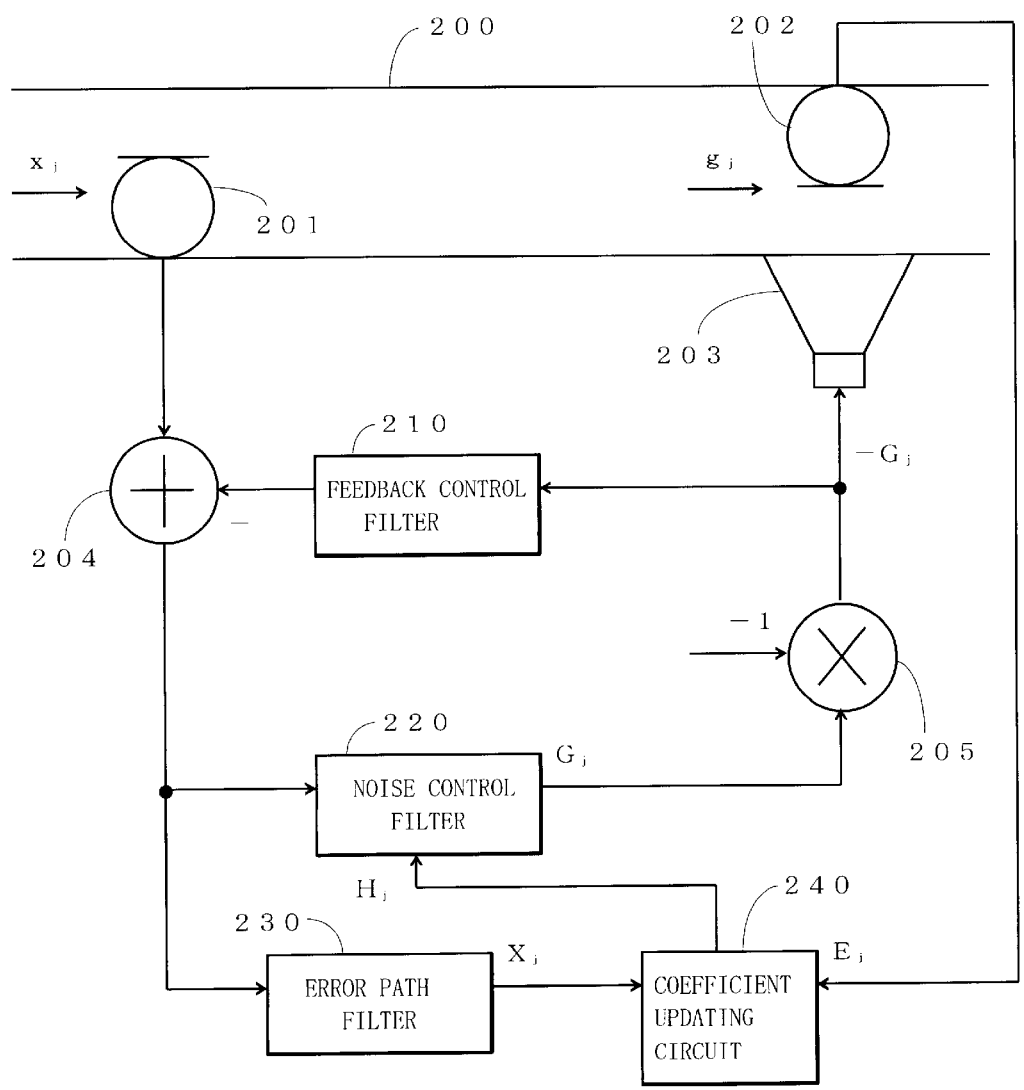
FIG. 30 is a block diagram showing an arrangement of a general active noise control apparatus.
Figure 31:
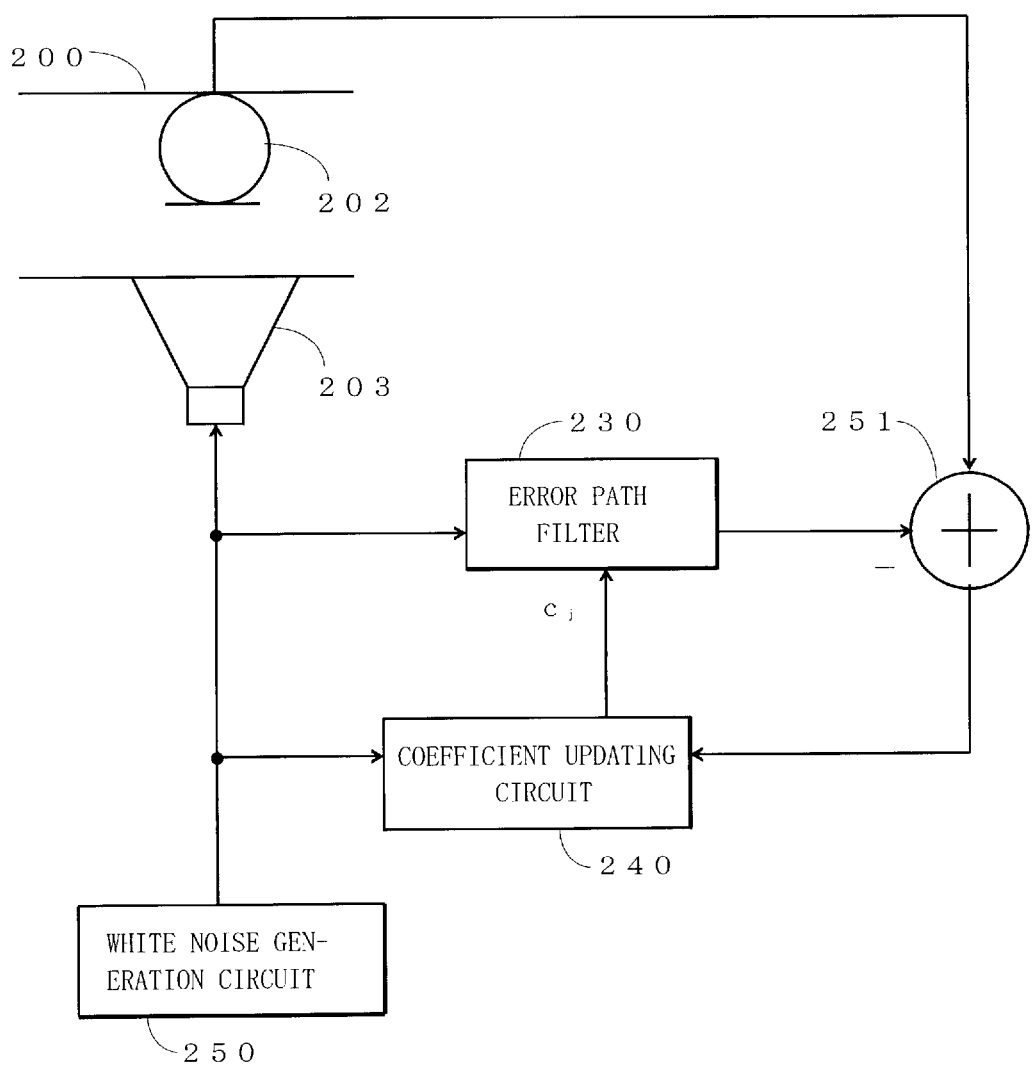
FIG. 31 is a block diagram showing a calculation circuit of an error path filter coefficient in a general active noise control apparatus.
Figure 32:
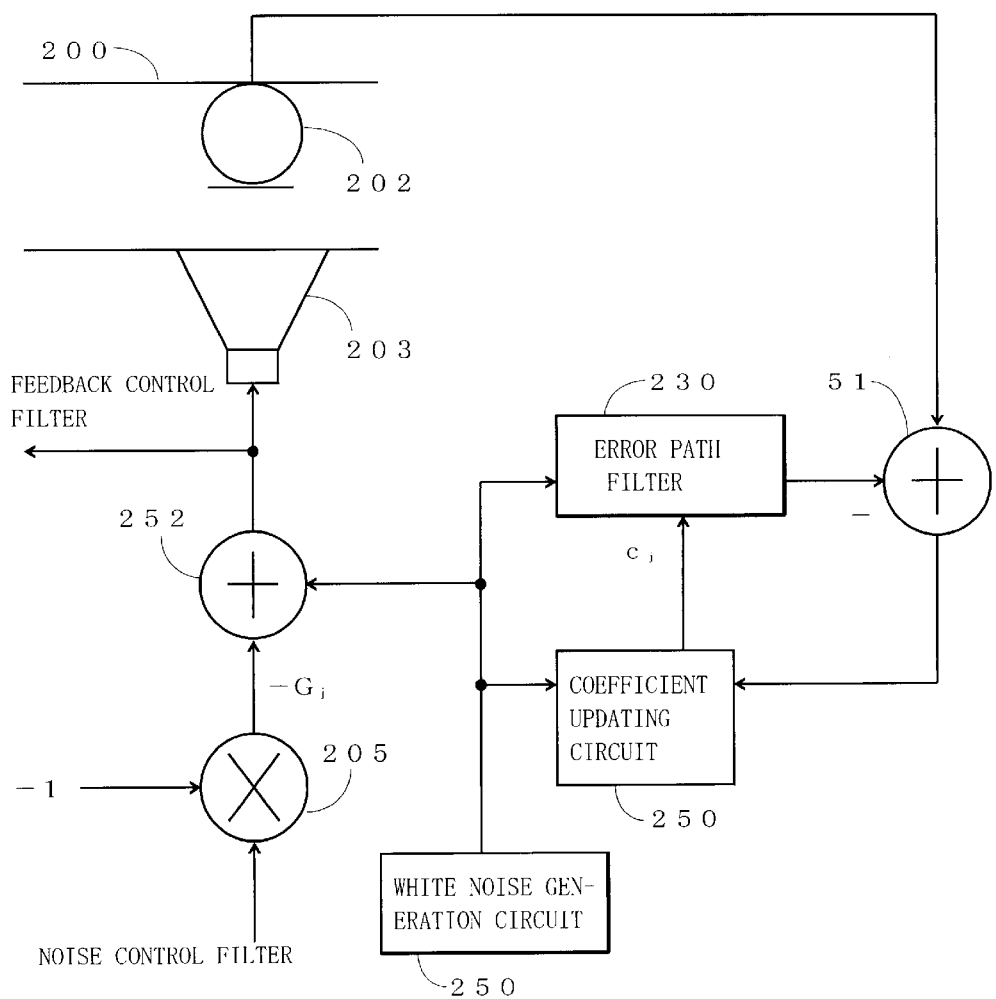
FIG. 32 is a block diagram showing a prior art example for calculating an error path filter coefficient during an active noise control in a general active noise control apparatus.
Figure 33:
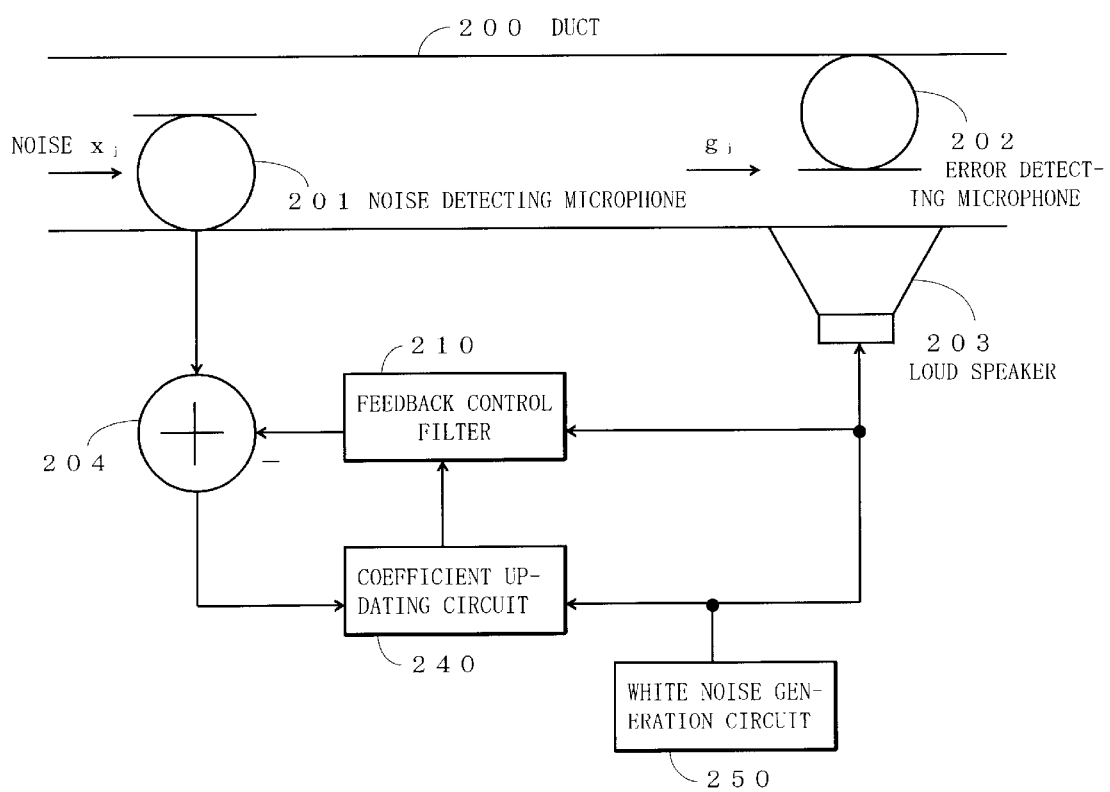
FIG. 33 is a block diagram showing an example of a general calculation circuit of a feedback control filter coefficient used before starting a noise control.
Figure 34:
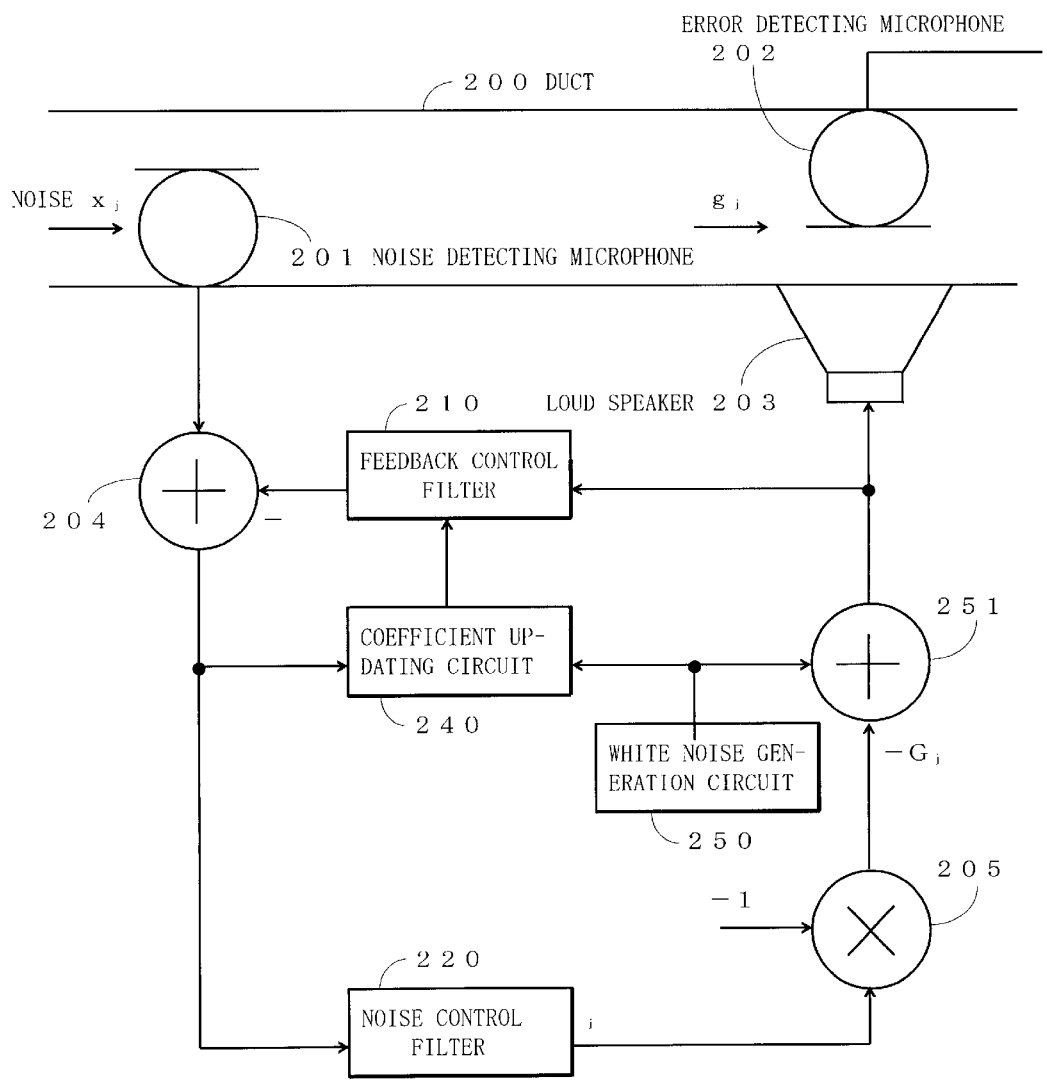
FIG. 34 is a block diagram showing a prior art example of an active noise control apparatus for performing an update of a feedback control filter coefficient during an active noise control.
Figure 35:
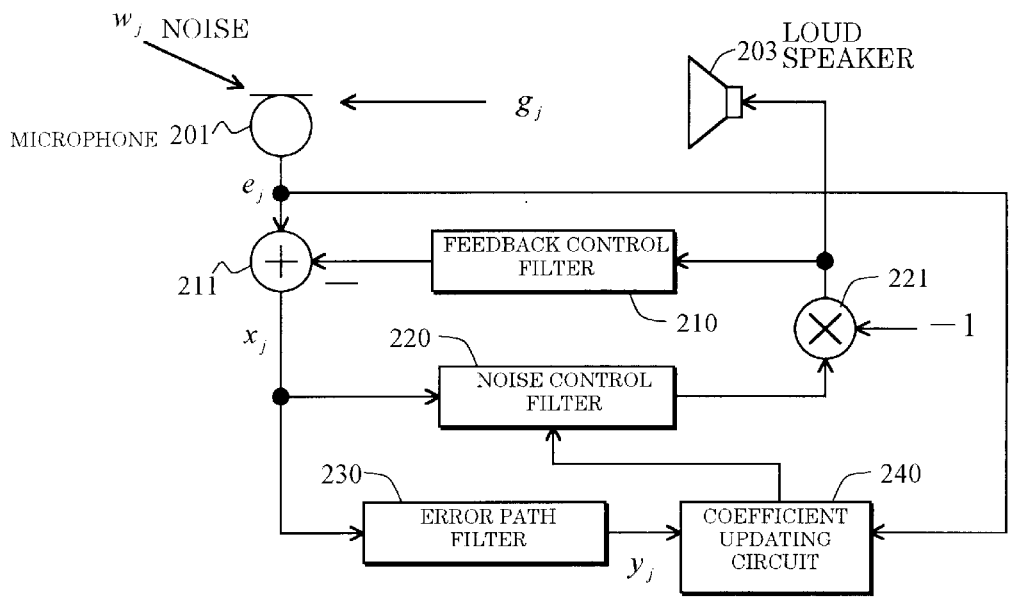
FIG. 35 is a block diagram showing an example of a circuit arrangement of a generally known active noise control apparatus of a feedback type.
Figure 36:
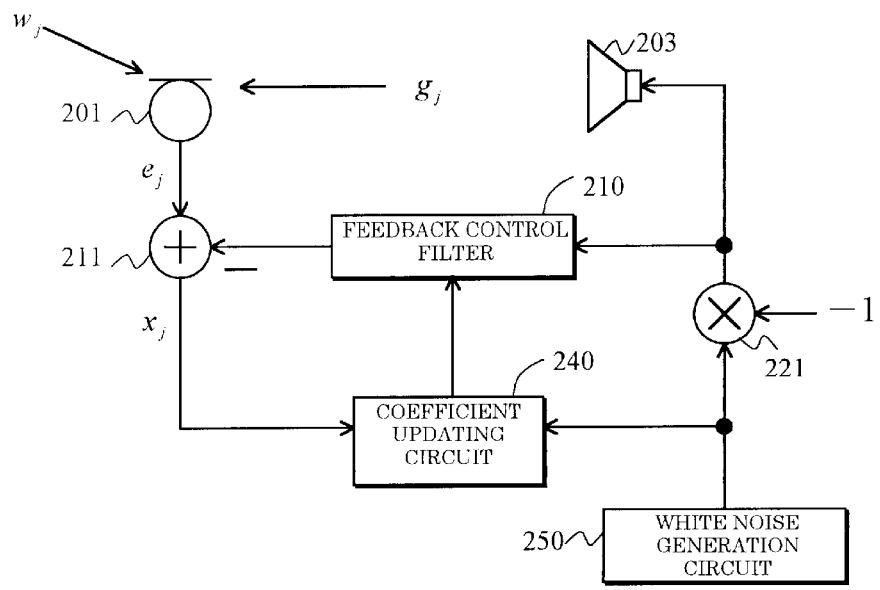
FIG. 36 is a block diagram showing a circuit arrangement for calculating a coefficient of a feedback control filter used for a generally known active noise control apparatus of a feedback type.
Figure 37:
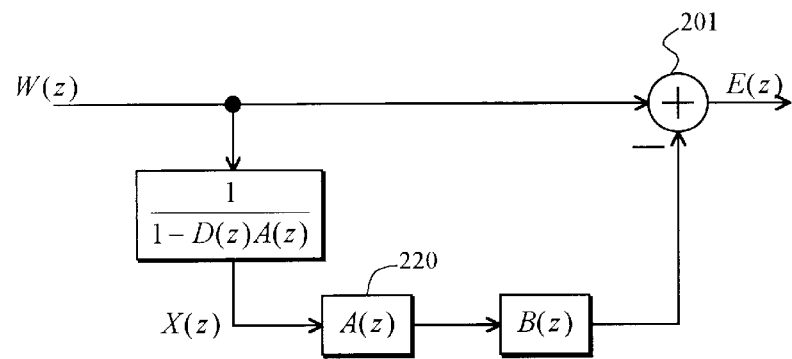
FIG. 37 is a block diagram equivalently showing a generally known active noise control apparatus of a feedback type.
Figure 38:
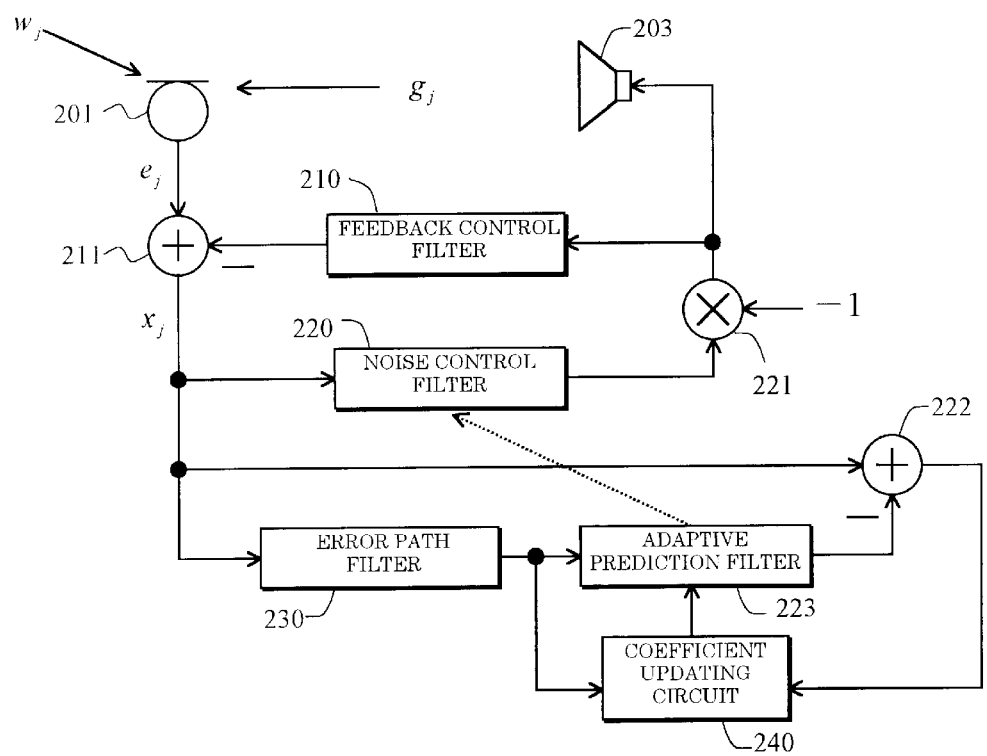
FIG. 38 is a block diagram showing a generally known active noise control apparatus of a feedback type of an adaptive prediction type.
Figure 39:
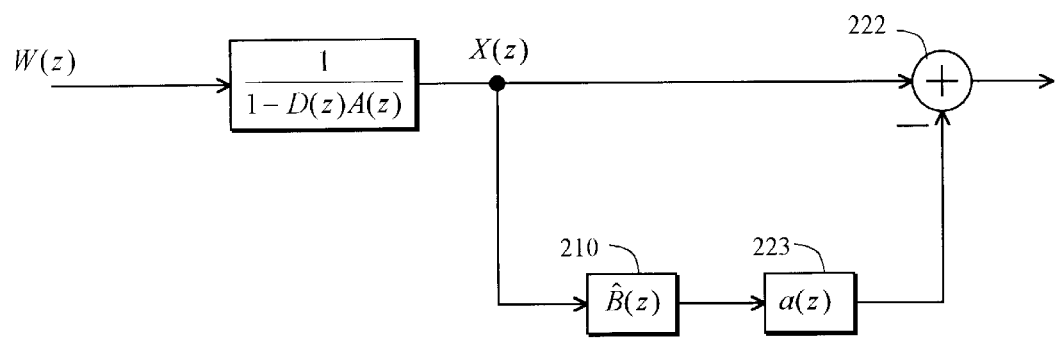
FIG. 39 is a block diagram equivalently showing a prediction part of a generally known active noise control apparatus of a feedback type of an adaptive prediction type.

(3-21) Flow in Case of Providing Two Pairs of Coefficients to Noise Control Filter:

FIG. 29 shows a control flow. Also in this case, upon the power activation the coefficients of the feedback control filter 210 and the noise control filter 220 have not been set yet. Therefore, the coefficient $$\hat{A}=[a0 \ldots 0] \qquad \text{Eq.(112)}$$

is similarly set in the noise control filter 220 (at step ST11). Furthermore, for two pairs of independent coefficients set in the feedback control filter 210 for satisfying $$\hat{B}_1{}^T\hat{B}_2=0 \qquad \text{Eq.(113)}$$

the following equations $$\hat{B}_1=0 \qquad \text{Eq.(114)}$$

$$\hat{B}_2=[b0 \ldots 0] \qquad \text{Eq.(115)}$$

are provided (at steps ST12 and ST14).

The coefficients $\hat{A}$, $\hat{B}_1$, and $\hat{B}_2$ are obtained with the coefficients of the non-recursive filter 261 being made $S_1$ and $S_2$ (at steps ST13 and ST15). The impulse response B of the feedback path is calculated as $\tilde{B}$ by using the system identification circuit 120 shown in FIG. 26 (at step ST17).

$\tilde{B}$ is newly provided for the coefficient of the feedback control filter 210, and the coefficient $\hat{A}$ of the noise control filter 220 which is optimal to cancel the primary noise is calculated by using the system identification circuit 120 of FIG. 27.

Since $\tilde{B}$ has an error in relation to the optimum coefficient $B_{opt}$, it is possible to update the coefficient of the noise control filter 220 all the time by repeatedly applying thereto the above-mentioned coefficient update, with this error.

Namely, among the two coefficients previously set, if $\hat{B}_2$ is assumed to be $\hat{B}_1$ (at step ST19), $S_1$ corresponding thereto is replaced with $S_2$ (at step ST18), newly obtained coefficient $\tilde{B}$ is assumed to be $\hat{B}_2$ (at step ST20), $S_2$ is calculated again, and the same calculation is repeated, the coefficients of the noise control filter 220 and the feedback control filter 210 are updated all the time.

The problem in this method is that by the coefficient update of the feedback control filter 210 the feedback component is well canceled, and the calculation accuracy of the coefficient $\tilde{B}$ similarly deteriorates as the calculation accuracy of the coefficients $S_2$ and $S_1$ deteriorates. This deterioration disturbs the coefficient of the noise control filter 220, thereby causing the reduction of the noise canceling quantity.

The easiest method to solve this problem is that the coefficient update is stopped when the coefficient of the feedback control filter 210 obtains a sufficient accuracy. It can be determined by the fact that the update quantity of the coefficient of the feedback control filter 210 has become small.

Namely, when the difference R between $\hat{B}_2$ and $\tilde{B}$ decreases equal to or less than a fixed value $R_0$ (at step ST16), the coefficient update of the feedback control filter 210 has only to be stopped. However, since there is a possibility that the generation process of the primary noise varies even that time, it is required to sequentially update the coefficient of the noise control filter 220 (at step ST21).

As described above, an active noise control apparatus of a feedback type according to the present invention [3] is arranged such that an inverse filter composing circuit forms a filter having a characteristic including a transfer function opposite to a closed circuit starting from the noise control filter and returning to the noise control filter again through both of the feedback path and the feedback control filter, a system identification circuit provides two pairs of different fixed coefficients either to the noise control filter or the feedback control filter to update a coefficient of an adaptive filter in order that a difference becomes a minimum between an output of a first filter forming a numerator of a solution obtained, from simultaneous equations based on two transfer functions of an inverse filter formed within the inverse filter composing circuit and an output of the adaptive filter connected to a second filter in cascade forming a denominator of the solution, and the system identification circuit is further repeatedly used for calculating the coefficient of the noise control filter optimally canceling the primary noise as the coefficient of the adaptive filter by making a numerator, which forms a ratio of the transfer function expressing the generation process of the primary noise obtained from the simultaneous equations and the transfer function of the feedback path previously identified on the system identification circuit, the first filter and making a denominator the second filter. Therefore, the coefficients of the feedback control filter and the noise control filter can be updated without outputting the white noise from the loud speaker during the active noise control.

What we claim is:

1. An active noise control apparatus for updating a coefficient of a noise control filter which synthesizes a secondary noise having a same amplitude as and an opposite phase to a noise to be suppressed:

the noise control filter comprising a first and a second noise control filter respectively having a first and a second arbitrary coefficient, the apparatus further comprising:

a first and a second overall system filter which form an overall system filter for simulating a characteristic of an overall system leading to an error detecting microphone from a noise detecting microphone that detects a noise component required for synthesizing the secondary noise, and which has a first and a second coefficient respectively obtained for the second and the first coefficient, a differential overall system filter for outputting a response difference of the first and the second overall system filter, and an estimating noise transfer system filter, having a variable coefficient, connected to the differential overall system filter in cascade, a white noise generated by a white noise generation circuit being applied to respective cascade combinations of the first overall system filter and the second noise control filter, and the second overall system filter and the first noise control filter, and to the differential overall system filter; the coefficient of the estimating noise transfer system filter being updated in order that a difference between the output of the differential overall system filter and a differential output between the first and the second noise control filter becomes a minimum, and the coefficient of the estimating noise transfer system filter obtained at a time when the difference becomes the minimum being provided as the coefficients of the noise control filters.

2. The active noise control apparatus as claimed in claim 1 wherein only upon an activation preliminarily stored coefficients are used for the first and the second coefficient respectively of the first and the second noise control filter.

3. The active noise control apparatus as claimed in claim 2 wherein after the activation a coefficient obtained upon a present coefficient update is substituted for one of the first and the second coefficient respectively of the first and the second noise control filter.

4. The active noise control apparatus as claimed in claim 2 wherein after the activation coefficients obtained upon a last and a present coefficient update are respectively provided for the first and the second coefficient respectively of the first and the second noise control filter.

5. The active noise control apparatus as claimed in claim 1 wherein when an output of the overall system filter becomes equal to or less than a threshold value, the coefficient update is stopped.

6. An active noise control apparatus having a feedback control filter which simulates a characteristic of a feedback path leading to a noise detecting microphone connected to an input of a noise control filter for synthesizing a secondary noise, through a loud speaker which transmits the secondary noise having a same amplitude as and an opposite phase to a primary noise for suppression comprising:

an inverse filter composing circuit which forms a filter having a characteristic including a transfer function opposite to a closed circuit starting from the noise control filter and returning to the noise control filter again through both of the feedback path and the feedback control filter, the transfer function expressing a generation process of the primary noise, and a system identification circuit for providing two pairs of different fixed coefficients either to the feedback control filter or the noise control filter to update a coefficient of an adaptive filter in order that a difference becomes a minimum between an output of a first filter forming a numerator of a solution obtained by eliminating a transfer function component expressing the generation process of the primary noise, from simultaneous equations based on two transfer functions of an inverse filter formed within the inverse filter composing circuit for the two pairs of coefficients and an output of the adaptive filter connected to a second filter in cascade forming a denominator of the solution, a coefficient of the feedback control filter being updated by using the coefficient of the adaptive filter obtained by operating the system identification circuit.

7. The active noise control apparatus as claimed in claim 6 wherein the system identification circuit gives the simultaneous equations by using a transfer function provided by the inverse filter composing circuit, from which a constant 1 is removed.

8. The active noise control apparatus as claimed in claim 6 wherein upon an activation of the apparatus the system identification circuit gives the simultaneous equations by setting the two pairs of fixed coefficients of the noise control filter or the feedback control filter to different taps.

9. The active noise control apparatus as claimed in claim 6 wherein upon an activation of the apparatus the system identification circuit uses coefficients obtained upon a last activation for the two pairs of fixed coefficients of the noise control filter or the feedback control filter.

10. The active noise control apparatus as claimed in claim 6 wherein the system identification circuit applies a transfer function corresponding to a coefficient used for a present coefficient update for the two pairs of fixed coefficients of the noise control filter or the feedback control filter and the transfer function of the inverse filter upon a subsequent coefficient update of the feedback control filter.

11. The active noise control apparatus as claimed in claim 6 wherein the system identification circuit sets the two pairs of fixed coefficients of the noise control filter or the feedback control filter with a time interval.

12. The active noise control apparatus as claimed in claim 11 wherein when a gain of the adaptive filter becomes equal to or less than a fixed value upon a coefficient update performed by providing the two pairs of fixed coefficients to the noise control filter, the system identification circuit does not update the coefficient of the feedback control filter.

13. The active noise control apparatus as claimed in claim 9 wherein when an output of a filter composing a component corresponding to a gain of the closed circuit becomes equal to or less than a fixed value on the inverse filter composing circuit upon a coefficient update performed by providing the two pairs of fixed coefficients to the noise control filter, the system identification circuit does not update the coefficient of the feedback control filter.

14. An active noise control apparatus of a feedback type having a feedback control filter which simulates a characteristic of a feedback path leading to a noise detecting microphone connected to an input of a noise control filter for synthesizing a secondary noise, through a loud speaker which transmits the secondary noise having a same amplitude as and an opposite phase to a primary noise for suppression comprising:

an inverse filter composing circuit which forms a filter having a characteristic including a transfer function opposite to a closed circuit starting from the noise control filter and returning to the noise control filter again through both of the feedback path and the feedback control filter, the transfer function expressing a generation process of the primary noise, and a system identification circuit for providing two pairs of different fixed coefficients either to the noise control filter or the feedback control filter to update a coefficient of an adaptive filter in order that a difference becomes a minimum between an output of a first filter forming a numerator of a solution obtained by eliminating the transfer function component expressing the generation process of the primary noise, from simultaneous equations based on two transfer functions of an inverse filter formed within the inverse filter composing circuit for the two pairs of coefficients and an output of the adaptive filter connected to a second filter in cascade forming a denominator of the solution, the system identification circuit further being repeatedly used for calculating the coefficient of the noise control filter optimally canceling the primary noise as the coefficient of the adaptive filter by making a numerator, which forms a ratio of the transfer function expressing the generation process of the primary noise and the transfer function of the feedback path previously identified on the system identification circuit, the first filter and making a denominator the second filter.

15. The active noise control apparatus of the feedback type as claimed in claim 14 wherein the system identification circuit gives the simultaneous equations by using a transfer function provided by the inverse filter composing circuit, from which a constant 1 is removed.

16. The active noise control apparatus of the feedback type as claimed in claim 14 wherein upon an activation of the apparatus the system identification circuit gives the simultaneous equations by setting the two pairs of fixed coefficients of the noise control filter or the feedback control filter to different taps.

17. The active noise control apparatus of the feedback type as claimed in claim 14 wherein the system identification circuit sets the two pairs of fixed coefficients of the noise control filter or the feedback control filter with a time interval.

18. The active noise control apparatus of the feedback type as claimed in claim 14 wherein upon an activation of the apparatus the system identification circuit uses coefficients obtained and stored upon a last activation for the two pairs of fixed coefficients of the noise control filter or the feedback control filter.

19. The active noise control apparatus of the feedback type as claimed in claim 17 wherein when a difference between a new and an old coefficient of the feedback control filter becomes equal to or less than a fixed value upon a coefficient update performed by providing the two pairs of coefficients to the feedback control filter, the system identification circuit does not update the coefficient of the feedback control filter.

20. The active noise control apparatus of the feedback type as claimed in claim 14 wherein the system identification circuit applies a transfer function corresponding to a coefficient used for a present coefficient update for the two pairs of coefficients of the noise control filter or the feedback control filter and the transfer function of the inverse filter upon a subsequent coefficient update of the feedback control filter.

21. The active noise control apparatus of the feedback type as claimed in claim 14 wherein the inverse filter composing circuit is composed of a non-recursive filter.

* * * * *

UNITED STATES PATENT AND TRADEMARK OFFICE
CERTIFICATE OF CORRECTION

PATENT NO. : 6,683,960 B1
DATED : January 27, 2004
INVENTOR(S) : Kensaku Fujii et al.

It is certified that error appears in the above-identified patent and that said Letters Patent is hereby corrected as shown below:

<u>Title page,</u>
Item [63], please correct Related U.S. Application Data, to read
-- Continuation of application No. PCT/JP99/01984, filed on Apr. 14, 1999. --

Signed and Sealed this

Thirteenth Day of April, 2004

JON W. DUDAS
*Acting Director of the United States Patent and Trademark Office*